United States Patent
Shida et al.

(12) 
(10) Patent No.: US 6,410,748 B1
(45) Date of Patent: Jun. 25, 2002

(54) ALICYCLI C GROUP-CONTAINING MONOMER

(75) Inventors: Naomi Shida, Kawasaki; Toru Ushirogouchi, Yokohama; Koji Asakawa, Kawasaki; Takeshi Okino; Shuji Hayase, both of Yokohama; Yoshihiko Nakano; Makoto Nakase, both of Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/847,387

(22) Filed: May 3, 2001

Related U.S. Application Data

(62) Division of application No. 09/143,533, filed on Aug. 28, 1998, now Pat. No. 6,291,129.

(30) Foreign Application Priority Data

Aug. 29, 1997 (JP) .............................................. 9-234393
Aug. 28, 1998 (JP) ........................................... 10-243939

(51) Int. Cl.$^7$ ................... C07D 209/48; C07D 335/00; C07F 7/08; C07C 69/74; C07C 69/52; C07C 49/00; C07C 41/00

(52) U.S. Cl. ........................... 548/475; 549/13; 549/18; 549/28; 549/62; 549/421; 549/475; 556/457; 556/465; 560/120; 560/220; 568/38; 568/579; 568/670; 522/49; 522/50; 522/154; 525/353

(58) Field of Search ...................... 522/49, 50; 525/353; 560/220; 568/38, 670, 579; 548/475; 556/457, 465; 549/13, 18, 28, 62, 421, 475

(56) References Cited

U.S. PATENT DOCUMENTS

| | | | | |
|---|---|---|---|---|
| 5,621,019 A | * | 4/1997 | Nakano et al. | 522/49 |
| 5,665,518 A | * | 9/1997 | Maeda et al. | 430/270.1 |
| 5,837,419 A | * | 11/1998 | Ushirogouchi et al | 430/270.1 |
| 6,060,207 A | * | 5/2000 | Shida et al. | 430/176 |
| 6,291,129 B1 | * | 9/2001 | Shida et al. | 430/270.1 |

FOREIGN PATENT DOCUMENTS

| | | | |
|---|---|---|---|
| JP | 08-082925 | * | 3/1996 |
| JP | 08-328242 | * | 12/1996 |
| JP | 09166868 | * | 6/1997 |
| JP | 09230597 | * | 9/1997 |

OTHER PUBLICATIONS

Morikawa, et al. ; Chemical Abstract (Access No. 1997:609732) English Abstract of JP 09230597 Sep. 9, 1997.

Shinoda, et al. ; Chemical Abstract (Access No. 1997:174516) English Abstract of JP 08328242 Dec. 13, 1996.

* cited by examiner

Primary Examiner—Floyd D. Higel
(74) Attorney, Agent, or Firm—Oblon, Spivak, McClelland, Maier & Neustadt, P.C.

(57) ABSTRACT

A monomer represented by the following general formula (m-1):

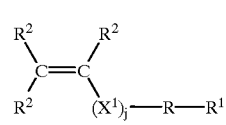

(m-1)

wherein R is a group having an alicyclic skeleton, $R^2$s may be the same or different and are individually hydrogen atom, halogen atom or monovalent organic group, $X^1$ is a bivalent organic group containing a heteroatom, j is an integer of 0 to 3, and $R^1$ is a group selected from the following groups, a monovalent organic group having Si (R1-1), and

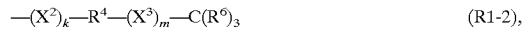

(R1-2), wherein $X^2$ and $X^3$ are a bivalent organic group containing a heteroatom, k and m are an integer of 0 to 3, $R^4$ is a bivalent alkyl group, $R^6$s may be the same or different and are individually hydrogen atom, halogen atom or monovalent organic group.

3 Claims, 2 Drawing Sheets

ALICYCLIC GROUP-CONTAINING MONOMER

This application is a division of Ser. No. 09/143,533, filed Aug. 28, 1998 now U.S. Pat. No. 6,291,129.

BACKGROUND OF THE INVENTION

This invention relates to a photosensitive composition which is useful as a resist composition to be employed for fine working in the manufacturing process of a semiconductor device, and in particular to a photosensitive composition which is particularly suited for use in a fine working where a short wavelength light such as ultraviolet ray, deep UV beam, KrF excimer laser beam having a wavelength of 248 nm, ArF excimer laser beam having a wavelength of 193 nm, fluorine laser beam, electron beam or X-ray is employed as an exposure energy source.

In the manufacture of electronic parts such as a semiconductor device, a fine pattern is formed by making use of a photolithographic technique. In this fine working technique, a thin film, i.e. a photoresist film is first formed by coating a resist composition on a semiconductor substrate for instance. The photoresist film thus formed is then exposed to light through a prescribed mask pattern, and subsequently subjected to various treatments including a development and a rinsing, thereby forming a resist pattern. This resist pattern is then utilized as an etching resistant mask in a dry etching process, and the exposed surface portions of the substrate, etc. are etched away to form a pattern of fine line or window thereby obtaining a desired pattern. Finally, the resist pattern remaining on the substrate is removed through dissolution, thus forming a patterned substrate.

In view of a trend in recent years to further increase the integration of semiconductor elements, it is now demanded to develop a working technique which enables to form a still finer pattern. In view of such a demand, the employment of a light source of shorter wavelength in photolithography is now being studied. For example, a method for forming a finer resist pattern employing as a light source an ArF excimer laser (193 nm in wavelength) or the quintuple harmonic of YAG laser (218 nm in wavelength) has been developed. It has now become possible through the employment of this method to form a wiring pattern having a minimum line width in the order of submicron. However, there is still a trend to further increase the fineness of wiring pattern.

By the way, since a dry-etching process utilizing plasma has been developed for the fine working of a substrate, etc., it is now demanded, with a view to effectively utilize this fine working process, to employ a resist which is excellent in dry-etching resistance in the formation of a resist pattern.

With this respect, there is known a photosensitive material comprising an aromatic compound as a resist material. Namely, many kinds of resist material comprising a phenolic resin as a base material have been developed up to date.

However, these resist materials generally exhibit a high absorption of the light of short wavelength when they are employed in a lithography where the light of short wavelength as mentioned above is employed as an exposure light source. Therefore, it is impossible, because of this prominent light absorption, to allow the exposure light to reach deep enough to the bottom portion of the resist film at the light exposure step. As a result, it has been very difficult with these conventional resist materials to form a fine pattern.

On the other hand, the employment of polymethyl methacrylate (PMMA) having no aromatic ring is also studied as a resin exhibiting a low light absorption. However, this polymethyl methacrylate is accompanied with a problem that this compound is poor in dry-etching resistance.

It is now studied to employ a simple aliphatic cyclic compound as a base resin. However, the aliphatic cyclic compound is accompanied with problems that it is not only poor in solubility and alkali-developing property, but also insufficient in dry etching resistance.

As mentioned above, in order to of realize a fine pattern of sub-quarter micron in line width, it is required that the photosensitive material is minimal in light absorption and that the resist pattern obtainable from the photosensitive material has a sufficient dry-etching resistance.

BRIEF SUMMARY OF THE INVENTION

Therefore, an object of this invention is to provide a photosensitive composition which is not only excellent in transparency to a light source of short wavelength, in particular to KrF excimer laser beam, ArF excimer laser beam and a fluorine laser beam, but also capable of forming a resist pattern having a sufficient dry etching resistance.

A further object of this invention is to provide a high molecular compound which can be suitably employed as a base resin in the aforementioned photosensitive composition, and to provide a monomer useful for the synthesize of the high molecular compound.

According to this invention, there is provided a monomer which can be represented by the following general formula (m-1):

(m-1)

wherein R is a group having an alicyclic skeleton; $R^2$s may be the same or different and are individually hydrogen atom, halogen atom or monovalent organic group; $X^1$ is a bivalent organic group containing a heteroatom; j is an integer of 0 to 3; and $R^1$ is a group selected from the following groups;

a monovalent organic group having Si (R1-1), and

(R1-2), wherein $X^2$ is a bivalent organic group containing a heteroatom; k is an integer of 0 to 3; $R^4$ is a bivalent alkyl group; $X^3$ is a bivalent organic group containing a heteroatom; m is an integer of 0 to 3; $R^6$s may be the same or different and are individually hydrogen atom, halogen atom or monovalent organic group.

According to this invention, there is further provided a monomer which can be represented by the following general formula (m-2):

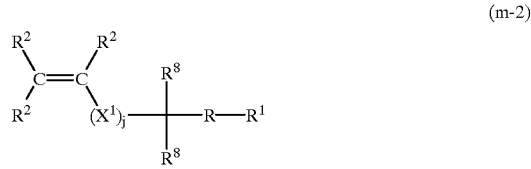

(m-2)

wherein R is a group having an alicyclic skeleton; $R^2$s may be the same or different and are individually hydrogen atom, halogen atom or monovalent organic group; $X^1$ is a bivalent organic group containing a heteroatom; j is an integer of 0 to 3; $R^1$ is a group selected from the following groups;

a monovalent organic group having Si (R1-1), and

 (R1-2), wherein $X^2$ is a bivalent organic group containing a heteroatom; k is an integer of 0 to 3; $R^4$ is a bivalent alkyl group; $X^3$ is a bivalent organic group containing a heteroatom; m is an integer of 0 to 3; $R^6$s may be the same or different and are individually hydrogen atom, halogen atom or monovalent organic group; and $R^8$s may be the same or different and are individually hydrogen atom, halogen atom or monovalent organic group wherein at least one of $R^8$s may be combined with part of R thereby to form a ring.

According to this invention, there is further provided a monomer which can be represented by the following general formula (m-3):

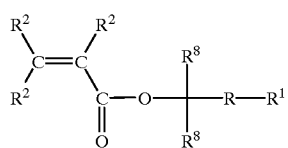 (m-3)

wherein R is a group having an alicyclic skeleton; $R^2$s may be the same or different and are individually hydrogen atom, halogen atom or monovalent organic group; $R^1$ is a group selected from the following groups;

a monovalent organic group having Si (R1-1), and

 (R1-2), wherein $X^2$ is a bivalent organic group containing a heteroatom; k is an integer of 0 to 3; $R^4$ is a bivalent alkyl group; $X^3$ is a bivalent organic group containing a heteroatom; m is an integer of 0 to 3; $R^6$s may be the same or different and are individually hydrogen atom, halogen atom or monovalent organic group; and $R^8$s may be the same or different and are individually hydrogen atom, halogen atom or monovalent organic group wherein at least one of $R^8$s may be combined with part of R thereby to form a ring.

According to this invention, there is further provided a high molecular compound containing at least one kind of repeating units represented by the following general formulas (u-1), (u-2) and (u-3):

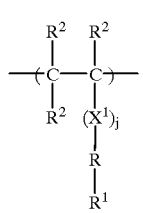 (u-1)

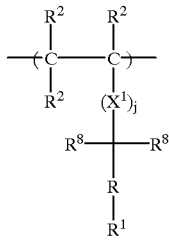 (u-2)

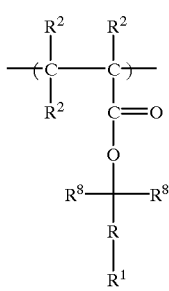 (u-3)

wherein R is a group having an alicyclic skeleton; $R^2$s may be the same or different and are individually hydrogen atom, halogen atom or monovalent organic group; $X^1$ is a bivalent organic group containing a heteroatom; j is an integer of 0 to 3; $R^1$ is a group selected from the following groups;

a monovalent organic group having Si (R1-1), and

 (R1-2), wherein $X^2$ is a bivalent organic group containing a heteroatom; k is an integer of 0 to 3; $R^4$ is a bivalent alkyl group; $X^3$ is a bivalent organic group containing a heteroatom; m is an integer of 0 to 3; $R^6$s may be the same or different and are individually hydrogen atom, halogen atom or monovalent organic group; and $R^8$s may be the same or different and are individually hydrogen atom, halogen atom or monovalent organic group wherein at least one of $R^8$s may be combined with part of R thereby to form a ring.

According to this invention, there is further provided a photosensitive composition which comprises the aforementioned high molecular compound and a photo-acid generating agent.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1A:
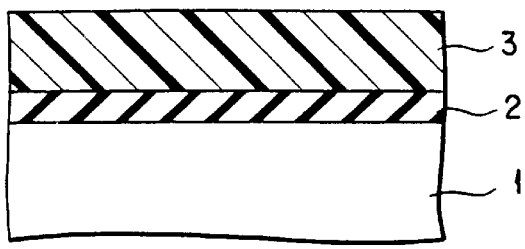
FIGS. 1A to 1C are cross-sectional views illustrating one example of manufacturing steps of electronic parts using a photosensitive composition according to this invention.

The monomer according to this invention comprises an alicyclic skeleton and a specific acid-decomposable group. The high molecular compound of this invention which can be obtained through a homopolymerization or copolymerization of this monomer is designed to be mixed with a photo-acid generating agent so as to be used as a chemically amplified resist, the photochemical reaction of which after exposure can be amplified by a thermal reaction.

First of all, this chemically amplified resist will be briefly explained.

This chemically amplified resist can be optionally employed as a positive or negative resist depending on the components constituting the resist. A positive type chemically amplified resist can be constituted for example by an alkali-soluble resin as a resin component, a solubility-inhibiting agent formed of a compound which can be decomposed by an acid, and a photo-acid generating agent formed of a compound which is capable of generating an acid when it is irradiated with actinic radiation, energetic radiation or material radiation. If a solubility-inhibiting group is included as a copolymer component of the alkali-soluble resin in the resist composition, this resin can be concurrently functioned as a solubility-inhibiting agent. A resist film that can be obtained by coating this positive type chemically amplified resist on a substrate is insoluble to an aqueous alkaline solution unless it is exposed to light (not irradiated with actinic radiation) due to the presence of the solubility-inhibiting agent. When this resist film is subjected to light exposure and baking treatment, an acid is caused to be generated from the photo-acid generating agent at the light exposure portion of the resist film, and hence the solubility-inhibiting agent is caused to decompose by this acid, thus rendering the exposure portion to be soluble to an alkaline solution. Namely, this resist is positive resist wherein the exposure portion of the resist film is selectively dissolved and removed. However, this resist can be turned into a negative resist where unexposed portion is selectively dissolved and removed. In this case, a compound which is capable of crosslinking the resin component by means of the acid, or a compound whose solubility can be changed by this acid is substituted for the aforementioned acid-decomposable compound.

As for the base resin component of this chemically amplified resist, the high molecular compounds of this invention can be effective employed. The high molecular compounds of this invention can be obtained through a homopolymerization or copolymerization of a monomer represented by any one of the aforementioned general formulas (m-1), (m-2) and (m-3).

The R in the aforementioned general formulas (m-1), (m-2) and (m-3) is a group comprising an alicyclic skeleton. This alicyclic skeleton may be a monocyclic skeleton, a polycyclic skeleton or a heterocyclic skeleton. For example, this alicyclic skeleton may be selected from cyclopentyl, cyclohexyl, cycloheptyl, cyclooctyl, cyclononyl and cyclodecanyl. This alicyclic skeleton may be a heterocyclic or fused ring skeleton, such as tricyclo[5.2.1.0$^{2,6}$]decanyl, methylcyclohexylpropyl, tetracyclo[6.2.1.1$^{3,6}$.0$^{2,7}$] dodecanyl, tricyclo[3.3.1.1$^{3,7}$]decanyl, o-menthanediyl, o-menthenediyl, m-menthanediyl, m-menthenediyl, p-menthanediyl, p-menthenediyl, bicyclo[2.2.1]heptyl, bicyclo[3.1.1]heptyl, oxacyclohexan-2-on-3-yl, oxacyclopentan-2-on-3-yl, oxacycloheptan-2-on-3-yl, oxacyclooctan-2-on-3-yl, oxacyclononan-2-on-3-yl, oxacyclodecan-2-on-3-yl, oxocyclopentyl, oxocyclohexyl, oxocycloheptyl, oxocyclooctyl, oxocyclononyl, oxocyclodecanyl, cyclopentenyl, cyclohexenyl, cycloheptenyl, cyclooctenyl, cyclononenyl, cyclodecenyl, pregnyl, estryl, isoxazolyl, piperidyl, piperazyl, androstanyl, stigmastyl, octahydronaphthyl and cholesteryl.

Examples of most preferable alicyclic skeleton are monocyclic or tri- to decacyclic skeleton containing at least one kind of atom selected from the group consisting of carbon atom, oxygen atom, nitrogen atom and sulfur atom, the total number of the atoms being 3 to 100, and having 0 to 50 unsaturated bonds.

Specific examples of R comprising the aforementioned alicyclic skeleton are tricyclo[5.2.1.0$^{2,6}$]decanyl, methylcyclohexylpropyl, tetracyclo[6.2.1.1$^{3,6}$.0$^{2,7}$] dodecanyl, tricyclo[3.3.1.1$^{3,7}$]decanyl, o-menthanediyl, o-menthenediyl, m-menthanediyl, m-menthenediyl, p-menthanediyl, p-menthenediyl, bicyclo[2.2.1]heptyl, bicyclo[3.1.1]heptyl, oxacyclohexan-2-on-3-yl, oxacyclopentan-2-on-3-yl, oxacycloheptan-2-on-3-yl, oxacyclooctan-2-on-3-yl, oxacyclononan-2-on-3-yl, oxacyclodecan-2-on-3-yl, oxocyclopentyl, oxocyclohexyl, oxocycloheptyl, oxocyclooctyl, oxocyclononyl, oxocyclodecanyl, cyclopentenyl, cyclohexenyl, cycloheptenyl, cyclooctenyl, cyclononenyl, cyclodecenyl, pregnyl, estryl, isoxazolyl, piperidyl, piperazyl, androstanyl, stigmastyl, octahydronaphthyl, cholesteryl, 2'-hydroxy-4'-methyl-1, 1-dimethylcyclohexyl, (β-methyl-δ-valerolacton-3-yl) 3-methyl-oxacyclohexan-2-on-3-yl, 3-oxocyclohexyl, 1-methyl-3-oxocyclohexyl, 3-oxocyclopentyl, 3-oxocycloheptyl, 3-oxocyclooctyl, 3-oxocyclononyl, 3-oxocyclodecanyl, methyltricyclo[3.3.1.1$^{3,7}$]decanyl, ethyltricyclo[3.3.1.1$^{3,7}$]decanyl, propyltricyclo[3.3.1.1$^{3,7}$] decanyl, butyltricyclo[3.3.1.1$^{3,7}$]decanyl, pentyltricyclo [3.3.1.1$^{3,7}$]decanyl, hexyltricyclo[3.3.1.1$^{3,7}$]decanyl, heptyltricyclo[3.3.1.1$^{3,7}$]decanyl, octyltricyclo[3.3.1.1$^{3,7}$] decanyl, nonyltricyclo[3.3.1.1$^{3,7}$]decanyl, decanyltricyclo [3.3.1.1$^{3,7}$]decanyl, hydroxymethyldimethylcyclohexyl, 2'-methoxy-4'-methyl-1,1-dimethylcyclohexyl, 1-2'-acetoxy-4'-methyl-cyclohexyl-1-methylethyl, 1-2'-t-butoxy-4'-methyl-cyclohexyl-1-methylethyl, 1-2'-t-butyldimethylsiloxy-4'-methyl-cyclohexyl-1-methylethyl, 1-2'-thexyldimethylsiloxy-4'-methyl-cyclohexyl-1-methylethyl, 1-2'-2"-methoxyethoxy-4'-methyl-cyclohexyl-1-methylethyl, 1-2'-2"-ethoxyethoxy-4'-methyl-cyclohexyl-1-methylethyl, 1-2'-2",2",2"-trichloroethoxy-4'-methyl-cyclohexyl-1-methylethyl, 1-2'-trimethylsiloxy-4'-methyl-cyclohexyl-1-methylethyl, 1-2'-triethylsiloxy-4'-methyl-cyclohexyl-1-methylethyl, 1-2'-triisopropylsiloxy-4'-methyl-cyclohexyl-1-methylethyl, 1-2'-tetrahydropyranyloxy-4'-methyl-cyclohexyl-1-methylethyl, 1-2'-tetrahydrothiopyranyloxy-4'-methyl-cyclohexyl-1-methylethyl, 1-2'-tetrahydrofuranyloxy-4'-methyl-cyclohexyl-1-methylethyl, 1-2'-tetrahydrothiofuranyloxy-4'-methyl-cyclohexyl-1-methylethyl, 1-2'-dimethylisopropylsiloxy-4'-methyl-cyclohexyl-1-methylethyl, 1-2'-t-butoxycarbonylmethoxy-4'-methyl-cyclohexyl-1-methylethyl, 1-2'-t-butoxycarbonyloxy-4'- methyl-cyclohexyl-1-methylethyl, 1-methyl-3-oxocyclopentyl, 1-methyl-3-oxocycloheptyl, 1-methyl-3-oxocyclooctyl, 1-methyl-3-oxocyclononyl, 1-methyl-3-oxocyclodecanyl, 1-ethyl-3-oxocyclopentyl, 1-ethyl-3-oxocyclohexyl, 1-ethyl-3-oxocycloheptyl, 1-ethyl-3-oxocyclooctyl, 1-ethyl-3-oxocyclononyl, 1-ethyl-3-oxocyclodecanyl, 1-propyl-3-oxocyclopentyl, 1-propyl-3-oxocyclohexyl, 1-propyl-3-oxocycloheptyl, 1-propyl-3-oxocyclooctyl, 1-propyl-3-oxocyclononyl, 1-propyl-3-oxocyclodecanyl, 1-butyl-3-oxocyclopentyl, 1-butyl-3-oxocyclohexyl, 1-butyl-3-oxocycloheptyl, 1-butyl-3-oxocyclooctyl, 1-butyl-3-oxocyclononyl, 1-butyl-3-oxocyclodecanyl, 1-pentyl-3-oxocyclopentyl, 1-pentyl-3-oxocyclohexyl, 1-pentyl-3-oxocycloheptyl, 1-pentyl-3-oxocyclooctyl, 1-pentyl-3-oxocyclononyl, 1-pentyl-3-oxocyclodecanyl, β-methyl-γ-butyrolacton-3-yl, β-methyl-ε-caprolacton-3-yl, β-ethyl-γ-butyrolacton-3-yl, β-ethyl-δ-valerolacton-3-yl, β-ethyl-ε-caprolacton-3-yl, β-propyl-γ-butyrolacton-3-yl, β-propyl-δ-valerolacton-3-yl, β-propyl-ε-caprolacton-3-yl, β-butyl-γ-butyrolacton-3-yl, β-butyl-δ-valerolacton-3-yl, β-butyl-ε-caprolacton-3-yl, β-pentyl-γ-butyrolacton-3-yl, β-pentyl-δ-valerolacton-3-yl, β-pentyl-ε-caprolacton-3-yl, β-hexyl-γ-butyrolacton-3-yl, β-hexyl-δ-valerolacton-3-yl, β-hexyl-ε-caprolacton-3-yl, 3-methyl-oxacyclopentan-2-on-3-yl, 3-methyl-oxacycloheptan-2-on-3-yl, 3-ethyl-oxacyclopentan-2-on-3-yl, 3-ethyl-oxacyclohexan-2-on-3-yl, 3-ethyl-oxacycloheptan-2-on-3-yl, 3-propyl-oxacyclopentan-2-on-3-yl, 3-propyl-oxacyclohexan-2-on-3-yl, 3-propyl-oxacycloheptan-2-on-3-yl, 3-butyl-oxacyclopentan-2-on-3-yl, 3-butyl-oxacyclohexan-2-on-3-yl, 3-butyl-oxacycloheptan-2-on-3-yl, 3-pentyl-oxacyclopentan-2-on-3-yl, 3-pentyl-oxacyclohexan-2-on-3-yl, 3-pentyl-oxacycloheptan-2-on-3-yl, 3-hexyl-oxacyclopentan-2-on-3-yl, 3-hexyl-oxacyclohexan-2-on-3-yl, 3-hexyl-oxacycloheptan-2-on-3-yl, 4'-methyl-1,1-dimethyl-3-cyclohexenyl, 3,21-dihydroxy-5α-pregnan-11,20-dion-17-yl, 17-(2-propenyl)estro-4-en-17-yl, 17-(2-propenyl)estra-4,9,11-trien-17-yl, 6-methylpregn-4-en-20-on-17-yl, 17-methylandrostano[3,2-C]isoxazol-17-yl, α,α-diphenyl-4-piperidine methyl, 7,17-dimethylandrost-4-en-3-on-17-yl, 1,7,7-trimethylbicyclo[2.2.1]heptan-2-yl, 1,7,7-trimethylbicyclo[2.2.1]heptan-2-on-3-yl, 7,17-dimethylandrost-4-en-3-on-17-yl, 1,3-cyclohexanedion-5-yl, 9-fluoro-11-hydroxy-17-methylandrost-4-en-3-on-17-yl, stigmasta-5,24-dien-3-yl, octahydro-4,8a-dimethyl-4a(2H)-naphthalenyl, hydroxycholesterol-24-yl, exo-1,7,7-trimethylbicyclo[2.2.1]heptan-2-yl, 6α-6-methylpregn-4-en-3,20-dion-17-yl, 1-2'-oxo-4'-methyl-cyclohexyl-1-methylethyl, estro-4-en-3-on-17-yl, 3-ethyl-18,19-dinorpregn-4-en-3-on-17-yl, 19-norpregn-4-en-3-on-17-yl, 19-norpregn-4-en-20-in-3-on-17-yl, 19-norpregn-5(10)-en-20-in-3-on-17-yl, 17-methyl-2-oxaandrostan-3-on-17-yl, 4-hydroxy-17-methylandrost-4-en-3-on-17-yl, dihydro-4H-dimethyl-2(3H)-furanon-3-yl, 5-hydroxy-α, α,4-trimethyl-3-cyclohexene-1-methyl, α,α,4-trimethyl-3-cyclohexene-1-methyl, patchoulyl, α,α,4-trimethylcyclohexanemethan-4-yl, 1,4'-hydroxy-4'-methyl-cyclohexyl-1-methylethyl and tetrahydrofurfuryl.

Other examples of R containing an alicyclic skeleton of five-membered ring are dimethylisopropylsilylcyclopentyl, diethylisopropylsilylcyclopentyl, dimethylthexylsilylcyclopentyl, t-butyldimethylsilylcyclopentyl, isopropylcyclopentyl, ethylcyclopentyl, n-propylcyclopentyl, n-butylcyclopentyl, isobutylcyclopentyl, s-butylcyclopentyl, pentylcyclopentyl, hexylcyclopentyl, heptylcyclopentyl, octylcyclopentyl, nonylcyclopentyl, decanylcyclopentyl, 2-trimethylsilylethoxymethylcyclopentyl, 2,2,2-trichloroethylcyclopentyl, 2-chloroethylcyclopentyl, 2-bromoethylcyclopentyl, 2-iodoethylcyclopentyl, 2-fluoroethylcyclopentyl, ω-chloroalkylcyclopentyl, 2-methylthioethylcyclopentyl, 1,3-dithianyl-2-methylcyclopentyl, cyclopentylcyclopentyl, cyclohexylcyclopentyl, 3-buten-1-ylcyclopentyl, 4-trimethylsilyl-2-buten-1-ylcyclopentyl, 9-anthrylmethylcyclopentyl, 2-9',10'-dioxo-anthrylmethylcyclopentyl, 1-pyrenylmethylcyclopentyl, 2-trifluoromethyl-6-chromylmethylcyclopentyl, piperonylcyclopentyl, 4-picolylcyclopentyl, trimethylsilylcyclopentyl, triethylsilylcyclopentyl, isopropyldimethylsilylcyclopentyl, di-t-butylmethylsilylcyclopentyl, thiocyclopentyl, tri-n-butylstannylcyclopentyl, methylcyclopentyl, methoxymethylcyclopentyl, methylthiomethylcyclopentyl, t-butylthiomethylcyclopentyl, t-butoxymethylcyclopentyl, 4-pentenyloxymethylcyclopentyl, t-butyldimethylsiloxymethylcyclopentyl, thexyldimethylsiloxymethylcyclopentyl, 2-methoxyethoxymethylcyclopentyl, 2,2,2-trichloroethoxymethylcyclopentyl, bis-2'-chloroethoxymethylcyclopentyl, 2'-trimethylsilylethoxymethylcyclopentyl, 2'-triethylsilylethoxymethylcyclopentyl, 2'-triisopropylsilylethoxymethylcyclopentyl, 2'-t-butyldimethylsilylethoxymethylcyclopentyl, tetrahydropyranylcyclopentyl, tetrahydrothiopyranylcyclopentyl, 3-bromotetrahydropyranylcyclopentyl, 1-methoxycyclohexylcyclopentyl, 4-methoxytetrahydropyranylcyclopentyl, 4-methoxytetrahydrothiopyranylcyclopentyl, 1,4-dioxan-2-ylcyclopentyl, tetrahydrofuranylcyclopentyl, tetrahydrothiofuranylcyclopentyl, 2,3,3a,4,5,6,7,7a-octahydro-7,8,8-trimethyl-4,7-methanobenzofuran-2-ylcyclopentyl, 2,2,2-trichloroethylcyclopentyl, 2-trimethylsilylethylcyclopentyl, t-butylcyclopentyl, allylcyclopentyl, 4,4',4''-tris-4',5'-dichlorophthalimidophenylmethylcyclopentyl, 4,4',4''-tris-4',5'-dibromophthalimidophenylmethylcyclopentyl, 4,4',4''-tris-4',5'-diiodophthalimidophenylmethylcyclopentyl, 9-anthrylcyclopentyl, 9-9'-phenyl-10'-oxo-anthrylcyclopentyl, tritironcyclopentyl, 1,3-benzodithiolan-2-ylcyclopentyl, benzisothiazolyl-S,S-dioxidocyclopentyl, trimethylsilylcyclopentyl, triethylsilylcyclopentyl, triisopropylsilylcyclopentyl, and triethylstannylcyclopentyl.

Other examples of R containing an alicyclic skeleton of six-membered ring are dimethylisopropylsilylcyclohexyl, diethylisopropylsilylcyclohexyl, dimethylthexylsilylcyclohexyl, t-butyldimethylsilylcyclohexyl, isopropylcyclohexyl, ethylcyclohexyl, n-propylcyclohexyl, n-butylcyclohexyl, isobutylcyclohexyl, s-butylcyclohexyl, pentylcyclohexyl, hexylcyclohexyl, heptylcyclohexyl, octylcyclohexyl, nonylcyclohexyl, decanylcyclohexyl, 2-trimethylsilylethoxymethylcyclohexyl, 2,2,2-trichloroethylcyclohexyl, 2-chloroethylcyclohexyl, 2-bromoethylcyclohexyl, 2-iodoethylcyclohexyl, 2-fluoroethylcyclohexyl, ω-chloroalkylcyclohexyl, 2-methylthioethylcyclohexyl, 1,3-dithianyl-2-methylcyclohexyl, cyclopentylcyclohexyl, cyclohexylcyclohexyl, 3-buten-1-ylcyclohexyl, 4-trimethylsilyl-2-buten-1-ylcyclohexyl, 9-anthrylmethylcyclohexyl, 2-9',10'-dioxoanthrylmethylcyclohexyl, 1-pyrenylmethylcyclohexyl, 2-trifluoromethyl-6-chromylmethylcyclohexyl, piperonylcyclohexyl, 4-picolylcyclohexyl, trimethylsilylcyclohexyl, triethylsilylcyclohexyl, isopropyldimethylsilylcyclohexyl, di-t-butylmethylsilylcyclohexyl, thiocyclohexyl, tri-n-butylstannylcyclohexyl, methylcyclohexyl, methoxymethylcyclohexyl, methylthiomethylcyclohexyl, t-butylthiomethylcyclohexyl, t-butoxymethylcyclohexyl, 4-pentenyloxymethylcyclohexyl, t-butyldimethylsiloxymethylcyclohexyl, thexyldimethylsiloxymethylcyclohexyl, 2-methoxyethoxymethylcyclohexyl, 2,2,2-trichloroethoxymethylcyclohexyl, bis-2'-chloroethoxymethylcyclohexyl, 2'-trimethylsilylethoxymethylcyclohexyl, 2'-triethylsilylethoxymethylcyclohexyl, 2'-triisopropylsilylethoxymethylcyclohexyl, 2'-t-butyldimethylsilylethoxymethylcyclohexyl, tetrahydropyranylcyclohexyl, tetrahydrothiopyranylcyclohexyl, 3-bromotetrahydropyranylcyclohexyl, 1-methoxycyclohexylcyclohexyl, 4-methoxytetrahydropyranylcyclohexyl, 4-methoxytetrahydrothiopyranylcyclohexyl, 1,4-dioxan-2-ylcyclohexyl, tetrahydrofuranylcyclohexyl, tetrahydrothiofuranylcyclohexyl, 2,3,3a,4,5,6,7,7a-octahydro-7,8,8-trimethyl-4,7-methanobenzofuran-2-ylcyclohexyl, 2,2,2-trichloroethylcyclohexyl, 2-trimethylsilylethylcyclohexyl, t-butylcyclohexyl, allylcyclohexyl, 4,4',4"-tris-4',5'-dichlorophthalimidophenylmethylcyclohexyl, 4,4',4"-tris-4',5'-dibromophthalimidophenylmethylcyclohexyl, 4,4',4"-tris-4',5'-diiodophthalimidophenylmethylcyclohexyl, 9-anthrylcyclohexyl, 9-9'-phenyl-10'-oxo-anthrylcyclohexyl, tritironcyclohexyl, 1,3-benzodithiolan-2-ylcyclohexyl, benzisothiazolyl-S,S-dioxidocyclohexyl, trimethylsilylcyclohexyl, triethylsilylcyclohexyl, triisopropylsilylcyclohexyl, and triethylstannylcyclohexyl.

Other examples of R containing an alicyclic skeleton of seven-membered ring are dimethylisopropylsilylcycloheptyl, diethylisopropylsilylcycloheptyl, dimethylthexylsilylcycloheptyl, t-butyldimethylsilylcycloheptyl, isopropylcycloheptyl, ethylcycloheptyl, n-propylcycloheptyl, n-butylcycloheptyl, isobutylcycloheptyl, s-butylcycloheptyl, pentylcycloheptyl, hexylcycloheptyl, heptylcycloheptyl, octylcycloheptyl, nonylcycloheptyl, decanylcycloheptyl, 2-trimethylsilylethoxymethylcycloheptyl, 2,2,2-trichloroethylcycloheptyl, 2-chloroethylcycloheptyl, 2-bromoethylcycloheptyl, 2-iodoethylcycloheptyl, 2-fluoroethylcycloheptyl, ω-chloroalkylcycloheptyl, 2-methylthioethylcycloheptyl, 1,3-dithianyl-2-methylcycloheptyl, cyclopentylcycloheptyl, cyclohexylcycloheptyl, 3-buten-1-ylcycloheptyl, 4-trimethylsilyl-2-buten-1-ylcycloheptyl, 9-anthrylmethylcycloheptyl, 2-9',10'-dioxo-anthrylmethylcycloheptyl, 1-pyrenylmethylcycloheptyl, 2-trifluoromethyl-6-chromylmethylcycloheptyl, piperonylcycloheptyl, 4-picolylcycloheptyl, trimethylsilylcycloheptyl, triethylsilylcycloheptyl, isopropyldimethylsilylcycloheptyl, di-t-butylmethylsilylcycloheptyl, thiocycloheptyl, tri-n-butylstannylcycloheptyl, methylcycloheptyl, methoxymethylcycloheptyl, methylthiomethylcycloheptyl, t-butylthiomethylcycloheptyl, t-butoxymethylcycloheptyl, 4-pentenyloxymethylcycloheptyl, t-butyldimethylsiloxymethylcycloheptyl, thexyldimethylsiloxymethylcycloheptyl, 2-methoxyethoxymethylcycloheptyl, 2,2,2-trichloroethoxymethylcycloheptyl, bis-2'-chloroethoxymethylcycloheptyl, 2'-trimethylsilylethoxymethylcycloheptyl, 2'-triethylsilylethoxymethylcycloheptyl, 2'-triisopropylsilylethoxymethylcycloheptyl, 2'-t-butyldimethylsilylethoxymethylcycloheptyl, tetrahydropyranylcycloheptyl, tetrahydrothiopyranylcycloheptyl, 3-bromotetrahydropyranylcycloheptyl, 1-methoxycyclohexylcycloheptyl, 4-methoxytetrahydropyranylcycloheptyl, 4-methoxytetrahydrothiopyranylcycloheptyl, 1,4-dioxan-2-ylcycloheptyl, tetrahydrofuranylcycloheptyl, tetrahydrothiofuranylcycloheptyl, 2,3,3a,4,5,6,7,7a-octahydro-7,8,8-trimethyl-4,7-methanobenzofuran-2-ylcycloheptyl, 2,2,2-trichloroethylcycloheptyl, 2-trimethylsilylethylcycloheptyl, t-butylcycloheptyl, allylcycloheptyl, 4,4',4"-tris-4',5'-dichlorophthalimidophenylmethylcycloheptyl, 4,4',4"-tris-4',5'-dibromophthalimidophenylmethylcycloheptyl, 4,4',4"-tris-4',5'-diiodophthalimidophenylmethylcycloheptyl, 9-anthrylcycloheptyl, 9-9'-phenyl-10'-oxo-anthrylcycloheptyl, tritironcycloheptyl, 1,3-benzodithiolan-2-ylcycloheptyl, benzisothiazolyl-S, S-dioxidocycloheptyl, trimethylsilylcycloheptyl, triethylsilylcycloheptyl, triisopropylsilylcycloheptyl, and triethylstannylcycloheptyl.

Other examples of R containing an alicyclic skeleton of eight-membered ring are dimethylisopropylsilylcyclooctyl, diethylisopropylsilylcyclooctyl, dimethylthexylsilylcyclooctyl, t-butyldimethylsilylcyclooctyl, isopropylcyclooctyl, ethylcyclooctyl, n-propylcyclooctyl, n-butylcyclooctyl, isobutylcyclooctyl, s-butylcyclooctyl, pentylcyclooctyl, hexylcyclooctyl, heptylcyclooctyl, octylcyclooctyl, nonylcyclooctyl, decanylcyclooctyl, 2-trimethylsilylethoxymethylcyclooctyl, 2,2,2-trichloroethylcyclooctyl, 2-chloroethylcyclooctyl, 2-bromoethylcyclooctyl, 2-iodoethylcyclooctyl, 2-fluoroethylcyclooctyl, ω-chloroalkylcyclooctyl, 2-methylthioethylcyclooctyl, 1,3-dithianyl-2-methylcyclooctyl, cyclopentylcyclooctyl, cyclohexylcyclooctyl, 3-buten-1-ylcyclooctyl, 4-trimethylsilyl-2-buten-1-ylcyclooctyl, 9-anthrylmethylcyclooctyl, 2-9',10'-dioxo-anthrylmethylcyclooctyl, 1-pyrenylmethylcyclooctyl, 2-trifluoromethyl-6-chromylmethylcyclooctyl, piperonylcyclooctyl, 4-picolylcyclooctyl, trimethylsilylcyclooctyl, triethylsilylcyclooctyl, isopropyldimethylsilylcyclooctyl, di-t-butylmethylsilylcyclooctyl, thiocyclooctyl, tri-n-butylstannylcyclooctyl, methylcyclooctyl, methoxymethylcyclooctyl, methylthiomethylcyclooctyl, t-butylthiomethylcyclooctyl, t-butoxymethylcyclooctyl, 4-pentenyloxymethylcyclooctyl, t-butyldimethylsiloxymethylcyclooctyl, thexyldimethylsiloxymethylcyclooctyl, 2-methoxyethoxymethylcyclooctyl, 2,2,2-trichloroethoxymethylcyclooctyl, bis-2'-chloroethoxymethylcyclooctyl, 2'-trimethylsilylethoxymethylcyclooctyl, 2'-triethylsilylethoxymethylcyclooctyl, 2'-triisopropylsilylethoxymethylcyclooctyl, 2'-t-butyldimethylsilylethoxymethylcyclooctyl, tetrahydropyranylcyclooctyl, tetrahydrothiopyranylcyclooctyl, 3-bromotetrahydropyranylcyclooctyl, 1-methoxycyclohexylcyclooctyl, 4-methoxytetrahydropyranylcyclooctyl, 4-methoxytetrahydrothiopyranylcyclooctyl, 1,4-dioxan-2-ylcyclooctyl, tetrahydrofuranylcyclooctyl, tetrahydrothiofuranylcyclooctyl, 2,3,3a,4,5,6,7,7a-octahydro-7,8,8-trimethyl-4,7-methanobenzofuran-2-ylcyclooctyl, 2,2,2-trichloroethylcyclooctyl, 2-trimethylsilylethylcyclooctyl, t-butylcyclooctyl, allylcyclooctyl, 4,4',4''-tris-4',5'-dichlorophthalimidophenylmethylcyclooctyl, 4,4',4''-tris-4',15'-dibromophthalimidophenylmethylcyclooctyl, 4,4',4''-tris-4',5'-diiodophthalimidophenylmethylcyclooctyl, 9-anthrylcyclooctyl, 9-9'-phenyl-10'-oxo-anthrylcyclooctyl, tritironcyclooctyl, 1,3-benzodithiolan-2-ylcyclooctyl, benzisothiazolyl-S,S-dioxidocyclooctyl, trimethylsilylcyclooctyl, triethylsilylcyclooctyl, triisopropylsilylcyclooctyl, and triethylstannylcyclooctyl.

Other examples of R containing an alicyclic skeleton of nine-membered ring are dimethylisopropylsilylcyclononyl, diethylisopropylsilylcyclononyl, dimethylthexylsilylcyclononyl, t-butyldimethylsilylcyclononyl, isopropylcyclononyl, ethylcyclononyl, n-propylcyclononyl, n-butylcyclononyl, isobutylcyclononyl, s-butylcyclononyl, pentylcyclononyl, hexylcyclononyl, heptylcyclononyl, octylcyclononyl, nonylcyclononyl, decanylcyclononyl, 2-trimethylsilylethoxymethylcyclononyl, 2,2,2-trichloroethylcyclononyl, 2-chloroethylcyclononyl, 2-bromoethylcyclononyl, 2-iodoethylcyclononyl, 2-fluoroethylcyclononyl, ω-chloroalkylcyclononyl, 2-methylthioethylcyclononyl, 1,3-dithianyl-2-methylcyclononyl, cyclopentylcyclononyl, cyclohexylcyclononyl, 3-buten-1-ylcyclononyl, 4-trimethylsilyl-2-buten-1-ylcyclononyl, 9-anthrylmethylcyclononyl, 2-9',10'-dioxo-anthrylmethylcyclononyl, 1-pyrenylmethylcyclononyl, 2-trifluoromethyl-6-chromylmethylcyclononyl, piperonylcyclononyl, 4-picolylcyclononyl, trimethylsilylcyclononyl, triethylsilylcyclononyl, isopropyldimethylsilylcyclononyl, di-t-butylmethylsilylcyclononyl, thiocyclononyl, tri-n-butylstannylcyclononyl, methylcyclononyl, methoxymethylcyclononyl, methylthiomethylcyclononyl, t-butylthiomethylcyclononyl, t-butoxymethylcyclononyl, 4-pentenyloxymethylcyclononyl, t-butyldimethylsiloxymethylcyclononyl, thexyldimethylsiloxymethylcyclononyl, 2-methoxyethoxymethylcyclononyl, 2,2,2-trichloroethoxymethylcyclononyl, bis-2'-chloroethoxymethylcyclononyl, 2'-trimethylsilylethoxymethylcyclononyl, 2'-triethylsilylethoxymethylcyclononyl, 2'-triisopropylsilylethoxymethylcyclononyl, 2'-t-butyldimethylsilylethoxymethylcyclononyl, tetrahydropyranylcyclononyl, tetrahydrothiopyranylcyclononyl, 3-bromotetrahydropyranylcyclononyl, 1-methoxycyclohexylcyclononyl, 4-methoxytetrahydropyranylcyclononyl, 4-methoxytetrahydrothiopyranylcyclononyl, 1,4-dioxan-2-ylcyclononyl, tetrahydrofuranylcyclononyl, tetrahydrothiofuranylcyclononyl, 2,3,3a,4,5,6,7,7a-octahydro-7,8,8-trimethyl-4,7-methanobenzofuran-2-ylcyclononyl, 2,2,2-trichloroethylcyclononyl, 2-trimethylsilylethylcyclononyl, t-butylcyclononyl, allylcyclononyl, 4,4',4''-tris-4',5'-dichlorophthalimidophenylmethylcyclononyl, 4,4',4''-tris-4',5'-dibromophthalimidophenylmethylcyclononyl, 4,4',4''-tris-4',5'-diiodophthalimidophenylmethylcyclononyl, 9-anthrylcyclononyl, 9-9'-phenyl-10'-oxo-anthrylcyclononyl, tritironcyclononyl, 1,3-benzodithiolan-2-ylcyclononyl, benzisothiazolyl-S,S-dioxidocyclononyl, trimethylsilylcyclononyl, triethylsilylcyclononyl, triisopropylsilylcyclononyl, and triethylstannylcyclononyl.

Other examples of R containing an alicyclic skeleton of ten-membered ring are dimethylisopropylsilylcyclodecanyl, diethylisopropylsilylcyclodecanyl, dimethylthexylsilylcyclodecanyl, t-butyldimethylsilylcyclodecanyl, isopropylcyclodecanyl, ethylcyclodecanyl, n-propylcyclodecanyl, n-butylcyclodecanyl, isobutylcyclodecanyl, s-butylcyclodecanyl, pentylcyclodecanyl, hexylcyclodecanyl, heptylcyclodecanyl, octylcyclodecanyl, nonylcyclodecanyl, decanylcyclodecanyl, 2-trimethylsilylethoxymethylcyclodecanyl, 2,2,2-trichloroethylcyclodecanyl, 2-chloroethylcyclodecanyl, 2-bromoethylcyclodecanyl, 2-iodoethylcyclodecanyl, 2-fluoroethylcyclodecanyl, ω-chloroalkylcyclodecanyl, 2-methylthioethylcyclodecanyl, 1,3-dithianyl-2-methylcyclodecanyl, cyclopentylcyclodecanyl, cyclohexylcyclodecanyl, 3-buten-1-ylcyclodecanyl, 4-trimethylsilyl-2-buten-1-ylcyclodecanyl, 9-anthrylmethylcyclodecanyl, 2-9',10'-dioxo-anthrylmethylcyclodecanyl, 1-pyrenylmethylcyclodecanyl, 2-trifluoromethyl-6-chromylmethylcyclodecanyl, piperonylcyclodecanyl, 4-picolylcyclodecanyl, trimethylsilylcyclodecanyl, triethylsilylcyclodecanyl, isopropyldimethylsilylcyclodecanyl, di-t-butylmethylsilylcyclodecanyl, thiocyclodecanyl, tri-n-butylstannylcyclodecanyl, methylcyclodecanyl, methoxymethylcyclodecanyl, methylthiomethylcyclodecanyl, t-butylthiomethylcyclodecanyl, t-butoxymethylcyclodecanyl, 4-pentenyloxymethylcyclodecanyl, t-butyldimethylsiloxymethylcyclodecanyl, thexyldimethylsiloxymethylcyclodecanyl, 2-methoxyethoxymethylcyclodecanyl, 2,2,2-trichloroethoxymethylcyclodecanyl, bis-2'-chloroethoxymethylcyclodecanyl, 2'-trimethylsilylethoxymethylcyclodecanyl, 2'-triethylsilylethoxymethylcyclodecanyl, 2'-triisopropylsilylethoxymethylcyclodecanyl, 2'-t-butyldimethylsilylethoxymethylcyclodecanyl, tetrahydropyranylcyclodecanyl, tetrahydrothiopyranylcyclodecanyl, 3-bromotetrahydropyranylcyclodecanyl, 1-methoxycyclohexylcyclodecanyl, 4-methoxytetrahydropyranylcyclodecanyl, 4-methoxytetrahydrothiopyranylcyclodecanyl, 1,4-dioxan-2-ylcyclodecanyl, tetrahydrofuranylcyclodecanyl, tetrahydrothiofuranylcyclodecanyl, 2,3,3a,4,5,6,7,7a-octahydro-7,8,8-trimethyl-4,7-methanobenzofuran-2-ylcyclodecanyl, 2,2,2-trichloroethylcyclodecanyl, 2-trimethylsilylethylcyclodecanyl, t-butylcyclodecanyl, allylcyclodecanyl, 4,4',4-tris-4',5'-dichlorophthalimidophenylmethylcyclodecanyl, 4,4',4''-tris-4',5'-dibromophthalimidophenylmethylcyclodecanyl, 4,4', 4''-tris-4',5'-diiodophthalimidophenylmethylcyclodecanyl, 9-anthrylcyclodecanyl, 9-9'-phenyl-10'-oxo-anthrylcyclodecanyl, tritironcyclodecanyl, 1,3- benzodithiolan-2-ylcyclodecanyl, benzisothiazolyl-S,S-dioxidocyclodecanyl, trimethylsilylcyclodecanyl, triethylsilylcyclodecanyl, triisopropylsilylcyclodecanyl, and triethylstannylcyclodecanyl.

Examples of most preferable R are tricyclo[$5.2.1.0^{2,6}$] decanyl, methycyclolhexylpropyl, tetracyclo[$6.2.1^{3,6}.0^{2,7}$] dodecanyl, tricyclo[$3.3.1.1^{3,7}$]decanyl, 2-methyl-2-tricyclo [$3.3.1.1^{3,7}$]decanyl, 2-ethyl-2-tricyclo[$3.3.1.1^{3,7}$]decanyl, 2-propyl-2-tricyclo[$3.3.1.1^{3,7}$]decanyl, 2-butyl-2-tricyclo [$3.3.1.1^{3,7}$]decanyl, 2-pentyl-2-tricyclo[$3.3.1.1^{3,7}$]decanyl, 2-hexyl-2-tricyclo[$3.3.1.1^{3,7}$]decanyl, 2-heptyl-2-tricyclo [$3.3.1.1^{3,7}$]decanyl, 2-octyl-2-tricyclo[$3.3.1.1^{3,7}$]decanyl, 2-nonyl-2-tricyclo[$3.3.1.1^{3,7}$]decanyl, 2-decanyl-2-tricyclo [$3.3.1.1^{3,7}$]decanyl, 2-methyl-2-cyclohexyl, 2-methyl-2-cyclopentyl, 2-methyl-2-cyclooctyl, 2-methyl-2-cyclononyl, 2-methyl-2-cyclodecanyl, 1-2'-hydroxy-4'-methyl-cyclohexyl-1-methylethyl, 1-2'-acetoxy-4'-methyl-cyclohexyl-1-methylethyl, 1-2'-tetrahydropyranyloxy-4'-methyl-cyclohexyl-1-methylethyl, 1-2'-tetrahydrofuranyloxy-4'-methyl-cyclohexyl-1-methylethyl, 1-2'-t-butyldimethylsiloxy-4'-methyl-cyclohexyl-1-methylethyl, 1-2'-2"-methoxyethoxy-4'-methyl-cyclohexyl-1-methylethyl, 1-2'-2"-ethoxyethoxy-4'-methyl-cyclohexyl-1-methylethyl, 1-2'-t-butoxycarbonylmethoxy-4'-methyl-cyclohexyl-1-methylethyl, 1-2'-t-butoxycarbonyloxy-4'-methyl-cyclohexyl-1-methylethyl, 1-4'-hydroxy-4'-methyl-cyclohexyl-1-methylethyl, 1-4'-acetoxy-4'-methyl-cyclohexyl-1-methylethyl, 1-4'-tetrahydropyranyloxy-4'-methyl-cyclohexyl-1-methylethyl, 1-4'-tetrahydrofuranyloxy-4'-methyl-cyclohexyl-1-methylethyl, 1-4'-t-butyldimethylsiloxy-4'-methyl-cyclohexyl-1-methylethyl, 1-4'-2"-methoxyethoxy-4'-methyl-cyclohexyl-1-methylethyl, 1-4'-2"-ethoxyethoxy-4'-methyl-cyclohexyl-1-methylethyl, 1-4'-t-butoxycarbonylmethoxy-4'-methyl-cyclohexyl-1-methylethyl, 1-4'-t-butoxycarbonyloxy-4'-methyl-cyclohexyl-1-methylethyl, 3-methyl-δ-valerolactone-3-yl, 3-methyl-oxacyclohexan-2-on-3-yl, 3-ethyl-δ-valerolactone-3-yl, 3-ethyl-oxacyclohexan-2-on-3-yl, 3-propyl-δ-valerolactone-3-yl, 3-propyl-oxacyclohexan-2-on-3-yl, 3-butyl-δ-valerolactone-3-yl, 3-butyl-oxacyclohexan-2-on-3-yl, 1-methyl-3-oxocyclopentyl, 1-methyl-3-oxocyclohexyl, 1-methyl-3-oxocycloheptyl, 1-methyl-3-oxocyclooctyl, 1-methyl-3-oxocyclononyl, 1-methyl-3-oxocyclodecanyl, 1-ethyl-3-oxocyclopentyl, 1-ethyl-3-oxocyclohexyl, 1-ethyl-3-oxocycloheptyl, 1-ethyl-3-oxocyclooctyl, 1-ethyl-3-oxocyclononyl, 1-ethyl-3-oxocyclodecanyl, 1-propyl-3-oxocyclopentyl, 1-propyl-3-oxocyclohexyl, 1-propyl-3-oxocycloheptyl, 1-propyl-3-oxocyclooctyl, 1-propyl-3-oxocyclononyl, 1-propyl-3-oxocyclodecanyl, 1-butyl-3-oxocyclopentyl, 1-butyl-3-oxocyclohexyl, 1-butyl-3-oxocycloheptyl, 1-butyl-3-oxocyclooctyl, 1-butyl-3-oxocyclononyl, 1-butyl-3-oxocyclodecanyl and patchoulyl.

The group to be introduced as $R^1$ in the aforementioned (m-1), (m-2) and (m-3) is a group selected from the following groups;

a monovalent organic group having Si (R1-1), and

(R1-2), wherein $X^2$ is a bivalent organic group containing a heteroatom; k is an integer of 0 to 3; $R^4$ is a bivalent alkyl group; $X^3$ is a bivalent organic group containing a heteroatom; m is an integer of 0 to 3; $R^6$s may be the same or different and are individually hydrogen atom, halogen atom or monovalent organic group.

Specific examples of bivalent organic group containing a heteroatom that can be introduced as $X^2$ into the group represented by the general formula (R1-2) are >C=O, —C(=O)O—, —C(=O)$NR^3$—, —$SO_2$—, —$S(=O)_2$$NR^3$—, —O—, —OC(=O)—, —O$CH_2$C(=O)O—, —$OSO_2$—, and —$S(=O)_2$O—. The $R^3$ in this case is hydrogen atom, halogen atom or a hydrocarbon group such as cyclohexyl, benzyl, naphthyl, phenyl, methyl, ethyl, propyl, butyl, cyclohexylmethyl, isopropyl, allyl and propargyl.

Most preferable examples of $X^2$ among them are —C(=O)O—, —OC(=O)— and —O—.

Preferable examples of $R^4$ are —$CH_2$—, —$C(CH_3)_2$—, —$CHCH_3$—, —$C(CH_2CH_3)_2$— and —$CHCH_2CH_3$.

As for $X^3$, the same kinds of bivalent organic group containing a heteroatom as exemplified for $X^2$ can be employed. In particular, —C(=O)O—, —OC(=O)— and —O— are preferable as $X^3$.

$R^6$s may be the same or different and are individually hydrogen atom, halogen atom or monovalent organic group. Examples of monovalent organic group that can be introduced as $R^6$ into the group represented by the general formula (R1-2) are a hydrocarbon group, a pentacycloalkyl group, a tetracycloalkyl group, a tricycloalkyl group, a bicycloalkyl group, a heterocyclalkyl group and a group containing terpenoid skeleton. Specific examples of such an organic group are phenyl, naphthyl, methyl, ethyl, propyl, butyl, pentyl, hexyl, heptyl, octyl, nonyl, decanyl, undecanyl, dodecanyl, cyclohexyl, tricyclo[$3.3.1.1^{3,7}$] decanyl, cyclopentyl, cycloheptyl, cyclooctyl, cyclononyl, cyclodecanyl, tricyclodecanyl, 2-methyl-tricyclo[$3.3.1^{3,7}$] decanyl, androst-4-en-3,11,17-trion-yl, 21-acetoxypregnan-11,20-dion-3-yl, pregnan-11,20-dion-3-yl, cholest-4-en-3-yl, 17,21-dihydroxy-5α-pregnan-11,20-dion-3-yl, 3,17-dihydroxy-5α-pregnan-11,20-dion-21-yl, bicyclo[4,4,0] decanyl, etioallocholanyl, 3-hydroxy-androstan-17-yl, hydroxyandrostanyl, 1-1'-oxoethyl-3-methoxy-4-phenyl, benzofuranyl, benzothiazolyl, 3-hydroxyestro-4-en-17-yl, hydroxyestro-4-enyl, 1,4-androstadien-3-on-17-yl, 1,7,7-trimethylbicyclo[2,2,1]heptan-2-yl, 1,7,7-trimethylbicyclo [2,2,1]heptan-2-on-3-yl, 24-R-elgost-5-en-3-yl, 4,7,7-trimethyl-3-oxobicyclo[2,2,1]heptan-2-yl, sebadinyl, cevinyl, crydonynyl, 3,7-dihydroxyfuranyl, 3-hydroxycholanyl, 7-hydroxycholanyl, cholanyl, cholestanyl, 3-cholestanyl, cholestoralyl, 3,7,12-trihydroxy-5β-cholan-24-yl, stigmasta-7,22-dien-3-yl, clostevolyl, cortichsteronyl, cortisonyl, cortryl, cortronyl, cyclohexylcarbynyl,-7-dehydrocholesteryl, 3,7,12-trioxofuran-24-yl, pregn-4-en-3,11,20-trion-21-yl, 1,3-cyclohexanedion-5-yl, esgostanyl, ergost-7-en-3-yl, pentadecanyl, hexadecanyl, heptadecanyl, octadecanyl, nonadecanyl, oxacyclohexadecan-2-on-3-yl, hydroxycholesterol-3-yl, 4-hydroxy-estro-4-en-3-on-17-yl, exo-1,7,7-trimethylbicyclo[2,2,1]heptan-2-yl, ketoprogesteronyl, lupininyl, novobunololyl, 6-methylpregn-4-en-3,20-dion-11-yl, (1α, 2β, 5α)-5-methyl-2-(1-methylethyl)-cyclohexyl, (1α, 2β, 5α)-5-methyl-2-(1-hydroxy-1-methylethyl)-cyclohexyl, norcholanyl, dihydro-4H-dimethyl-2(3H)-furanon-3-yl, pinen-yl, pulegon-6-yl, cyclodecanon-2-yl, 1,2-cyclodecanedion-3-yl, (3β, 5α)-stigmastan-3-yl, α-hydroxy-α,α,4-trimethyl-3-cyclohexen-5-yl, solanid-5-en-3-yl, (3β, 22E)-stigmasta-5,22-dien-3-yl, taraxasteryl, and taraxeryl.

Most preferable examples of $R^6$ are hydrogen atom and hydrocarbon groups having one to 15 carbon atoms, specific examples of which are methyl, ethyl, n-propyl, isopropyl, n-butyl, s-butyl, t-butyl, isobutyl and pentyl.

Specific examples of the monovalent organic group having Si (R1-1) are those represented by the following general formula;

 (R1-3)

wherein $X^2$ is a bivalent alkyl group containing a heteroatom; k is an integer of 0 to 3; $R^5$ is a bivalent alkyl group; n is an integer of 0 to 3; $R^7$s may be the same or different and are individually hydrogen atom, halogen atom or monovalent organic group.

As for $X^2$, the same kinds of bivalent alkyl group containing a heteroatom that can be introduced into the aforementioned general formula (R1-2) can be employed.

Preferable examples of $X^5$ are —$CH_2$—, —$C(CH_3)_2$—, —$CHCH_3$—, —$C(CH_2CH_3)_2$— and —$CHCH_2CH_3$—.

As for the monovalent organic group to be introduced as $R^7$ into the general formula (R1-3), the same kinds of monovalent organic group as exemplified for the aforementioned $R^6$ can be employed. Most preferable examples of $R^7$ are hydrogen atom, methyl, ethyl, n-propyl, isopropyl, n-butyl, s-butyl, t-butyl, isobutyl and pentyl.

Aforementiond $R^1$s are groups that can be decomposed by an acid.

It is possible to introduce the following groups that can be decomposed by an acid (hereinafter referred to as a solubility-inhibiting group) as the aforementioned $R^1$ into the general formulas (m-1), (m-2) and (m-3). Specific examples of such a solubility-inhibiting group are esters such as t-butydimethylsiloxy group, t-butydilmethylsiloxycarbonyl group, tetrahydropyranyloxy group, t-butoxycarbonylmethoxy group, methoxycarbonylmethoxy group, ethoxycarbonylmethoxy group, propioxycarbonylmethoxy group, isopropioxycarbonyl group, ethoxycarbonyl group, methoxycarbonyl group, methoxymethoxycarbonyl group, ethoxyethoxycarbonyl group, methylthiomethoxycarbonyl group, tetrahydropyranyloxycarbonyl group, tetrahydrofuranyloxycarbonyl group, methoxyethoxymethyoxycarbonyl group, 2-trimethylsilylethoxymethoxycarbonyl group, 2,2,2-trichloroethoxycarbonyl group, 2-chloroethoxycarbonyl group, 2-bromoethoxycarbonyl group, 2-iodoethoxycarbonyl group, 2-fluoroethoxycarbonyl group, ω-chloroalkyloxycarbonyl group, 2-trimethylsilylethoxycarbonyl group, 2-methylthioethoxycarbonyl group, 1,3-dithianyl-2-methoxycarbonyl group, t-butoxycarbonyl group, cyclopentoxycarbonyl group, cyclohexoxycarbonyl group, 3-oxocyclohexoxycarbonyl group, allyloxycarbonyl group, 3-buten-1-yloxycarbonyl group, isobornyloxycarbonyl group, $^4$-trimethylsilyl-2-buten-1-yloxycarbonyl group, 9-anthrylmethoxycarbonyl group, 2-9',10'-dioxoanthrylmethoxycarbonyl group, 1-pyrenylmethoxycarbonyl group, $^2$-trifluoromethyl-6-chromylmethoxycarbonyl group, piperonyloxycarbonyl group, 4-picolyloxycarbonyl group, trimethylsiloxycarbonyl group, triethylsiloxycarbonyl group, isopropyldimethylsiloxycarbonyl group, di-t-butylmethylsiloxycarbonyl group, thioloxycarbonyl group, oxazole, 2-alkyl-1,3-oxazoline, 4-alkyl-5-oxo-1,3-oxazoline, 5-alkyl-4-oxo-1,3-dioxolane, orthoester, pentaaminecobalt complex, triethylstannyloxycarbonyl group, tri-n-butylstannyloxycarbonyl group, N,N-dimethylamide, pyrrolidine amide, piperidine amide, 5,6-dihydrophenanthridine amide, N-7-nitroindoloxycarbonyl group, N-8-nitro-1,2,3,4-tetrahydroquinolyl amide, hydrazide, N-phenyl hydrazide and N,N'-diisopropyl hydrazide; ethers such as t-butoxycarbonyloxy group, methoxy group, methoxymethoxy group, methylthiomethoxy group, t-butylthiomethoxy group, t-butoxymethoxy group, 4-pentenyloxymethoxy group, t-butyldimethylsiloxymethoxy group, thexyldimethylsiloxymethoxy group, 2-methoxyethoxymethoxy group, 2,2,2-trichloroethoxymethoxy group, bis-2'-chloroethoxymethoxy group, 2'-trimethylsilylethoxymethoxy group, 2-triethylsilylethoxymethoxy group, 2'-triisopropylsilylethoxymethoxy group, 2'-t-butyldimethylsilylethoxymethoxy group, tetrahydropyranyloxy group, tetrahydrothiopyranyloxy group, 3-bromotetrahydropyranyloxy group, 1-methoxycyclohexoxy group, 4-methoxytetrahydropyranyloxy group, 4-methoxytetrahydrothiopyranyloxy group, 4-methoxytetrahydrothiopyranyloxy-S,S-dioxide group, 1,4-dioxan-2-yloxy group, tetrahydrofuranyloxy group, tetrahydrothiofuranyloxy group, 2,3,3a,4,5,6,7,7a-octahydro-7,8,8-trimethyl-4,7-methanobenzofuran-2-yloxy group, 1-ethoxyethoxy group, 1-2'-chloroethoxy-ethoxy group, 1-methyl-1-methoxyethoxy group, 2,2,2-trichloroethoxy group, 2-trimethylsilylethoxy group, t-butyloxy group, allyloxy group, 4,4',4'-tris-4',5'-dichlorophthalimidophenyl-methoxy group, 4,4',4"-tris-4',5'-dibromophthalimidophenyl-methoxy group, 4,4',4-tris-4',5'-diiodophthalimidophenyl-methoxy group, 9-anthryloxy group, 9-9'-phenyl-10'-oxo-anthryloxy group (tritylone ether), 1,3-benzodithiolan-2-yloxy group, benzisothiazolyl-S,S-dioxide ether, trimethylsiloxy group, triethylsiloxy group, triisopropylsiloxy group, dimethylisopropylsiloxy group, diethylisopropylsiloxy group, dimethylthexylsiloxy group and t-butyldimethylsiloxy group; acetals such as methylene acetal, ethylidene acetal, 2,2,2-trichloroethylidene acetal, 2,2,2-tribromoethylidene acetal and 2,2,2-triiodoethylidene acetal; ketals such as 1-t-butylethylidene ketal, isopropylidene ketal (acetonide), cyclopentylidene ketal, cyclohexylidene ketal and cycloheptylidene ketal; cyclic orthoesters such as methoxymethylene acetal, ethoxymethylene acetal, dimethoxymethylene orthoester, 1-methoxyethylidene orthoester, 1-ethoxyethylidene orthoester, 1,2-dimethoxyethylidene orthoester, 1-N,N-dimethylaminoethylidene orthoester and 2-oxacyclopentylidene orthoester; silylketene acetals such as trimethylsilylketene acetal, triethylsilylketene acetal, triisopropylsilylketene acetal and t-butyldimethylsilylketene acetal; silyl ethers such as di-t-butylsilyl ether, 1,3-1',1',3',3'-tetraisopropyldisiloxanylidene ether and tetra-t-butoxydisiloxan-1,3-diylidene ether; acyclic acetals or acyclic ketals such as dimethyl acetal, dimethyl ketal, bis-2,2,2-trichloroethyl acetal, bis-2,2,2-tribromoethyl acetal, bis-2,2,2-triiodoethyl acetal, bis-2,2,2-trichloroethyl ketal, bis-2,2,2-tribromoethyl ketal, bis-2,2,2-triiodoethyl ketal, diacetyl acetal and diacetyl ketal; cyclic acetals or cyclic ketals such as 1,3-dioxane, 5-methylene-1,3-dioxane, 5,5-dibromo-1,3-dioxane, 1,3-dioxolane, 4-bromomethyl-1,3-dioxolane, 4-3'-butenyl-1,3-dioxolane and 4,5-dimethoxymethyl-1,3-dioxolane; acyclic dithioacetals or acyclic dithioketals such as S,S'-dimethyl acetal, S,S'-dimethyl ketal, S,S'-diethyl acetal, S,S'-diethyl ketal, S,S'-dipropyl acetal, S,S'-dipropyl ketal, S,S'-dibutyl acetal, S,S'-dibutyl ketal, S,S'-dipentyl acetal, S,S'-dipentyl ketal, S,S'-diacetyl acetal, and S,S'-diacetyl ketal; cyclic dithioacetals or cyclic dithioketals such as 1,3-dithianacetal, 1,3-dithianketal, 1,3-dithiolane acetal, and 1,3-dithiolane ketal; O-trimethylsilyl-S-alkylacetals; O-trimethylsilyl-S-alkylketals; acyclic monothioacetals such as O-methyl-S-2-methylthioethyl acetal; acyclic monothioketals such as O-methyl-S-2-methylthioethyl ketal; cyclic monothioacetals or cyclic monothioketals such as 1,3-oxathiolane acetal, diselenoacetal and diselenoketal; cyanohydrins such as O-trimethylsilylcyanohydrin, O-1-ethoxyethylcyanohydrin and O-tetrahydropyranylcyanohydrin; hydrazones such as N,N-dimethylhydrazone; oximes such as oxime derivatives and O-methyloxime; and cyclic derivatives such as oxazoline, 1-methyl-2-1'-hydroxyalkyl-imidazole and N,N-dimethylimidazolidine.

More preferable examples of solubility-inhibiting group are t-butoxycarbonyl group such as t-butoxycarbonylmethoxy group, methoxycarbonylmethoxy group, ethoxycarbonylmethoxy group, propioxycarbonylmethoxy group, t-butoxycarbonyl group, ethoxyethoxycarbonyl group, 3-oxocyclohexoxycarbonyl group, t-butyl-3-naphthyl-2-propenoate, isobornyloxycarbonyl group, trimethylsiloxycarbonyl group, tetrahydropyranyloxycarbonyl group, t-butoxycarbonyl group, ethoxyethoxycarbonyl group, 3-oxocyclohexoxycarbonyl group, t-butyldimethylsiloxy group, t-butyldimethylsiloxycarbonyl group, tetrahydropyranyloxy group, 2-methyl-2-tricyclo[3.3.1.1$^{3,7}$]decanyloxycarbonyl group, 2-ethyl-2-tricyclo[3.3.1.1$^{3,7}$]decanyloxycarbonyl group, 2-propyl-2-tricyclo[3.3.1.1$^{3,7}$]decanyloxycarbonyl group, and 2-butyl-2-tricyclo[3.3.1.1$^{3,7}$]decanyloxycarbonyl group; trimethylsiloxycarbonyl group; and tetrahydropyranyloxycarbonyl group. When these groups are employed, the compound containing any one of these groups becomes more decomposable by an acid.

$R^2$ in the general formulas (m-1), (m-2) and (m-3) is selected from hydrogen atom, halogen atom or a monovalent organic group. Examples of monovalent organic group that can be introduced as $R^2$ into the general formulas (m-1), (m-2) and (m-3) are hydrocarbon group, pentacycloalkyl group, tetracycloalkyl group, tricycloalkyl group, bicycloalkyl group, heterocycloalkyl group and a group containing terpenoid skeleton. Specific examples of such an organic group are phenyl, naphthyl, methyl, ethyl, propyl, butyl, pentyl, hexyl, heptyl, octyl, nonyl, decanyl, undecanyl, dodecanyl, cyano, cyclohexyl, tricyclo[3.3.1.1$^{3,7}$]decanyl, cyclopentyl, cycloheptyl, cyclooctyl, cyclononyl, cyclodecanyl, tricyclodecanyl, 2-methyl-tricyclo[3.3.1.1$^{3,7}$]decanyl, androst-4-en-3,11,17-trion-yl, 21-acetoxypregnan-11,20-dion-3-yl, pregnan-11,20-dion-3-yl, cholest-4-en-3-yl, 17,21-dihydroxy-5α-pregnan-11,20-dion-3-yl, 3,17-dihydroxy-5α-pregnan-11,20-dion-21-yl, bicyclo[4,4,0]decanyl, etioallocholanyl, 3-hydroxy-androstan-17-yl, hydroxyandrostanyl, 1-1'-oxoethyl-3-methoxy-4-phenyl, benzofuranyl, benzothiazolyl, 3-hydroxyestro-4-en-17-yl, hydroxyestro-4-enyl, 1,4-androstadien-3-on-17-yl, 1,7,7-trimethylbicyclo[2,2,1]heptan-2-yl, 1,7,7-trimethylbicyclo[2,2,1]heptan-2-on-3-yl, 24-R-elgost-5-en-3-yl, 4,7,7-trimethyl-3-oxobicyclo[2,2,1]heptan-2-yl, sebadinyl, cevinyl, crydonynyl, 3,7-dihydroxyfuranyl, 3-hydroxycholanyl, 7-hydroxycholanyl, cholanyl, cholestanyl, 3-cholestanyl, cholestoralyl, 3,7,12-trihydroxy-5β-cholan-24-yl, stigmasta-7,22-dien-3-yl, clostevolyl, cortichsteronyl, cortisonyl, cortryl, cortronyl, cyclohexylcarbynyl, 7-dehydrocholesteryl, 3,7,12-trioxofuran-24-yl, pregn-4-en-3,11,20-trion-21-yl, 1,3-cyclohexanedion-5-yl, esgostanyl, ergost-7-en-3-yl, pentadecanyl, hexadecanyl, heptadecanyl, octadecanyl, nonadecanyl, oxacyclohexadecan-2-on-3-yl, hydroxycholesterol-3-yl, 4-hydroxy-estro-4-en-3-on-17-yl, exo-1,7,7-trimethylbicyclo[2,2,1]heptan-2-yl, ketoprogesteronyl, lupininyl, novobunololyl, 6-methylpregn-4-en-3,20-dion-11-yl, (1α,2β,5α)-5-methyl-2-(1-methylethyl)-cyclohexyl, (1α,2β,5α)-5-methyl-2-(1-hydroxy-1-methylethyl)-cyclohexyl, norcholanyl, dihdro-4H-dimethyl-2(3H)-furanon-3-yl, pinen-yl, pulegon-6-yl, cyclodecanon-2-yl, 1,2-cyclodecanedion-3-yl, (3β,5α)-stigmastan-3-yl, α-hydroxy-α,α,4-trimethyl-3-cyclohexen-5-yl, solanid-5-en-3-yl, (3β,22E)-stigmasta-5,22-dien-3-yl, taraxasteryl, and taraxeryl.

Those having an alicyclic skeleton among these monovalent organic groups can be introduced also as R into the general formulas (m-1), (m-2) and (m-3).

Among the aforementioned groups, most preferable examples of $R^2$ are hydrogen atom, chloro group, fluoro group, methyl group, ethyl group, cyano group, tricyclo[3.3.1.1$^{3,7}$]decanyl, naphthyl, tricyclodecanyl, cholanyl and cholestanyl.

Specific examples of bivalent organic group containing a heteroatom that can be introduced as $X^1$ into the general formulas (m-1) and (m-2) are >C=O, —C(=O)O—, —C(=O)NR$^3$—, —SO$_2$—, —S(=O)$_2$NR$^3$—, —O—, —OC(=O)—, and —OCH$_2$C(=O)—. Most preferable examples of $X^1$ among them in view of decomposability thereof by an acid are —C(=O)O—.

The $R^3$ is hydrogen atom, halogen atom or a hydrocarbon group such as cyclohexyl, benzyl, naphthyl, phenyl, methyl, ethyl, propyl, butyl, cyclohexylmethyl, isopropyl, allyl and propargyl.

$R^8$s in the general formulas (m-2) and (m-3) may be the same or different and are individually hydrogen atom, halogen atom or monovalent organic group. If $R^8$s are monovalent organic group, at least one of $R^8$s may be combined with part of R thereby to form a ring.

Examples of monovalent organic group to be introduced as $R^8$ are monovalent organic groups that have been exemplified as $R^6$. In particular, hydrogen atom, methyl, ethyl, n-propyl, isopropyl, n-butyl, s-butyl, t-butyl, isobutyl and pentyl are preferably as $R^8$.

The alicyclic skeleton to be introduced into R in the aforementioned general formulas (m-1), (m-2) and (m-3) may be any one of terpenoid skeletons represented by the following general formulas (2A) to (2C).

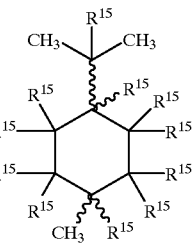

(2A)

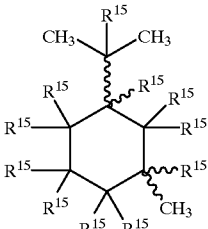

(2B)

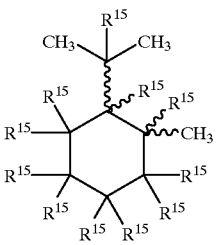

(2C)

wherein $R^{15}$s may be the same or different and are individually hydrogen atom, halogen atom, hydrocarbon group, hydroxyl group, alkoxyl group, amino group, imide group, amide group, carboxyl group, alkoxycarbonyl group, carbonyl group, cyano group, sulfonamide group or sulfonyl group; wherein $R^{15}$ are combined together to form a ring.

The monovalent hydrocarbon group to be introduced as $R^{15}$ may be aliphatic group or aromatic group, and may contain a hetero atom such as nitrogen atom, oxygen atom, sulfur atom and phosphorus. The aliphatic group may be a saturated or unsaturated group, or may be a straight or branched chain. Further, the aliphatic group may contain a cyclic compound. On the other hand, the aromatic group may be an unsubstituted or aliphatic group (the aforementioned aliphatic group)-substituted group.

When $R^{15}$ is amino group, the hydrogen atom thereof may be substituted by the aforementioned aliphatic or aromatic group.

The high molecular compounds according to this invention can be obtained by homo- or co-polymerizing the monomers represented by the aforementioned general formulas (m-1), (m-2) and (m-3). In other words, the high molecular compounds according to this invention are those containing at least one kind of repeating units represented by the following general formulas (u-1), (u-2) and (u-3):

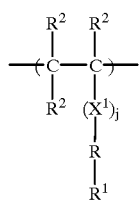
(u-1)

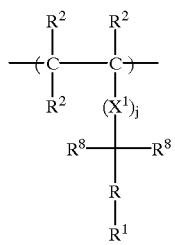
(u-2)

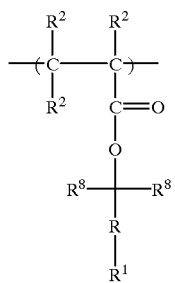
(u-3)

wherein R is a group having an alicyclic skeleton; $R^2$s may be the same or different and are individually hydrogen atom, halogen atom or monovalent organic group; $X^1$ is a bivalent organic group containing a heteroatom; j is an integer of 0 to 3; $R^1$ is a group selected from the following groups;

a monovalent organic group having Si (R1-1), and

(R1-2), wherein $X^2$ is a bivalent organic group containing a heteroatom; k is an integer of 0 to 3; $R^4$ is a bivalent alkyl group; $X^3$ is a bivalent organic group containing a heteroatom; m is an integer of 0 to 3; $R^6$s may be the same or different and are individually hydrogen atom, halogen atom or monovalent organic group; and $R^8$s may be the same or different and are individually hydrogen atom, halogen atom or monovalent organic group wherein at least one of $R^8$s may be combined with part of R thereby to form a ring.

The high molecular compounds according to this invention can be manufactured by copolymerizing a vinyl compound having on its side chain a terpenoid skeleton represented by any of the following general formulas (2A) to (2C) or an acrylic compound represented by the following general formula (3) with a monomer containing a group that can be decomposed by an acid.

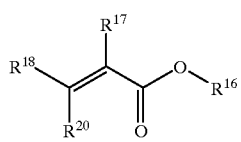
(3)

wherein $R^{16}$ is a group having a cyclic skeleton; $R^{17}$, $R^{18}$ and $R^{20}$ may be the same or different and are individually hydrogen atom, halogen atom, cyano group, nitro group, silyl group, hydrocarbon group, hydroxyl group, alkoxyl group, amino group, imide group, amide group, sulfonyl group, carboxyl group or sulfonamide group.

As for $R^{16}$ having a cyclic skeleton, tetracycloalkyl group, tricycloalkyl group, bicycloalkyl group, oxacycloalkyl group, heterocycloalkyl group and oxocycloalkyl group (5 to 20 in alkyl carbon number) can be employed. As for monovalent organic group to be introduced as $R^{17}$, $R^{18}$ and $R^{20}$, cyano group, chloro group, bromo group, iodyl group, nitro group, hydroxyl group, methyl group, ethyl group, propyl group, butyl group, methoxy group, ethoxy group and silyl group can be employed.

The aforementioned copolymer contains a group having a terpenoid skeleton in its skeleton as illustrated below in details.

The quantity of terpenoid skeleton should preferably be 5 to 95% by weight based on the solid matters of the photosensitive composition. Because if the quantity of terpenoid skeleton is less than 5% by weight, the dry etching resistance of a pattern to be obtained would be deteriorated, while if the quantity of terpenoid skeleton is more than 95% by weight, the resolution and sensitivity of the photosensitive composition would be deteriorated. More preferable quantity of terpenoid skeleton is in the range of 20 to 75% by weight.

By the term "compounds having a terpenoid skeleton", it includes not only a hydrocarbon which substantially conforms to the isoprene rule and has a basic composition of $C_5H_8$, but also an oxygen-containing compound derived from such a hydrocarbon, a compound differing in saturation from the aforementioned hydrocarbon, or a derivative of the hydrocarbon that can be used as a component of the photosensitive composition of this invention.

Specific examples of the aforementioned hydrocarbon, oxygen-containing compound derived from such a hydrocarbon and compound differing in saturation from the hydrocarbon are those having in their structure a skeleton such as myrcene, carene, ocimene, pinene, limonene, caffeine, terpinolene, tricyclene, terpinene, fenchene, phellandrene, sylvestrene, sabinene, cetronellol, pinocampheol, geraniol, fenchyl alcohol, nerol, borneol, linalol, menthol, terpineol, carveol, thujyl alcohol, citronellal, ionone, irone, cinerole, citral, menthone, pinol, cyclocitral, carvomethone, ascaridole, safranal, carvotanacetone, phellandral, pimelintenone, citronellic acid, perillaldehyde, thujone, caron, tagetone, camphor, bisabolene, santalene, zingiberene, caryophyllene, curcumene, cedrene, cadinene, longifolene, sesquibenihene, farnesol, patchouli alcohol, nerolidol, carotol, cadinol, lanceol, eudesmol, cedrol, guaiol, kessoglycol, cyperone, hinokiic acid, eremophilone, santalic acid, zerumbone, camphorene, podocarprene, mirene, phyllocladene, totarene, phytol, sclareol, manool, hinokiol, ferruginol, totarol, sugiol, ketomanoyl oxide, manoyl oxide, abietic acid, pimaric acid, neoabietic acid, levopimaric acid, iso-d-pimaric acid, agathenedicarboxylic acid, rubenic acid, triterpene, tetraterpene, steroid or carotinoide.

Among these compounds, a compound having a monocyclic terpenoid skeleton, or hemiterpene, monoterpene, diterpene and sesquiterpene are more advantageous in view of the excellent alkali-solubility thereof.

As for the compound having terpenoid skeleton, it is preferable to employ carene, pinene, limonene, caffeine, terpinolene, terpinene, borneol, menthol, terpineol, soblelol and patchouli alcohol. Most preferable examples of the compound having terpenoid skeleton are polymers containing a group such as a menthyl group or a menthyl derivative group, a terpinolene group and a terpinolene derivative group, a terpinene group or a terpinene derivative group, a borneol group or a borneol derivative group, a terpineol group or a terpineol derivative group, a soblelol group or a soblelol derivative group and a patchouli alcohol or a patchouli alcohol derivative group. Menthol ($C_{10}H_{20}O$) which may useful as a raw material for the preparation of a polymer containing a menthyl group or a menthyl derivative group is easily available, safe in use, cheap in cost and chemically stable.

The menthyl group or menthyl derivative group can be represented by the aforementioned general formulas (2A) to (2C).

Examples of menthyl group or menthyl derivative group are p-mentha-1,8-dienyl group, p-mentha-2,8-dienyl group, p-mentha-3,8-dienyl group, α-terpinyl group, β-terpinyl group, γ-terpinyl group, 5-hydroxy-α,α-trimethyl-3-cyclohexene-1-menthyl group, 1-hydroxy-α,α-trimethyl-3-cyclohexene-5-menthyl group, 8-butylmenthyl group, 8-β-naphthylmenthyl group and 8-α-naphthylmenthyl group.

A monomer containing a group that can be decomposed by an acid and an alicyclic skeleton such as menthyl group or a derivative thereof, a terpinolene group and a derivative thereof, a terpinene group or a derivative thereof, a borneol group or a derivative thereof, a terpineol group or a derivative thereof, a soblelol group or a derivative thereof, and a patchouli alcohol or derivative thereof can be synthesized as follows. Namely, first of all, terpineol, p-toluenesulfonic acid and dihydropyrane are reacted with each other in methylene chloride to synthesize tetrahydropyranyl terpineol, which is then reacted with acrylic chloride and n-butyl lithium in tetrahydrofuran thereby synthesize the monomer. The monomer thus obtained is subsequently homo- or co-polymerized thereby to obtain an aimed polymer.

The quantity of the group such as the menthyl group or menthyl derivative group, the terpinolene group or terpinolene derivative group, the terpinene group or terpinene derivative group, the borneol group or borneol derivative group, the terpineol group or terpineol derivative group, the soblelol group or soblelol derivative group, the patchouli alcohol or patchouli alcohol derivative group in the solid matters of a photosensitive composition, when the group such as menthyl group or menthyl derivative group, terpinolene group or terpinolene derivative group, terpinene group or terpinene derivative group, borneol group or borneol derivative group, terpineol group or terpineol derivative group, soblelol group or soblelol derivative group, patchouli alcohol or patchouli alcohol derivative group is to be introduced into the photosensitive composition, should preferably be at least 5% by weight and not more than 95% by weight. Because if the content of this compound is less than 5% by weight, the dry etching resistance of the pattern would be undesirably lowered. On the other hand, if the content of this compound is more than 95% by weight, the resolution and sensitivity of the photosensitive material would be lowered. Therefore, more preferable quantity of the group such as the menthyl group or menthyl derivative group, the terpinolene group or terpinolene derivative group, the terpinene group or terpinene derivative group, the borneol group or borneol derivative group, the terpineol group or terpineol derivative group, the soblelol group or soblelol derivative group, the patchouli alcohol or patchouli alcohol derivative group is 20 to 75% by weight.

The polymer according to this invention may be a homopolymer consisting only of a repeating unit represented by the aforementioned general formula (u-1), (u-2) or (u-3). However, in view of achieving a high resolution of the photosensitive composition, the polymer according to this invention should preferably be a copolymer comprising the aforementioned repeating unit and a vinyl compound.

Vinyl compounds useful in this case are methyl acrylate, methyl methacrylate, methyl α-chloroacrylate, methyl cyanoacrylate, trifuluoromethyl acrylate, α-methyl styrene, trimethylsilyl methacrylate, trimethylsilyl α-chloroacrylate, trimethylsilylmethyl α-chloroacrylate, maleic anhydride, tetrahydropyranyl methacrylate, tetrahydropyranyl α-chloroacrylate, t-butyl methacrylate, t-butyl α-chloroacrylate, butadiene, glycidyl methacrylate, isobornyl methacrylate, menthyl methacrylate, norbornyl methacrylate, adamantyl methacrylate and allyl methacrylate.

If an acrylic compound such as methyl methacrylate, α-chloromethacrylate, trifluoroethyl α-chloroacrylate, trifluoromethyl acrylate or olefin sulfonic acid is to be employed for the copolymer composition, it may be preferably used for the preparation of a positive resist. On the other hand, if an acrylic compound having vinyl group, allyl group or epoxy group at the alcoholic moiety of the ester, or an acrylic compound having 4 or more carbon atoms at the alcoholic moiety of the ester is to be employed for the copolymer composition, it may be preferably used for the preparation of a negative resist.

Acrylic compounds useful in this case can be represented by the following general formula (4).

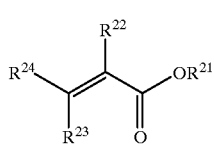

(4)

wherein $R^{21}$ is hydrogen atom or a monovalent organic group, $R^{22}$, $R^{23}$ and $R^{24}$ may be the same or different from one another and are individually hydrogen atom, chlorine atom or alkyl group.

If a compound containing the group such as menthyl group or menthyl derivative group, terpinolene group or terpinolene derivative group, terpinene group or terpinene derivative group, borneol group or borneol derivative group, terpineol group or terpineol derivative group, soblelol group or soblelol derivative group, patchouli alcohol or patchouli alcohol derivative group, which can be used for preparing the polymer, is an acrylic compound represented by the general formula (4) mentioned above, it can be easily polymerized or copolymerized and therefore the employment of such a compound is preferable. The acrylic compound mentioned above can also be represented by the following general formula (5). This acrylic compound can be homopolymerized or copolymerized thereby obtaining an aimed polymer.

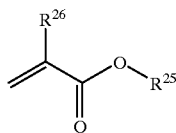
(5)

wherein $R^{25}$ is an organic group containing the group represented by the aforementioned general formulas (2A) to (2C) such as menthyl group or menthyl derivative group, terpinolene group or terpinolene derivative group, terpinene group or terpinene derivative group, borneol group or borneol derivative group, terpineol group or terpineol derivative group, soblelol group or soblelol derivative group, patchouli alcohol or patchouli alcohol derivative group, and $R^{26}$ is alkyl group, carboxyl group, alkoxycarbonyl group, halogen atom or hydrogen atom.

The above mentioned group such as menthyl group or menthyl derivative group, terpinolene group or terpinolene derivative group, terpinene group or terpinene derivative group, borneol group or borneol derivative group, terpineol group or terpineol derivative group, soblelol group or soblelol derivative group, and patchouli alcohol or patchouli alcohol derivative group may be introduced into a polycarboxylic acid having a polymerizable structure as shown in the following general formula (6). This is preferable in view of high resolution that can be obtained therefrom.

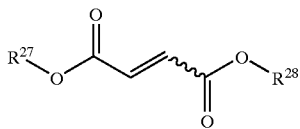
(6)

wherein $R^{27}$ and $R^{28}$ are monovalent organic group, halogen atom, or hydrogen atom, and at least one of them includes an acid-decomposable group and the group represented by the aforementioned general formulas (2A) to (2C) such as menthyl group or menthyl derivative group, terpinolene group or terpinolene derivative group, terpinene group or terpinene derivative group, borneol group or borneol derivative group, terpineol group or terpineol derivative group, soblelol group or soblelol derivative group, and patchouli alcohol or patchouli alcohol derivative group.

Specific examples of the group having an acid-decomposable group and menthyl group or menthyl derivative group, etc. include groups such as —R—$R^1$ and —C($R^8$)$_2$—R—$R^1$ described in the aforementioned general formulas (u-1), (u-2) or (u-3).

The compounds represented by the general formula (6) may not be restricted to Z-shaped structure or E-shaped structure. When this monomer is homopolymerized or copolymerized, a high molecular compound of this invention can be obtained.

The repeating unit represented by the aforementioned general formulas (u-1), (u-2) or (u-3) may be copolymerized with at least one kind of monomers shown below.

For example, a monomer having a group exhibiting alkali-solubility as it is decomposed by an acid (a solubility-inhibiting group) may be employed. As for the solubility-inhibiting group, the group that can be introduced as $R^1$ into the general formula (m-1), etc. can be employed. In this case, the total quantity of the solubility-inhibiting group in the copolymer should preferably be in the range of 10 mole % to 70 mole %. Because if the content of the monomer is less than 10 mole %, it would be impossible to provide the resist with a sufficient degree of solubility-inhibiting function. On the other hand, if the content of the solubility-inhibiting group is more than 70 mole %, the resolution of the photosensitive material would be undesirably lowered. More preferable total quantity of the solubility-inhibiting group is 20 mole % to 60 mole %.

The repeating unit represented by the aforementioned general formulas (u-1), (u-2) or (u-3) may be copolymerized with a monomer having an alkali-soluble group. With regard to the monomer having an alkali-soluble group, it is possible to employ a monomer which itself is capable of being dissolved into alkali or basic solution. Examples of such a monomer are carboxylic acid, sulfonic acid, acid anhydride or a monomer having a phenolic hydroxyl group. These monomers may also contain other functional groups such as ester, alcohol, amine, imide, sulfonimide, amide, etc.

The high molecular compound according to this invention may contain an acrylic acid-based ester monomer, imide monomer, sulfonamide monomer, amide monomer or acryl-based alkylaminosulfonylalkyl ester. For example, the high molecular compound according to this invention may contain methacrylic acid ester monomer, acrylic acid ester monmer, crotonic acid ester monomer and tiglic acid ester monomer.

When the copolymer composition contains an alkali-soluble group, the content of a monomer having the alkali-soluble group should preferably be in the range of 1 mole % to 95 mole % based on the total moles of monomers. Because if the content of the monomer is less than 1 mole %, it may give rise to an insufficient alkali-solubility after a light exposure. On the other hand, if the content of the monomer is more than 95 mole %, the sensitivity of the photosensitive material would be undesirably lowered. A more preferable content of the alkali-soluble group is 1 to 70 mole %.

When the high molecular compound of this invention contains an acrylic acid-based ester monomer, the content of the ester monomer should preferably be in the range of 1 mole % to 80 mole % based on the total moles of monomers. Because if the content of the ester monomer falls outside this range, the resolution of the photosensitive composition would be deteriorated. A more preferable content of the methacrylic acid-based ester monomer is 1 to 70 mole %.

The high molecular compound of this invention may contain, as a copolymer component, a monomer containing a group having an aliphatic monocyclic skeleton or an aliphatic fused cyclic skeleton, or a monomer containing a group having a terpenoid skeleton. In this case, the content of these monomers should preferably be in the range of 10 mole % to 95 mole % based on the total moles of monomers in the copolymer. Because if the content of the monomers is less than 10 mole %, the dry etching resistance of pattern would be deteriorated. On the other hand, if the content of the monomers is more than 95 mole %, the resolution and sensitivity of the photosensitive composition would be undesirably deteriorated. A more preferable content of the monomers is 15 to 80 mole %.

The high molecular compound of this invention may contain 5 to 50% of a repeating unit having an aromatic ring. In particular, when a copolymer is formulated using a repeating unit having naphthalene or a derivative thereof, it would be possible to improve the light transmittance of the photosensitive composition to a light of 193 nm in wavelength. Examples of such a repeating unit are those represented by the following general formula (u-4).

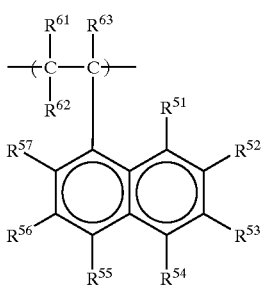

(u-4)

wherein $R^{51}$ to $R^{57}$ and $R^{61}$ to $R^{63}$ may be the same or different from each other and are individually hydrogen atom, halogen atom or monovalent organic group.

Examples of the monovalent organic group to be introduced as $R^{51}$ to $R^{57}$ and $R^{61}$ to $R^{63}$ are hydrocarbon group, pentacycloalkyl group, tetracycloalkyl group, tricycloalkyl group, bicycloalkyl group, heterocycloalkyl group and a group containing terpenoid skeleton. Specific examples of such an organic group are phenyl, naphthyl, methyl, ethyl, propyl, butyl, pentyl, hexyl, heptyl, octyl, nonyl, decanyl, undecanyl, dodecanyl, cyclohexyl, tricyclo[3.3.1.1$^{3,7}$] decanyl, cyclopentyl, cycloheptyl, cyclooctyl, cyclononyl, cyclodecanyl, tricyclodecanyl, 2-methyl-tricyclo[3.3.1.1$^{3,7}$] decanyl, androst-4-en-3,11,17-trion-yl, 21-acetoxypregnan-11,20-dion-3-yl, pregnan-11,20-dion-3-yl, cholest-4-en-3-yl, 17,21-dihydroxy-5α-pregnan-11,20-dion-3-yl, 3,17-dihydroxy-5α-pregnan-11,20-dion-21-yl, bicyclo[4,4,0] decanyl, etioallocholanyl, 3-hydroxy-androstan-17-yl, hydroxyandrostanyl, 1-1'-oxoethyl-3-methoxy-4-phenyl, benzofuranyl, benzothiazolyl, 3-hydroxyestro-4-en-17-yl, hydroxyestro-4-enyl, 1,4-androstadien-3-on-17-yl, 1,7,7-trimethylbicyclo[2,2,1]heptan-2-yl, 1,7,7-trimethylbicyclo [2,2,1]heptan-2-on-3-yl, 24-R-elgost-5-en-3-yl, 4,7,7-trimethyl-3-oxobicyclo[2,2,1]heptan-2-yl, sebadinyl, cevinyl, crydonynyl, 3,7-dihydroxyfuranyl, 3-hyroxycholanyl, 7-hydroxycholanyl, cholanyl, cholestanyl, 3-cholestanyl, cholestoralyl, 3,7,12-trihydroxy-5β-cholan-24-yl, stigmasta-7,22-dien-3-yl, clostevolyl, cortichsteronyl, cortisonyl, cortryl, cortronyl, cyclohexylcarbynyl, 7-dehydrocholesteryl, 3,7,12-trioxofuran-24-yl, pregn-4-en-3,11,20-trion-21-yl, 1,3-cyclohexanedion-5-yl, ergostanyl, ergost-7-en-3-yl, pentadecanyl, hexadecanyl, heptadecanyl, octadecanyl, nonadecanyl, oxacyclohexadecan-2-on-3-yl, hydroxycholesterol-3-yl, 4-hydroxy-estro-4-en-3-on-17-yl, exo-1,7,7-trimethylbicyclo[2,2,1]heptan-2-yl, ketoprogesteronyl, lupininyl, novobunololyl, 6-methylpregn-4-en-3,20-dion-11-yl, (1α,2β,5α)-5-methyl-2-(1-methylethyl)-cyclohexyl, (1α,2β,5α)-5-methyl-2-(1-hydroxy-1-methylethyl)-cyclohexyl, norcholanyl, dihydro-4H-dimethyl-2(3H)-furanon-3-yl, pinen-yl, pulegon-6-yl, cyclodecanon-2-yl, 1,2-cyclodecanedion-3-yl, (3β,5α)-stigmastan-3-yl, α-hydroxy-α,α,4-trimethyl-3-cyclohexen-5-yl, solanid-5-en-3-yl, (3β,22E)-stigmasta-5,22-dien-3-yl, taraxasteryl, and taraxeryl.

In the aforementioned general formula (u-4), all of $R^{51}$ to $R^{57}$ should most preferably be constituted by hydrogen atom. As for $R^{61}$ to $R^{63}$, most preferable examples of them are hydrogen atom, chloro group, fluoro group, bromo group, iodyl group, methyl group, ethyl group, tricyclo [3.3.1.1$^{3,7}$]decanyl, naphthyl, tricyclodecanyl, cholanyl and cholestanyl.

The high molecular compound of this invention may contain a succinic anhydride unit represented by the following chemical formula (7).

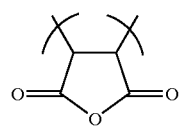

(7)

If the high molecular compound of this invention contains this succinic anhydride unit, the alkali-solubility of the high molecular compound can be enhanced.

If the repeating units represented by the aforementioned general formulas (u-1), (u-2) and (u-3) are to be copolymerized with a structure unit of other kinds as mentioned above, these repeating units should preferably be included in a resultant copolymer at a ratio of at least 5 mole % or more. If the content of these repeating units is less than 5 mole %, the ratio of the acid-decomposable group bonded to a group having an alicyclic skeleton becomes too small, so that it would become difficult to expect a sufficient effect of this invention.

The high molecular compound of this invention should preferably have a softening point of 20° C. or more, and an average molecular weight of 500 to 900,000. If the softening point of the high molecular compound is less than 20° C., the acid generated from the photo-acid-generating agent by the irradiation of actinic radiation may excessively diffuse into the layer of resist in the baking treatment, thereby possibly causing the lowering of resolution of the resist after being patterned.

On the other hand, if the molecular weight of the polymer is too high, the crosslinking reaction of the copolymer may be promoted when the resist composition is irradiated with an electron radiation and baked after the irradiation of electron radiation, thereby giving rise to the deterioration of image quality or sensitivity of the resist if the resist is of positive type.

The mixing ratio of the high molecular compound to be included as a base resin component in a photosensitive composition of this invention may be optionally determined by taking the dry-etching resistance, sensitivity, resolution and contrast into consideration. Generally, the mixing ratio of the high molecular compound is in the range of 5 to 80 mole % based on the entire resin composition.

The photosensitive composition of this invention can be employed as a chemically amplified resist by incorporating a photo-acid generating agent into the aforementioned high molecular compound. The photo-acid generating agent is a compound which is capable of generating an acid upon being irradiated with an actinic radiation. Examples of such a photo-acid generating agent are an aryl onium salt, a naphthoquinone diazide compound, a diazonium salt, a sulfonate compound, a sulfonium compound and a sulfonyl diazomethane compound.

Specific examples of the photo-acid generating agent are triphenylsulfonium triflate, diphenyliodonium triflate, 2,3,4,4-tetrahydroxybenzophenone-4-naphthoquinonediazide sulfonate, 4-N-phenylamino-2-methoxyphenyldiazonium sulfate, 4-N-phenylamino-2-methoxyphenyldiazonium p-ethylphenylsulfate, 4-N-phenylamino-2-methoxyphenyldiazonium 2-naphthylsulfate, 4-N-phenylamino-2-methoxyphenyldiazonium phenylsulfate, 2,5-diethoxy-4-N-4'-methoxyphenylcarbonylphenyldiazonium 3-carboxy-4-hydroxyphenylsulfate, 2-methoxy-4-N-phenylphenyldiazonium 3-carboxy-4-hydroxyphenylsulfate, diphenylsulfonylmethane, diphenylsulfonyldiazomethane, diphenyldisulfone, α-methylbenzoin tosylate, pyrogallol trimethylate and benzoin tosylate.

When a photo-acid generating agent having a naphthalene skeleton is employed, a conjugated system would be increased in the photosensitive composition so that it is possible to preferably improve the light transmittance of the photosensitive composition to a light of 193 nm in wavelength.

Examples of such a photo-acid generating agent having a naphthalene skeleton are sulfonyl or sulfonate compounds having a cyclic group such as naphthalene, pentalene, indene, azulene, heptalene, biphenylene, as-indacene, s-indacene, acenaphthalene, fluolene, phenalene, phenanthrene, anthracene, fluoranthene, acephenanthrylene, aceanthrylene, triphenylene, pyrene, chrysene, naphtacene, pleiadene, picene, perylene, pentaphene, pentacene, tetraphenylene, hexaphene, hexacene, rubicene, coronene, trinaphthylene, heptaphene, heptacene, pyranthrene, ovalene, dibenzophenanthrene, benz[a]anthracene, benzo[a,j]anthracene, indeno[1,2-a]indene, anthra[2,1-a]naphthacene or 1H-benzo[a]cyclopent[j]anthracene ring; 4-quinone diazide compounds having a cyclic group and a hydroxyl compound attached to the cyclic group, examples of the cyclic group being naphthalene, pentalene, indene, azulene, heptalene, biphenylene, as-indacene, s-indacene, acenaphthalene, fluolene, phenalene, phenanthrene, anthracene, fluoranthene, acephenanthrylene, aceanthrylene, triphenylene, pyrene, chrysene, naphtacene, pleiadene, picene, perylene, pentaphene, pentacene, tetraphenylene, hexaphene, hexacene, rubicene, coronene, trinaphthylene, heptaphene, heptacene, pyranthrene, ovalene, dibenzophenanthrene, benz[a]anthracene, benzo[a,j]anthracene, indeno[1,2-a]indene, anthra[2,1-a]naphthacene or 1H-benzo[a]cyclopent[j]anthracene ring; and a salt to be derived from the reaction between a triflate and sulfonium or iodonium having, as a side chain, naphthalene, pentalene, indene, azulene, heptalene, biphenylene, as-indacene, s-indacene, acenaphthalene, fluolene, phenalene, phenanthrene, anthracene, fluoranthene, acephenanthrylene, aceanthrylene, triphenylene, pyrene, chrysene, naphtacene, pleiadene, picene, perylene, pentaphene, pentacene, tetraphenylene, hexaphene, hexacene, rubicene, coronene, trinaphthylene, heptaphene, heptacene, pyranthrene, ovalene, dibenzophenanthrene, benz[a]anthracene, benzo[a,j]anthracene, indeno[1,2-a]indene, anthra[2,1-a]naphthacene or 1H-benzo[a]cyclopent[j]anthracene ring.

Particularly preferred among them are sulfonyl or sulfonate having a naphthalene ring or anthracene ring; 4-quinone diazide compounds having a hydroxyl compound attached to naphthalene or anthracene; and a salt to be derived from the reaction between a triflate and sulfonium or iodonium having naphthalene side chain or anthracene side chain. Specifically, trinaphthyl sulfonium triflate, dinaphthyl iodonium triflate, dinaphthyl sulfonylmethane, NAT-105 (CAS.No.[137867-61-9], Midori Kagaku Co., Ltd.), NAI-105 (CAS.No.[85342-62-7], Midori Kagaku Co., Ltd.), TAZ-106 (CAS.No.[69432-40-2], Midori Kagaku Co., Ltd.), NDS-105 (Midori Kagaku Co., Ltd.), CMS-105 (Midori Kagaku Co., Ltd.), DAM-301 (CAS.No.[138529-81-4], Midori Kagaku Co., Ltd.), SI-105 (CAS.No.[34694-40-7], Midori Kagaku Co., Ltd.), NDI-105 (CAS.No. [133710-62-0], Midori Kagaku Co., Ltd.), EPI-105 (CAS.No.[135133-12-9], Midori Kagaku Co., Ltd.) and PI-105 (CAS.No.[41580-58-9], Midori Kagaku Co., Ltd.) are preferred.

Preferred in particular among them are trinaphthyl sulfonium triflate, dinaphthyl iodonium triflate, dinaphthyl sulfonylmethane, NAT-105 (CAS.No.[137867-61-9], Midori Kagaku Co., Ltd.) and NAI-105 (CAS.No.[85342-62-7], Midori Kagaku Co., Ltd.).

The mixing ratio of these photo-acid generating agents in the photosensitive composition of this invention should preferably be in the range of 0.001 mole % to 50 mole % based on the entire quantity of base resin. Because if the mixing ratio of these photo-acid generating agents is less than 0.001 mole %, it would be impossible to generate a sufficient quantity of acid, thus possibly making it difficult to form a pattern. On the other hand, if the mixing ratio of these photo-acid generating agents is more than 50 mole %, the resolution and sensitivity of the photosensitive composition would be undesirably deteriorated. A more preferable mixing ratio of these photo-acid generating agents is 0.01 mole % to 40 mole % based on the entire quantity of base resin.

The photosensitive composition of this invention may contain the following compounds in addition to the aforementioned components.

For example, a compound having a group containing an aromatic ring may be employed. The mixing ratio of such a compound may be in the range of 5 to 80%. As for the aromatic ring, a compound having naphthalene or a derivative thereof would be preferably employed. It is possible, by the inclusion of such a compound instead of a compound having benzene ring, to improve the light transmittance of the photosensitive composition to a light of around 193 nm in wavelength.

The photosensitive composition of this invention may also contain a compound having a group which is capable of exhibiting alkali-solubility as it is decomposed by an acid and/or a compound having an alkali-soluble group. Examples of such a compound may be the same as exemplified with reference to the aforementioned solubility-inhibiting group.

The photosensitive composition of this invention may also contain 5 to 80% of a succinic anhydride represented by the aforementioned general formula (7) so as to improve the alkali-solubility of the photosensitive composition.

In addition to the aforementioned components, the photosensitive composition of this invention may also contain as an additive a compound represented by the following general formula (8).

$$R^{31}-X^{31}-R^{32} \tag{8}$$

wherein $R^{31}$ is hydrogen atom, halogen atom or monovalent organic group; $X^{31}$ is a bivalent organic group having a heteroatom; and $R^{32}$ is a group having an alicyclic skeleton.

Examples of the monovalent organic group to be introduced as $R^{31}$ are hydrocarbon group, pentacycloalkyl group, tetracycloalkyl group, tricycloalkyl group, bicycloalkyl group, heterocycloalkyl group and a group containing terpenoid skeleton.

Namely, the same kinds of monovalent organic group that have been exemplified with reference to $R^2$ in the aforementioned general formula (m-1), etc. can be introduced as $R^{31}$ into the general formula (8).

Among these groups, most preferable examples of $R^{31}$ are hydrogen atom, chloro group, fluoro group, methyl group, ethyl group, tricyclo[3.3.1.1$^{3,7}$]decanyl, naphthyl, tricyclodecanyl, menthyl, tricyclo[5.2.1.0$^{2,6}$]decanyl, tetracyclo[6.2.1.1$^{3,6}$.0$^{2,7}$]dodecanyl, cholanyl and cholestanyl.

Specific examples of bivalent organic group containing a heteroatom that can be introduced as $X^{31}$ into the general formula (8) are >C=O, —C(=O)O—, —C(=O)NR$^{33}$—, —SO$_2$—, —S(=O)$_2$NR$^{33}$—, —O—, —OC(=O)—, and —OCH$_2$C(=O)—. Most preferable examples of $X^{31}$ among them in view of decomposability thereof by an acid are —C(=O)O—. The $R^{33}$ is hydrogen atom, halogen atom or a hydrocarbon group such as cyclohexyl, benzyl, naphthyl, phenyl, methyl, ethyl, propyl, butyl, cyclohexylmethyl, isopropyl, allyl and propargyl.

The $R^{32}$ in the aforementioned general formula (8) is a group comprising an alicyclic skeleton. This alicyclic skeleton may be a monocyclic skeleton, a polycyclic skeleton or a heterocyclic skeleton. For example, this alicyclic skeleton may be selected from cyclopentyl, cyclohexyl, cycloheptyl, cyclooctyl, cyclononyl and cyclodecanyl. Further, this alicyclic skeleton may be a heterocyclic or fused ring skeleton. More specifically, the same kinds of group that have been exemplified with reference to R in the aforementioned general formula (m-1), etc. may be introduced into the general formula (8).

Further the $R^{32}$ may contain the group other than the alicyclic group. For example, groups such as —R—R$^1$ and —C(R$^8$)$_2$—R—R$^1$ described in the aforementioned general formulas (u-1), (u-2) or (u-3) may be introduced as $R^{32}$ in the general formula (8).

Examples of most preferable alicyclic skeleton are monocyclic or di- to decacyclic skeleton containing at least one kind of atom selected from the group consisting of carbon atom, oxygen atom, nitrogen atom and sulfur atom, the total number of the atoms being 3 to 100, and having 0 to 50 unsaturated bonds.

Specific examples of $R^{32}$ comprising the aforementioned alicyclic skeleton are 2-2'-hydroxy-4'-methyl-cyclohexyl-2-propyl, 2-tricyclo[3.3.1.1$^{3',7'}$]decanyl-2-propyl, 2-tricyclo[5.2.1.0$^{2',6'}$]decanyl-2-propyl, 2-tetracyclo[6.2.1.1$^{3',6'}$.0$^{2',7'}$]dodecanyl-2-propyl, (β-methyl-δ-valerolacton-3-yl) 3-methyl-oxacyclohexan-2-on-3-yl, 3-oxocyclohexyl, 1-methyl-3-oxocyclohexyl, 3-oxocyclopentyl, 3-oxocycloheptyl, 3-oxocyclooctyl, 3-oxocyclononyl, 3-oxocyclodecanyl, methyltricyclo[3.3.1.1$^{3,7}$]decanyl, ethyltricyclo[3.3.1.1$^{3,7}$]decanyl, propyltricyclo[3.3.1.1$^{3,7}$] decanyl, butyltricyclo[3.3.1.1$^{3,7}$]decanyl, pentyltricyclo [3.3.1.1$^{3,7}$]decanyl, hexyltricyclo[3.3.1.1$^{3,7}$]decanyl, heptyltricyclo[3.3.1.1$^{3,7}$]decanyl, octyltricyclo[3.3.1.1$^{3,7}$] decanyl, nonyltricyclo[3.3.1.1$^{3,7}$]decanyl, decanyltricyclo [3.3.1.1$^{3,7}$]decanyl, methyltricyclo[5.2.1.0$^{2,6}$]decanyl, ethyltricyclo[5.2.1.0$^{2,6}$]decanyl, propyltricyclo[5.2.1.0$^{2,6}$] decanyl, butyltricyclo[5.2.1.0$^{2,6}$]decanyl, pentyltricyclo [5.2.1.0$^{2,6}$]decanyl, hexyltricyclo[5.2.1.0$^{2,6}$]decanyl, heptyltricyclo[5.2.1.0$^{2,6}$]decanyl, octyltricyclo[5.2.1.0$^{2,6}$] decanyl, nonyltricyclo[5.2.1.0$^{2,6}$]decanyl, decanyltricyclo [5.2.1.0$^{2,6}$]decanyl, methyltetracyclo[6.2.1.1$^{3,6}$.0$^{2,7}$] dodecanyl, ethyltetracyclo[6.2.1.1$^{3,6}$.0$^{2,7}$]dodecanyl, propyltetracyclo[6.2.1.1$^{3,6}$.0$^{2,7}$]dodecanyl, butyltetracyclo [6.2.1.1$^{3,6}$.0$^{2,7}$]dodecanyl, pentyltetracyclo[6.2.1.1$^{3,6}$.0$^{2,7}$] dodecanyl, hexyltetracyclo[6.2.1.1$^{3,6}$.0$^{2,7}$]dodecanyl, heptyltetracyclo[6.2.1.1$^{3,6}$.0$^{2,7}$]dodecanyl, octyltetracyclo [6.2.1.1$^{3,6}$.0$^{2,7}$]dodecanyl, nonyltetracyclo[6.2.1.1$^{3,6}$.0$^{2,7}$] dodecanyl, decanyltetracyclo[6.2.1.1$^{3,6}$.0$^{2,7}$]dodecanyl, hydroxymethyldimethylcyclohexyl, 2'-methoxy-4'-methyl-1,1-dimethylcyclohexyl, 1-2'-acetoxy-4'-methyl-cyclohexyl-1-methylethyl, 1-2'-t-butoxy-4'-methyl-cyclohexyl-1-methylethyl, 1-2'-t-butyldimethylsiloxy-4'-methyl-cyclohexyl-1-methylethyl, 1-2'-thexyldimethylsiloxy-4'-methyl-cyclohexyl-1-methylethyl, 1-2'-2"-methoxyethoxy-4'-methyl-cyclohexyl-1-methylethyl, 1-2'-2"-ethoxyethoxy-4'-methyl-cyclohexyl-1-methylethyl, 1-2'-2",2",2"-trichloroethoxy-4'-methyl-cyclohexyl-1-methylethyl, 1-2'-trimethylsiloxy-4'-methyl-cyclohexyl-1-methylethyl, 1-2'-triethylsiloxy-4'-methyl-cyclohexyl-1-methylethyl, 1-2'-triisopropylsiloxy-4'-methyl-cyclohexyl-1-methylethyl, 1-2'-tetrahydropyranyloxy-4'-methyl-cyclohexyl-1-methylethyl, 1-2'-tetrahydrothiopyranyloxy-4'-methyl-cyclohexyl-1-methylethyl, 1-2'-tetrahydrofuranyloxy-4'-methyl-cyclohexyl-1-methylethyl, 1-2'-tetrahydrothiofuranyloxy-4'-methyl-cyclohexyl-1-methylethyl, 1-2'-dimethylisopropylsiloxy-4'-methyl-cyclohexyl-1-methylethyl, 1-2'-t-butoxycarbonylmethoxy-4'-methyl-cyclohexyl-1-methylethyl, 1-2'-t-butoxycarbonyloxy-4'-methyl-cyclohexyl-1-methylethyl, 1-methyl-3-oxocyclopentyl, 1-methyl-3-oxocycloheptyl, 1-methyl-3-oxocyclooctyl, 1-methyl-3-oxocyclononyl, 1-methyl-3-oxocyclodecanyl, 1-ethyl-3-oxocyclopentyl, 1-ethyl-3-oxocyclohexyl, 1-ethyl-3-oxocycloheptyl, 1-ethyl-3-oxocyclooctyl, 1-ethyl-3-oxocyclononyl, 1-ethyl-3-oxocyclodecanyl, 1-propyl-3-oxocyclopentyl, 1-propyl-3-oxocyclohexyl, 1-propyl-3-oxocycloheptyl, 1-propyl-3-oxocyclooctyl, 1-propyl-3-oxocyclononyl, 1-propyl-3-oxocyclodecanyl, 1-butyl-3-oxocyclopentyl, 1-butyl-3-oxocyclohexyl, 1-butyl-3-oxocycloheptyl, 1-butyl-3-oxocyclooctyl, 1-butyl-3-oxocyclononyl, 1-butyl-3-oxocyclodecanyl, 1-pentyl-3-oxocyclopentyl, 1-pentyl-3-oxocyclohexyl, 1-pentyl-3-oxocycloheptyl, 1-pentyl-3-oxocyclooctyl, 1-pentyl-3-oxocyclononyl, 1-pentyl-3-oxocyclodecanyl, β-methyl-γ-butyrolacton-3-yl, β-methyl-ε-caprolacton-3-yl, β-ethyl-γ-butyrolacton-3-yl, β-ethyl-δ-valerolacton-3-yl, β-ethyl-ε-caprolacton-3-yl, β-propyl-γ-butyrolacton-3-yl, β-propyl-δ-valerolacton-3-yl, β-propyl-ε-caprolacton-3-yl, β-butyl-γ-butyrolacton-3-yl, β-butyl-δ-valerolacton-3-yl, β-butyl-ε-caprolacton-3-yl, β-pentyl-γ-butyrolacton-3-yl, β-pentyl-δ-valerolacton-3-yl, β-pentyl-ε-caprolacton-3-yl, β-hexyl-γ-butyrolacton-3-yl, β-hexyl-δ-valerolacton-3-yl, β-hexyl-ε-caprolacton-3-yl, 3-methyl-oxacyclopentan-2-on-3-yl, 3-methyl-oxacycloheptan-2-on-3-yl, 3-ethyl-oxacyclopentan-2-on-3-yl, 3-ethyl-oxacyclohexan-2-on-3-yl, 3-ethyl-oxacycloheptan-2-on-3-yl, 3-propyl-oxacyclopentan-2-on-3-yl, 3-propyl-oxacyclohexan-2-on-3-yl, 3-propyl-oxacycloheptan-2-on-3-yl, 3-butyl-oxacyclopentan-2-on-3-yl, 3-butyl-oxacyclohexan-2-on-3-yl, 3-butyl-oxacycloheptan-2-on-3-yl, 3-pentyl-oxacyclopentan-2-on-3-yl, 3-pentyl-oxacyclohexan-2-on-3-yl, 3-pentyl-oxacycloheptan-2-on-3-yl, 3-hexyl-oxacyclopentan-2-on-3-yl, 3-hexyl-oxacyclohexan-2-on-3-yl, 3-hexyl-oxacycloheptan-2-on-3-yl, 4'-methyl-1,1-dimethyl-3-cyclohexenyl, 3,21-dihydroxy-5 α-pregnan-11,20-dion-17-yl, 17-(2-propenyl) estro-4-en-17-yl, 17-(2-propenyl)estra-4,9,11-trien-17-yl, 6-methylpregn-4-en-20-on-17-yl, 17-methylandrostano[3,2-C]isoxazol-17-yl, α,α-diphenyl-4-piperidine methyl, α,α- dinaphthyl-4-piperidine methyl, 7,17-dimethylandrost-4-en-3-on-17-yl, 1,7,7-trimethylbicyclo[2.2.1]heptan-2-yl, 1,7,7-trimethylbicyclo[2.2.1]heptan-2-on-3-yl, 7,17-dimethylandrost-4-en-3-on-17-yl, 1,3-cyclohexanedion-5-yl, stigmasta-5,24-dien-3-yl, 9-fluoro-11-hydroxy-17-methylandrost-4-en-3-on-17-yl, octahydro-4,8a-dimethyl-4a(2H)-naphthalenyl, hydroxycholesterol-24-yl, exo-1,7,7-trimethylbicyclo[2.2.1]heptan-2-yl, 6α-6-methylpregn-4-en-3,20-dion-17-yl, 1-2'-oxo-4'-methyl-cyclohexyl-1-methylethyl, estro-4-en-3-on-17-yl, 3-ethyl-18,19-dinorpregn-4-en-3-on-17-yl, 19-norpregn-4-en-3-on-17-yl, 19-norpregn-4-en-20-in-3-on-17-yl, 19-norpregn-5(10)-en-20-in-3-on-17-yl, 17-methyl-2-oxaandrostan-3-on-17-yl, 4-hydroxy-17-methylandrost-4-en-3-on-17-yl, dihydro-4H-dimethyl-2(3H)-furanon-3-yl, 5-hydroxy-α,α,4-trimethyl-3-cyclohexene-1-methyl, α,α,4-trimethyl-3-cyclohexene-1-methyl, patchoulyl, α,α,4-trimethylcyclohexanemethan-4-yl, 1,4'-hydroxy-4'-methyl-cyclohexyl-1-methylethyl and tetrahydrofurfuryl.

As for other kinds of $R^{32}$ comprising an alicyclic skeleton of five-, six-, seven-, eight-, nine- and ten-membered ring, the groups exemplified as R in the aforementioned general formula (m-1) may be employed.

The atom of the substituent group $R^{32}$ which is directly bonded to the $X^{31}$ in the aforementioned general formula (8) should preferably be a tertiary carbon atom. Because, if a primary carbon atom or a secondary carbon atom is directly bonded to the $X^{31}$, the removal of substituent group $R^{32}$ by an acid can be hardly effected, thus making it difficult to form a pattern.

Examples of most preferable $R^{32}$ are
2-methyl-2-tricyclo[$3.3.1.1^{3,7}$]decanyl,
2-ethyl-2-tricyclo[$3.3.1.1^{3,7}$]decanyl,
2-propyl-2-tricyclo[$3.3.1.1^{3,7}$]decanyl,
2-butyl-2-tricyclo[$3.3.1.1^{3,7}$]decanyl,
2-pentyl-2-tricyclo[$3.3.1.1^{3,7}$]decanyl,
2-hexyl-2-tricyclo[$3.3.1.1^{3,7}$]decanyl,
2-heptyl-2-tricyclo[$3.3.1.1^{3,7}$]decanyl,
2-octyl-2-tricyclo[$3.3.1.1^{3,7}$]decanyl,
2-nonyl-2-tricyclo[$3.3.1.1^{3,7}$]decanyl,
2-decanyl-2-tricyclo[$3.3.1.1^{3,7}$]decanyl,
2-2'-hydroxy-4'-methyl-cyclohexyl-2-propyl,
2-tricyclo[$3.3.1.1^{3,7}$]decanyl-2-propyl,
2-tricyclo[$5.2.1.0^{2,6}$]decanyl-2-propyl,
2-tetracyclo[$6.2.1.1^{3,6}.0^{2,7}$]dodecanyl-2-propyl,
methyltricyclo[$3.3.1.1^{3,7}$]decanyl,
ethyltricyclo[$3.3.1.1^{3,7}$]decanyl,
propyltricyclo[$3.3.1.1^{3,7}$]decanyl,
butyltricyclo[$3.3.1.1^{3,7}$]decanyl,
pentyltricyclo[$3.3.1.1^{3,7}$]decanyl,
hexyltricyclo [$3.3.1.1^{3,7}$]decanyl,
heptyltricyclo[$3.3.1.1^{3,7}$]decanyl,
octyltricyclo[$3.3.1.1^{3,7}$]decanyl,
nonyltricyclo[$3.3.1.1^{3,7}$]decanyl,
decanyltricyclo[$3.3.1.1^{3,7}$]decanyl,
methyltricyclo[$5.2.1.0^{2,6}$]decanyl,
ethyltricyclo[$5.2.1.0^{2,6}$]decanyl,
propyltricyclo[$5.2.1.0^{2,6}$]decanyl,
butyltricyclo[$5.2.1.0^{2,6}$]decanyl,
pentyltricyclo[$5.2.1.0^{2,6}$]decanyl,
hexyltricyclo[$5.2.1.0^{2,6}$]decanyl,
heptyltricyclo[$5.2.1.0^{2,6}$]decanyl,
octyltricyclo[$5.2.1.0^{2,6}$]decanyl,
nonyltricyclo[$5.2.1.0^{2,6}$]decanyl,
decanyltricyclo[$5.2.1.0^{2,6}$]decanyl,
methyltetracyclo[$6.2.1.1^{3,6}.0^{2,7}$]dodecanyl,
ethyltetracyclo[$6.2.1.1^{3,6}.0^{2,7}$]dodecanyl,
propyltetracyclo[$6.2.1.1^{3,6}.0^{2,7}$]dodecanyl,
butyltetracyclo[$6.2.1.1^{3,6}.0^{2,7}$]dodecanyl,
pentyltetracyclo[$6.2.1.1^{3,6}.0^{2,7}$]dodecanyl,
hexyltetracyclo[$6.2.1.1^{3,6}.0^{2,7}$]dodecanyl,
heptyltetracyclom[$6.2.1.1^{3,6}.0^{2,7}$]dodecanyl,
octyltetracyclo[$6.2.1.1^{3,6}.0^{2,7}$]dodecanyl,
nonyltetracyclo[$6.2.1.1^{3,6}.0^{2,7}$]dodecanyl,
decanyltetracyclo[$6.2.1.1^{3,6}.0^{2,7}$]dodecanyl,
2-methyl-2-cyclohexyl, 2-methyl-2-cyclopentyl,
2-methyl-2-cyclooctyl, 2-methyl-2-cyclononyl,
2-methyl-2-cyclodecanyl,
1-2'-hydroxy-4'-methyl-cyclohexyl-1-methylethyl,
1-2'-acetoxy-4'-methyl-cyclohexyl-1-methylethyl,
1-2'-tetrahydropyranyloxy-4'-methyl-cyclohexyl-1-methylethyl,
1-2'-tetrahydrofuranyloxy-4'-methyl-cyclohexyl-1-methylethyl,
1-2'-t-butyldimethylsiloxy-4'-methyl-cyclohexyl-1-methylethyl,
1-2'-2'-methoxyethoxy-4'-methyl-cyclohexyl-1-methyl ethyl,
1-2'-2"-ethoxyethoxy-4'-methyl-cyclohexyl-1-methylethyl,
1-2'-t-butoxycarbonylmethoxy-4'-methyl-cyclohexyl-1-methylethyl,
1-2'-t-butoxycarbonyloxy-4'-methyl-cyclohexyl-1-methylethyl,
1-4'-hydroxy-4'-methyl-cyclohexyl-1-methylethyl,
1-4'-acetoxy-4'-methyl-cyclohexyl-1-methylethyl,
1-4'-tetrahydropyranyloxy-4'-methyl-cyclohexyl-1-methylethyl,
1-4'-tetrahydrofuranyloxy-4'-methyl-cyclohexyl-1-methylethyl,
1-4'-t-butyldimethylsiloxy-4'-methyl-cyclohexyl-1-methylethyl,
1-4'-2"-methoxyethoxy-4'-methyl-cyclohexyl-1-methylethyl,
1-4'-2"-ethoxyethoxy-4'-methyl-cyclohexyl-1-methylethyl,
1-4'-t-butoxycarbonylmethoxy-4'-methyl-cyclohexyl-1-methylethyl,
1-4'-t-butoxycarbonyloxy-4'-methyl-cyclohexyl-1-methylethyl,
3-methyl-δ-valerolactone-3-yl,
3-methyl-oxacyclohexan-2-on-3-yl,
3-ethyl-δ-valerolactone-3-yl,
3-ethyl-oxacyclohexan-2-on-3-yl,
3-propyl-δ-valerolactone-3-yl,
3-propyl-oxacyclohexan-2-on-3-yl,
3-butyl-δ-valerolactone-3-yl,
3-butyl-oxacyclohexan-2-on-3-yl,
1-methyl-3-oxocyclopentyl, 1-methyl-3-oxocyclohexyl,
1-methyl-3-oxocycloheptyl, 1-methyl-3-oxocyclooctyl,
1-methyl-3-oxocyclononyl, 1-methyl-3-oxocyclodecanyl,
1-ethyl-3-oxocyclopentyl, 1-ethyl-3-oxocyclohexyl,
1-ethyl-3-oxocycloheptyl, 1-ethyl-3-oxocyclooctyl,
1-ethyl-3-oxocyclononyl, 1-ethyl-3-oxocyclodecanyl,
1-propyl-3-oxocyclopentyl, 1-propyl-3-oxocyclohexyl,
1-propyl-3-oxocycloheptyl, 1-propyl-3-oxocyclooctyl,
1-propyl-3-oxocyclononyl, 1-propyl-3-oxocyclodecanyl,
1-butyl-3-oxocyclopentyl, 1-butyl-3-oxocyclohexyl,
1-butyl-3-oxocycloheptyl, 1-butyl-3-oxocyclooctyl,
1-butyl-3-oxocyclononyl, 1-butyl-3-oxocyclodecanyl and patchoulyl.

As for the compound represented by the aforementioned general formula (8) comprising $R^{31}$, $X^{31}$ and $R^{32}$, a compound wherein a phenolic compound is converted into an ether can be employed, the specific examples of the ether being methylcyclohexylcarbonyl ether, methylcyclohexyl ether, methoxymethylcyclohexyl ether, methylthiomethylcyclohexyl ether, t-butylthiomethylcyclohexyl ether, t-butoxymethylcyclohexyl ether, 4-pentenyloxymethylcyclohexyl ether, t-butyldimethylsiloxymethylcyclohexyl ether, thexyldimethylsiloxymethylcyclohexyl ether, 2-methoxyethoxymethylcyclohexyl ether, 2,2,2-trichloroethoxymethylcyclohexyl ether, bis-2'-chloroethoxy-methylcyclohexyl ether, 2'-trimethylsilylethoxymethylcyclohexyl ether, 2'-triethylsilylethoxymethylcyclohexyl ether, 2'-triisopylsilylethoxymethylcyclohexyl ether, 2'-t-butyldimethylsilylethoxymethylcyclohexyl ether, tetrahydropyranylcyclohexyl ether, tetrahydrothiopyranylcyclohexyl ether, 3-bromotetrahydropyranylcyclohexyl ether, 1-methoxycyclohexylcyclohexyl ether, 4-methoxytetrahydropyranylcyclohexyl ether, 4-methoxytetrahydrothiopyranylcyclohexyl ether, 4-methoxytetrahydrothiopyranylcyclohexyl ether-S,S-dioxide, 1,4-dioxan-2-ylcyclohexyl ether, tetrahydrofuranylcyclohexyl ether, tetrahydrothiofuranylcyclohexyl ether, 2,3,3a,4,5,6,7,7a-octahydro-7,8,8-trimethyl-4,7-methanobenzofuran-2-ylcyclohexyl ether, 1-ethoxyethylcyclohexyl ether, 1-2'-chloroethoxyethylcyclohexyl ether, methyl-1-methoxyethylcyclohexyl ether, 2,2,2-trichloroethylcyclohexyl ether, $^2$-trimethylsilylethylcyclohexyl ether, t-butylcyclohexyl ether, allylcyclohexyl ether, 4,4',4"-tris-4',5'-dichlorophthalimidephenyl-methylcyclohexyl ether, 4,4',4"-tris-4',5'-dibromophthalimidephenyl-methylcyclohexyl ether, 4,4',4"-tris-4',5'-iodophthalimidephenyl-methylcyclohexyl ether, 9-anthlylcyclohexyl ether, 9-9'-phenyl-10'-oxo-anthlylcyclohexyl ether (tritironcyclohexyl ether), 1,3-benzodithiolan-2-ylcyclohexyl ether, benzisothiazolyl-S,S-dioxidecyclohexyl ether, trimethylsilylcyclohexyl ether, triethylsilylcyclohexyl ether, triisopropylsilylcyclohexyl ether, dimethylisopropylsilylcyclohexyl ether, diethylisopropylsilylcyclohexyl ether, dimethylthexylsilylcyclohexyl ether, tetrahydropyranyl ether and t-butyldimethylsilylcyclohexyl ether.

The ether preferably used and represented by the aforementioned general formula (8) is not limited to there specific examples.

In particular, compounds wherein a phenolic compound is protected with cyclohexylcarbonyl group, with methylcyclohexylcarbonylmethyl group or with tetrahydropyranyl group are preferable.

Alternatively, the esters of carboxylic acid can be also employed, examples of the ester being isopropylcyclohexyl ester, 2'-hydroxy-4'-methyl-1,1-dimethylcyclohexyl ester, (β-methyl-δ-valerolacton-3-yl) 3-methyl-oxacyclohexan-2-on-3-yl ester, 3-oxocyclohexyl ester, 1-methyl-3-oxocyclohexyl ester, 3-oxocyclopentyl ester, 3-oxocycloheptyl ester, 3-oxocyclooctyl ester, 3-oxocyclononyl ester, 3-oxocyclodecanyl ester, methyltricyclo[3.3.1.1$^{3,7}$]decanyl ester, ethyltricyclo[3.3.1.1$^{3,7}$]decanyl ester, propyltricyclo[3.3.1.1$^{3,7}$]decanyl ester, butyltricyclo[3.3.1.1$^{3,7}$]decanyl ester, pentyltricyclo[3.3.1.1$^{3,7}$]decanyl ester, hexyltricyclo[3.3.1.1$^{3,7}$]decanyl ester, heptyltricyclo[3.3.1.1$^{3,7}$]decanyl ester, octyltricyclo[3.3.1.1$^{3,7}$]decanyl ester, nonyltricyclo[3.3.1.1$^{3,7}$]decanyl ester, decanyltricyclo[3.3.1.1$^{3,7}$]decanyl ester, methyltricyclo[5.2.1.0$^{2,6}$]decanyl ester, ethyltricyclo[5.2.1.0$^{2,6}$]decanyl ester, propyltricyclo[5.2.1.0$^{2,6}$]decanyl ester, butyltricyclo[5.2.1.0$^{2,6}$]decanyl ester, pentyltricyclo[5.2.1.0$^{2,6}$]decanyl ester, hexyltricyclo[5.2.1.0$^{2,6}$]decanyl ester, heptyltricyclo[5.2.1.0$^{2,6}$]decanyl ester, octyltricyclo[5.2.1.0$^{2,6}$]decanyl ester, nonyltricyclo[5.2.1.0$^{2,6}$]decanyl ester, decanyltricyclo[5.2.1.0$^{2,6}$]decanyl ester, methyltetracyclo[6.2.1.1$^{3,6}$.0$^{2,7}$]dodecanyl ester, ethyltetracyclo[6.2.1.1$^{3,6}$.0$^{2,7}$]dodecanyl ester, propyltetracyclo[6.2.1.1$^{3,6}$.0$^{2,7}$]dodecanyl ester, butyltetracyclo[6.2.1.1$^{3,6}$.0$^{2,7}$]dodecanyl ester, pentyltetracyclo[6.2.1.1$^{3,6}$.0$^{2,7}$]dodecanyl ester, hexyltetracyclo[6.2.1.1$^{3,6}$.0$^{2,7}$]dodecanyl ester, heptyltetracyclo[6.2.1.1$^{3,6}$.0$^{2,7}$]dodecanyl ester, octyltetracyclo[6.2.1.1$^{3,6}$.0$^{2,7}$]dodecanyl ester, nonyltetracyclo[6.2.1.1$^{3,6}$.0$^{2,7}$]dodecanyl ester, decanyltetracyclo[6.2.1.1$^{3,6}$.0$^{2,7}$]dodecanyl ester, hydroxymethyldimethylcyclohexyl ester, 2'-methoxy-4'-methyl-1,1-dimethylcyclohexyl ester, 1-2'-acetoxy-4'-methyl-cyclohexyl-1-methylethyl ester, 1-2'-t-butoxy-4'-methyl-cyclohexyl-1-methylethyl ester, 1-2'-t-butyldimethylsiloxy-4'-methyl-cyclohexyl-1-methylethyl ester, 1-2'-thexyldimethylsiloxy-4'-methyl-cyclohexyl-1-methylethyl ester, 1-2'-2"-methoxyethoxy-4'-methyl-cyclohexyl-1-methylethyl ester, 1-2'-2"-ethoxyethoxy-4'-methyl-cyclohexyl-1-methylethyl ester, 1-2'-2",2",2"-trichloroethoxy-4'-methyl-cyclohexyl-1-methylethyl ester, 1-2'-trimethylsiloxy-4'-methyl-cyclohexyl-1-methylethyl ester, 1-2'-triethylsiloxy-4'-methyl-cyclohexyl-1-methylethyl ester, 1-2'-triisopropylsiloxy-4'-methyl-cyclohexyl-1-methylethyl ester, 1-2'-tetrahydropyranyloxy-4'-methyl-cyclohexyl-1-methylethyl ester, 1-2'-tetrahydrothiopyranyloxy-4'-methyl-cyclohexyl-1-methylethyl ester, 1-2'-tetrahydrofuranyloxy-4'-methyl-cyclohexyl-1-methylethyl ester, 1-2'-tetrahydrothiofuranyloxy-4'-methyl-cyclohexyl-1-methylethyl ester, 1-2'-dimethylisopropylsiloxy-4'-methyl-cyclohexyl-1-methylethyl ester, 1-2'-t-butoxycarbonylmethoxy-4'-methyl-cyclohexyl-1-methylethyl ester, 1-2'-t-butoxycarbonyloxy-4'-methyl-cyclohexyl-1-methylethyl ester, 1-methyl-3-oxocyclopentyl ester, 1-methyl-3-oxocycloheptyl ester, 1-methyl-3-oxocyclooctyl ester, 1-methyl-3-oxocyclononyl ester, 1-methyl-3-oxocyclodecanyl ester, 1-ethyl-3-oxocyclopentyl ester, 1-ethyl-3-oxocyclohexyl ester, 1-ethyl-3-oxocycloheptyl ester, 1-ethyl-3-oxocyclooctyl ester, 1-ethyl-3-oxocyclononyl ester, 1-ethyl-3-oxocyclodecanyl ester, 1-propyl-3-oxocyclopentyl ester, 1-propyl-3-oxocyclohexyl ester, 1-propyl-3-oxocycloheptyl ester, 1-propyl-3-oxocyclooctyl ester, 1-propyl-3-oxocyclononyl ester, 1-propyl-3-oxocyclodecanyl ester, 1-butyl-3-oxocyclopentyl ester, 1-butyl-3-oxocyclohexyl ester, 1-butyl-3-oxocycloheptyl ester, 1-butyl-3-oxocyclooctyl ester, 1-butyl-3-oxocyclononyl ester, 1-butyl-3-oxocyclodecanyl ester, 1-pentyl-3-oxocyclopentyl ester, 1-pentyl-3-oxocyclohexyl ester, 1-pentyl-3-oxocycloheptyl ester, 1-pentyl-3-oxocyclooctyl ester, 1-pentyl-3-oxocyclononyl ester, 1-pentyl-3-oxocyclodecanyl ester, β-methyl-γ-butyrolacton-3-yl ester, β-methyl-ε-caprolacton-3-yl ester, β-ethyl-γ-butyrolacton-3-yl ester, β-ethyl-δ-valerolacton-3-yl ester, β-ethyl-ε-caprolacton-3-yl ester, β-propyl-γ-butyrolacton-3-yl ester, β-propyl-δ-valerolacton-3-yl ester, β-propyl-ε-caprolacton-3-yl ester, β-butyl-γ-butyrolacton-3-yl ester, β-butyl-δ-valerolacton-3-yl ester, β-butyl-ε-caprolacton-3-yl ester, β-pentyl-γ-butyrolacton-3-yl ester, β-pentyl-δ-valerolacton-3-yl ester, β-pentyl-ε-caprolacton-3-yl ester, β-hexyl-γ-butyrolacton-3-yl ester, β-hexyl-δ-valerolacton-3-yl ester, β-hexyl-ε-caprolacton-3-yl ester, 3-methyl-oxacyclopentan-2-on-3-yl ester, 3-methyl-oxacycloheptan-2-on-3-yl ester, 3-ethyl-oxacyclopentan-2-on-3-yl ester, 3-ethyl-oxacyclohexan-2-on-3-yl ester, 3-ethyl-oxacycloheptan-2-on-3-yl ester, 3-propyl-oxacyclopentan-2-on-3-yl ester, 3-propyl-oxacyclohexan-2-on-3-yl ester, 3-propyl-oxacycloheptan-2-on-3-yl ester, 3-butyl-oxacyclopentan-2-on-3-yl ester, 3-butyl-oxacyclohexan-2-on-3-yl ester, 3-butyl-oxacycloheptan-2-on-3-yl ester, 3-pentyl-oxacyclopentan-2-on-3-yl ester, 3-pentyl-oxacyclohexan-2-on-3-yl ester, 3-pentyl-oxacycloheptan-2-on-3-yl ester, 3-hexyl-oxacyclopentan-2-on-3-yl ester, 3-hexyl-oxacyclohexan-2-on-3-yl ester, 3-hexyl-oxacycloheptan-2-on-3-yl ester, 4'-methyl-1,1-dimethyl-3-cyclohexenyl ester, 3,21-dihydroxy-5α-pregnan-11,20-dion-17-yl ester, 17-(2-propenyl)estro-4-en-17-yl ester, 17-(2-propenyl)estra-4,9,11-trien-17-yl ester, 6-methylpregn-4-en-20-on-17-yl ester, 17-methylandrostano[3,2-C]isoxazol-17-yl ester, α,α-diphenyl-4-piperidine methyl ester, α,α-dinaphthyl-4-piperidine methyl ester, 7,17-dimethylandrost-4-en-3-on-17-yl ester, 1,7,7-trimethylbicyclo[2.2.1]heptan-2-yl ester, 1,7,7-trimethylbicyclo[2.2.1]heptan-2-on-3-yl ester, 7,17-dimethylandrost-4-en-3-on-17-yl ester, 1,3-cyclohexanedion-5-yl ester, 9-fluoro-11-hydroxy-17-methylandrost-4-en-3-on-17-yl ester, stigmasta-5,24-dien-3-yl ester, octahydro-4,8a-dimethyl-4a(2H)-naphthalenyl ester, hydroxycholesterol-24-yl ester, exo-1,7,7-trimethylbicyclo[2.2.1]heptan-2-yl ester, 6α-6-methylpregn-4-en-3,20-dion-17-yl ester, 1-2'-oxo-4'-methyl-cyclohexyl-1-methylethyl ester, estro-4-en-3-on-17-yl ester, 3-etyl-18,19-dinorpregn-4-en-3-on-17-yl ester, 19-norpregn-4-en-3-on-17-yl ester, 19-norpregn-4-en-20-in-3-on-17-yl ester, 19-norpregn-5(10)-en-20-in-3-on-17-yl ester, 17-methyl-2-oxaandrostan-3-on-17-yl ester, 4-hydroxy-17-methylandrost-4-en-3-on-17-yl ester, dihydro-4H-dimethyl-2(3H)-furanon-3-yl ester, 5-hydroxy-α,α,4-trimethyl-3-cyclohexene-1-methyl ester, α,α,4-trimethyl-3-cyclohexene-1-methyl ester, patchoulyl ester, α,α,4-trimethylcyclohexanemethan-4-yl ester, 1,4'-hydroxy-4'-methyl-cyclohexyl-1-methylethyl ester, tetrahydrofurfuryl ester, dimethylisopropylsilylcyclopentyl ester, diethylisopropylsilylcyclopentyl ester, dimethylthexylsilylcyclopentyl ester, t-butyldimethylsilylcyclopentyl ester, isopropylcyclopentyl ester, ethylcyclopentyl ester, n-propylcyclopentyl ester, n-butylcyclopentyl ester, isobutylcyclopentyl ester, s-butylcyclopentyl ester, pentylcyclopentyl ester, hexylcyclopentyl ester, heptylcyclopentyl ester, octylcyclopentyl ester, nonylcyclopentyl ester, decanylcyclopentyl ester, 2-trimethylsilylethoxymethylcyclopentyl ester, 2,2,2-trichloroethylcyclopentyl ester, 2-chloroethylcyclopentyl ester, 2-bromoethylcyclopentyl ester, 2-iodoethylcyclopentyl ester, 2-fluoroethylcyclopentyl ester, ω-chloroalkylcyclopentyl ester, 2-methylthioethylcyclopentyl ester, 1,3-dithianyl-2-methylcyclopentyl ester, cyclopentylcyclopentyl ester, cyclohexylcyclopentyl ester, 3-buten-1-ylcyclopentyl ester, 4-trimethylsilyl-2-buten-1-ylcyclopentyl ester, 9-anthrylmethylcyclopentyl ester, 2-9',10'-dioxo-anthrylmethylcyclopentyl ester, 1-pyrenylmethylcyclopentyl ester, 2-trifluoromethyl-6-chromylmethylcyclopentyl ester, piperonylcyclopentyl ester, 4-picolylcyclopentyl ester, trimethylsilylcyclopentyl ester, triethylsilylcyclopentyl ester, isopropyldimethylsilylcyclopentyl ester, di-t-butylmethylsilylcyclopentyl ester, tri-n-butylstannylcyclopentyl ester, methylcyclopentyl ester, methoxymethylcyclopentyl ester, methylthiomethylcyclopentyl ester, t-butylthiomethylcyclopentyl ester, t-butoxymethylcyclopentyl ester, 4-pentenyloxymethylcyclopentyl ester, t-butyldimethylsiloxymethylcyclopentyl ester, thexyldimethylsiloxymethylcyclopentyl ester, 2-methoxyethoxymethylcyclopentyl ester, 2,2,2-trichloroethoxymethylcyclopentyl ester, bis-2'-chloroethoxymethylcyclopentyl ester, 2'-trimethylsilylethoxymethylcyclopentyl ester, 2'-triethylsilylethoxymethylcyclopentyl ester, 2'-triisopropylsilylethoxymethylcyclopentyl ester, 2'-t-butyldimethylsilylethoxymethylcyclopentyl ester, tetrahydropyranylcyclopentyl ester, tetrahydrothiopyranylcyclopentyl ester, 3-bromotetrahydropyranylcyclopentyl ester, 1-methoxycyclohexylcyclopentyl ester, 4-methoxytetrahydropyranylcyclopentyl ester, 4-methoxytetrahydrothiopyranylcyclopentyl ester, 1,4-dioxan-2-ylcyclopentyl ester, tetrahydrofuranylcyclopentyl ester, tetrahydrothiofuranylcyclopentyl ester, 2,3,3a,4,5,6,7,7a-octahydro-7,8,8-trimethyl-4,7-methanobenzofuran-2-ylcyclopentyl ester, 2,2,2-trichloroethylcyclopentyl ester, 2-trimethylsilylethylcyclopentyl ester, t-butylcyclopentyl ester, allylcyclopentyl ester, 4,4',4"-tris-4',5'-dichlorophthalimidophenylmethylcyclopentyl ester, 4,4',4"-tris-4',5'-dibromophthalimidophenylmethylcyclopentyl ester, 4,4',4"-tris-4',5'-diiodophthalimidophenylmethylcyclopentyl ester, 9-anthrylcyclopentyl ester, 9-9'-phenyl-10'-oxo-anthrylcyclopentyl ester, tritironcyclopentyl ester, 1,3-benzodithiolan-2-ylcyclopentyl ester, benzisothiazolyl-S,S-dioxidocyclopentyl ester, trimethylsilylcyclopentyl ester, triethylsilylcyclopentyl ester, triisopropylsilylcyclopentyl ester, triethylstannylcyclopentyl ester, dimethylisopropylsilylcyclohexyl ester, diethylisopropylsilylcyclohexyl ester, dimethylthexylsilylcyclohexyl ester, t-butyldimethylsilylcyclohexyl ester, isopropylcyclohexyl ester, ethylcyclohexyl ester, n-propylcyclohexyl ester, n-butylcyclohexyl ester, isobutylcyclohexyl ester, s-butylcyclohexyl ester, pentylcyclohexyl ester, hexylcyclohexyl ester, heptylcyclohexyl ester, octylcyclohexyl ester, nonylcyclohexyl ester, decanylcyclohexyl ester, 2-trimethylsilylethoxymethylcyclohexyl ester, 2,2,2-trichloroethylcyclohexyl ester, 2-chloroethylcyclohexyl ester, 2-bromoethylcyclohexyl ester, 2-iodoethylcyclohexyl ester, 2-fluoroethylcyclohexyl ester, ω-chloroalkylcyclohexyl ester, 2-methylthioethylcyclohexyl ester, 1,3-dithianyl-2-methylcyclohexyl ester, cyclopentylcyclohexyl ester, cyclohexylcyclohexyl ester, 3-buten-1-ylcyclohexyl ester, 4-trimethylsilyl-2-buten-1-ylcyclohexyl ester, 9-anthrylmethylcyclohexyl ester, 2-9',10'-dioxo-anthrylmethylcyclohexyl ester, 1-pyrenylmethylcyclohexyl ester, 2-trifluoromethyl-6-chromylmethylcyclohexyl ester, piperonylcyclohexyl ester, 4-picolylcyclohexyl ester, trimethylsilylcyclohexyl ester, triethylsilylcyclohexyl ester, isopropyldimethylsilylcyclohexyl ester, di-t-butylmethylsilylcyclohexyl ester, thiocyclohexyl ester, tri-n-butylstannylcyclohexyl ester, methylcyclohexyl ester, methoxymethylcyclohexyl ester, methylthiomethylcyclohexyl ester, t-butylthiomethylcyclohexyl ester, t-butoxymethylcyclohexyl ester, 4-pentenyloxymethylcyclohexyl ester, t-butyldimethylsiloxymethylcyclohexyl ester, thexyldimethylsiloxymethylcyclohexyl ester, 2-methoxyethoxymethylcyclohexyl ester, 2,2,2-trichloroethoxymethylcyclohexyl ester, bis-2'-chloroethoxymethylcyclohexyl ester, 2'-trimethylsilylethoxymethylcyclohexyl ester, 2'-triethylsilylethoxymethylcyclohexyl ester, 2'-triisopropylsilylethoxymethylcyclohexyl ester, 2'-t-butyldimethylsilylethoxymethylcyclohexyl ester, tetrahydropyranylcyclohexyl ester, tetrahydrothiopyranylcyclohexyl ester, 3-bromotetrahydropyranylcyclohexyl ester, 1-methoxycyclohexylcyclohexyl ester, 4-methoxytetrahydropyranylcyclohexyl ester, 4-methoxytetrahydrothiopyranylcyclohexyl ester, 1,4-dioxan-2-ylcyclohexyl ester, tetrahydrofuranylcyclohexyl ester, tetrahydrothiofuranylcyclohexyl ester, 2,3,3a,4,5,6,7,7a-octahydro-7,8,8-trimethyl-4,7-methanobenzofuran-2-ylcyclohexyl ester, 2,2,2-trichloroethylcyclohexyl ester, 2-trimethylsilylethylcyclohexyl ester, t-butylcyclohexyl ester, allylcyclohexyl ester, 4,4',4"-tris-4',5'-dichlorophthalimidophenylmethylcyclohexyl ester, 4,4',4"-tris-4',5'-dibromophthalimidophenylmethylcyclohexyl ester, 4,4',4"-tris-4',5'-diiodophthalimidophenylmethylcyclohexyl ester, 9-anthrylcyclohexyl ester, 9-9'-phenyl-10'-oxoanthrylcyclohexyl ester, tritironcyclohexyl ester, 1,3-benzodithiolan-2-ylcyclohexyl ester, benzisothiazolyl-S,S-dioxidocyclohexyl ester, trimethylsilylcyclohexyl ester, triethylsilylcyclohexyl ester, triisopropylsilylcyclohexyl ester, triethylstannylcyclohexyl ester, dimethylisopropylsilylcycloheptyl ester, diethylisopropylsilylcycloheptyl ester, dimethylthexylsilylcycloheptyl ester, t-butyldimethylsilylcycloheptyl ester, isopropylcycloheptyl ester, ethylcycloheptyl ester, n-propylcycloheptyl ester, n-butylcycloheptyl ester, isobutylcycloheptyl ester, s-butylcycloheptyl ester, pentylcycloheptyl ester, hexylcycloheptyl ester, heptylcycloheptyl ester, octylcycloheptyl ester, nonylcycloheptyl ester, decanylcycloheptyl ester, 2-trimethylsilylethoxymethylcycloheptyl ester, 2,2,2-trichloroethylcycloheptyl ester, 2-chloroethylcycloheptyl ester, 2-bromoethylcycloheptyl ester, 2-iodoethylcycloheptyl ester, 2-fluoroethylcycloheptyl ester, ω-chloroalkylcycloheptyl ester, 2-methylthioethylcycloheptyl ester, 1,3-dithianyl-2-methylcycloheptyl ester, cyclopentylcycloheptyl ester, cyclohexylcycloheptyl ester, 3-buten-1-ylcycloheptyl ester, 4-trimethylsilyl-2-buten-1-ylcycloheptyl ester, 9-anthrylmethylcycloheptyl ester, 2-9',10'-dioxoanthrylmethylcycloheptyl ester, 1-pyrenylmethylcycloheptyl ester, 2-trifluoromethyl-6-chromylmethylcycloheptyl ester, piperonylcycloheptyl ester, 4-picolylcycloheptyl ester, trimethylsilylcycloheptyl ester, triethylsilylcycloheptyl ester, isopropyldimethylsilylcycloheptyl ester, di-t-butylmethylsilylcycloheptyl ester, thiocycloheptyl ester, tri-n-butylstannylcycloheptyl ester, methylcycloheptyl ester, methoxymethylcycloheptyl ester, methylthiomethylcycloheptyl ester, t-butylthiomethylcycloheptyl ester, t-butoxymethylcycloheptyl ester, 4-pentenyloxymethylcycloheptyl ester, t-butyldimethylsiloxymethylcycloheptyl ester, thexyldimethylsiloxymethylcycloheptyl ester, 2-methoxyethoxymethylcycloheptyl ester, 2,2,2-trichloroethoxymethylcycloheptyl ester, bis-2'-chloroethoxymethylcycloheptyl ester, 2'-trimethylsilylethoxymethylcycloheptyl ester, 2'-triethylsilylethoxymethylcycloheptyl ester, 2'-triisopropylsilylethoxymethylcycloheptyl ester, 2'-t-butyldimethylsilylethoxymethylcycloheptyl ester, tetrahydropyranylcycloheptyl ester, tetrahydrothiopyranylcycloheptyl ester, 3-bromotetrahydropyranylcycloheptyl ester, 1-methoxycyclohexylcycloheptyl ester, 4-methoxytetrahydropyranylcycloheptyl ester, 4-methoxytetrahydrothiopyranylcycloheptyl ester, 1,4-dioxan-2-ylcycloheptyl ester, tetrahydrofuranylcycloheptyl ester, tetrahydrothiofuranylcycloheptyl ester, 2,3,3a,4,5,6,7,7a-octahydro-7,8,8-trimethyl-4,7-methanobenzofuran-2-ylcycloheptyl ester, 2,2,2-trichloroethylcycloheptyl ester, 2-trimethylsilylethylcycloheptyl ester, t-butylcycloheptyl ester, allylcycloheptyl ester, 4,4',4"-tris-4',5'-dichlorophthalimidophenylmethylcycloheptyl ester, 4,4',4"-tris-4',51-dibromophthalimidophenylmethylcycloheptyl ester, 4,4',4"-tris-4',5'-diiodophthalimidophenylmethylcycloheptyl ester, 9-anthrylcycloheptyl ester, 9-9'-phenyl-10'-oxoanthrylcycloheptyl ester, tritironcycloheptyl ester, 1,3-benzodithiolan-2-ylcycloheptyl ester, benzisothiazolyl-S,S-dioxidocycloheptyl ester, trimethylsilylcycloheptyl ester, triethylsilylcycloheptyl ester, triisopropylsilylcycloheptyl ester, triethylstannylcycloheptyl ester, dimethylisopropylsilylcyclooctyl ester, diethylisopropylsilylcyclooctyl ester, dimethylthexylsilylcyclooctyl ester, t-butyldimethylsilylcyclooctyl ester, isopropylcyclooctyl ester, ethylcyclooctyl ester, n-propylcyclooctyl ester, n-butylcyclooctyl ester, isobutylcyclooctyl ester, s-butylcyclooctyl ester, pentylcyclooctyl ester, hexylcyclooctyl ester, heptylcyclooctyl ester, octylcyclooctyl ester, nonylcyclooctyl ester, decanylcyclooctyl ester, 2-trimethylsilylethoxymethylcyclooctyl ester, 2,2,2-trichloroethylcyclooctyl ester, 2-chloroethylcyclooctyl ester, 2-bromoethylcyclooctyl ester, 2-iodoethylcyclooctyl ester, 2-fluoroethylcyclooctyl ester, co-chloroalkylcyclooctyl ester, 2-methylthioethylcyclooctyl ester, 1,3-dithianyl-2-methylcyclooctyl ester, cyclopentylcyclooctyl ester, cyclohexylcyclooctyl ester, 3-buten-1-ylcyclooctyl ester, 4-trimethylsilyl-2-buten-1-ylcyclooctyl ester, 9-anthrylmethylcyclooctyl ester, 2-9',10'-dioxoanthrylmethylcyclooctyl ester, 1-pyrenylmethylcyclooctyl ester, 2-trifluoromethyl-6-chromylmethylcyclooctyl ester, piperonylcyclooctyl ester, 4-picolylcyclooctyl ester, trimethylsilylcyclooctyl ester, triethylsilylcyclooctyl ester, isopropyldimethylsilylcyclooctyl ester, di-t-butylmethylsilylcyclooctyl ester, thiocyclooctyl ester, tri-n-butylstannylcyclooctyl ester, methylcyclooctyl ester, methoxymethylcyclooctyl ester, methylthiomethylcyclooctyl ester, t-butylthiomethylcyclooctyl ester, t-butoxymethylcyclooctyl ester, 4-pentenyloxymethylcyclooctyl ester, t-butyldimethylsiloxymethylcyclooctyl ester, thexyldimethylsiloxymethylcyclooctyl ester, 2-methoxyethoxymethylcyclooctyl ester, 2,2,2-trichloroethoxymethylcyclooctyl ester, bis-2'-chloroethoxymethylcyclooctyl ester, 2'-trimethylsilylethoxymethylcyclooctyl ester, 2'-triethylsilylethoxymethylcyclooctyl ester, 2'-triisopropylsilylethoxymethylcyclooctyl ester, 2'-t-butyldimethylsilylethoxymethylcyclooctyl ester, tetrahydropyranylcyclooctyl ester, tetrahydrothiopyranylcyclooctyl ester, 3-bromotetrahydropyranylcyclooctyl ester, 1-methoxycyclohexylcyclooctyl ester, 4-methoxytetrahydropyranylcyclooctyl ester, 4-methoxytetrahydrothiopyranylcyclooctyl ester, 1,4-dioxan-2-ylcyclooctyl ester, tetrahydrofuranylcyclooctyl ester, tetrahydrothiofuranylcyclooctyl ester, 2,3,3a,4,5,6,7,7a-octahydro-7,8,8-trimethyl-4,7-methanobenzofuran-2-ylcyclooctyl ester, 2,2,2-trichloroethylcyclooctyl ester, 2-trimethylsilylethylcyclooctyl ester, t-butylcyclooctyl ester, allylcyclooctyl ester, 4,4',4"-tris-4',5'-dichlorophthalimidophenylmethylcyclooctyl ester, 4,4',4"-tris-4',5'-dibromophthalimidophenylmethylcyclooctyl ester, 4,4',4"-tris-4',5'-diiodophthalimidophenylmethylcyclooctyl ester, 9-anthrylcyclooctyl ester, 9-9'-phenyl-10'-oxoanthrylcyclooctyl ester, tritironcyclooctyl ester, 1,3-benzodithiolan-2-ylcyclooctyl ester, benzisothiazolyl-S,S- dioxidocyclooctyl ester, trimethylsilylcyclooctyl ester, triethylsilylcyclooctyl ester, triisopropylsilylcyclooctyl ester, triethylstannylcyclooctyl ester, dimethylisopropylsilylcyclononyl ester, diethylisopropylsilylcyclononyl ester, dimethylthexylsilylcyclononyl ester, t-butyldimethylsilylcyclononyl ester, isopropylcyclononyl ester, ethylcyclononyl ester, n-propylcyclononyl ester, n-butylcyclononyl ester, isobutylcyclononyl ester, s-butylcyclononyl ester, pentylcyclononyl ester, hexylcyclononyl ester, heptylcyclononyl ester, octylcyclononyl ester, nonylcyclononyl ester, decanylcyclononyl ester, 2-trimethylsilylethoxymethylcyclononyl ester, 2,2,2-trichloroethylcyclononyl ester, 2-chloroethylcyclononyl ester, 2-bromoethylcyclononyl ester, 2-iodoethylcyclononyl ester, 2-fluoroethylcyclononyl ester, ω-chloroalkylcyclononyl ester, 2-methylthioethylcyclononyl ester, 1,3-dithianyl-2-methylcyclononyl ester, cyclopentylcyclononyl ester, cyclohexylcyclononyl ester, 3-buten-1-ylcyclononyl ester, 4-trimethylsilyl-2-buten-1-ylcyclononyl ester, 9-anthrylmethylcyclononyl ester, 2-9',10'-dioxoanthrylmethylcyclononyl ester, 1-pyrenylmethylcyclononyl ester, 2-trifluoromethyl-6-chromylmethylcyclononyl ester, piperonylcyclononyl ester, 4-picolylcyclononyl ester, trimethylsilylcyclononyl ester, triethylsilylcyclononyl ester, isopropyldimethylsilylcyclononyl ester, di-t-butylmethylsilylcyclononyl ester, thiocyclononyl ester, tri-n-butylstannylcyclononyl ester, methylcyclononyl ester, methoxymethylcyclononyl ester, methylthiomethylcyclononyl ester, t-butylthiomethylcyclononyl ester, t-butoxymethylcyclononyl ester, 4-pentenyloxymethylcyclononyl ester, t-butyldimethylsiloxymethylcyclononyl ester, thexyldimethylsiloxymethylcyclononyl ester, 2-methoxyethoxymethylcyclononyl ester, 2,2,2-trichloroethoxymethylcyclononyl ester, bis-2'-chloroethoxymethylcyclononyl ester, 2'-trimethylsilylethoxymethylcyclononyl ester, 2'-triethylsilylethoxymethylcyclononyl ester, 2'-triisopropylsilylethoxymethylcyclononyl ester, 2'-t-butyldimethylsilylethoxymethylcyclononyl ester, tetrahydropyranylcyclononyl ester, tetrahydrothiopyranylcyclononyl ester, 3-bromotetrahydropyranylcyclononyl ester, 1-methoxycyclohexylcyclononyl ester, 4-methoxytetrahydropyranylcyclononyl ester, 4-methoxytetrahydrothiopyranylcyclononyl ester, 1,4-dioxan-2-ylcyclononyl ester, tetrahydrofuranylcyclononyl ester, tetrahydrothiofuranylcyclononyl ester, 2,3,3a,4,5,6,7,7a-octahydro-7,8,8-trimethyl-4,7-methanobenzofuran-2-ylcyclononyl ester, 2,2,2-trichloroethylcyclononyl ester, 2-trimethylsilylethylcyclononyl ester, t-butylcyclononyl ester, allylcyclononyl ester, 4,4',4"-tris-4',5'-dichlorophthalimidophenylmethylcyclononyl ester, 4,4',4"-tris-4',5'-dibromophthalimidophenylmethylcyclononyl ester, 4,4',4"-tris-4',5'-diiodophthalimidophenylmethylcyclononyl ester, 9-anthrylcyclononyl ester, 9-9'-phenyl-10'-oxoanthrylcyclononyl ester, tritironcyclononyl ester, 1,3-benzodithiolan-2-ylcyclononyl ester, benzisothiazolyl-S,S-dioxidocyclononyl ester, trimethylsilylcyclononyl ester, triethylsilylcyclononyl ester, triisopropylsilylcyclononyl ester, triethylstannylcyclononyl ester, dimethylisopropylsilylcyclodecanyl ester, diethylisopropylsilylcyclodecanyl ester, dimethylthexylsilylcyclodecanyl ester, t-butyldimethylsilylcyclodecanyl ester, isopropylcyclodecanyl ester, ethylcyclodecanyl ester, n-propylcyclodecanyl ester, n-butylcyclodecanyl ester, isobutylcyclodecanyl ester, s-butylcyclodecanyl ester, pentylcyclodecanyl ester, hexylcyclodecanyl ester, heptylcyclodecanyl ester, octylcyclodecanyl ester, nonylcyclodecanyl ester, decanylcyclodecanyl ester, 2-trimethylsilylethoxymethylcyclodecanyl ester, 2,2,2-trichloroethylcyclodecanyl ester, 2-chloroethylcyclodecanyl ester, 2-bromoethylcyclodecanyl ester, 2-iodoethylcyclodecanyl ester, 2-fluoroethylcyclodecanyl ester, ω-chloroalkylcyclodecanyl ester, 2-methylthioethylcyclodecanyl ester, 1,3-dithianyl-2-methylcyclodecanyl ester, cyclopentylcyclodecanyl ester, cyclohexylcyclodecanyl ester, 3-buten-1-ylcyclodecanyl ester, 4-trimethylsilyl-2-buten-1-ylcyclodecanyl ester, 9-anthrylmethylcyclodecanyl ester, 2-9',10'-dioxoanthrylmethylcyclodecanyl ester, 1-pyrenylmethylcyclodecanyl ester, 2-trifluoromethyl-6-chromylmethylcyclodecanyl ester, piperonylcyclodecanyl ester, 4-picolylcyclodecanyl ester, trimethylsilylcyclodecanyl ester, triethylsilylcyclodecanyl ester, isopropyldimethylsilylcyclodecanyl ester, di-t-butylmethylsilylcyclodecanyl ester, thiocyclodecanyl ester, tri-n-butylstannylcyclodecanyl ester, methylcyclodecanyl ester, methoxymethylcyclodecanyl ester, methylthiomethylcyclodecanyl ester, t-butylthiomethylcyclodecanyl ester, t-butoxymethylcyclodecanyl ester, 4-pentenyloxymethylcyclodecanyl ester, t-butyldimethylsiloxymethylcyclodecanyl ester, thexyldimethylsiloxymethylcyclodecanyl ester, 2-methoxyethoxymethylcyclodecanyl ester, 2,2,2-trichloroethoxymethylcyclodecanyl ester, bis-2'-chloroethoxymethylcyclodecanyl ester, 2'-trimethylsilylethoxymethylcyclodecanyl ester, 2'-triethylsilylethoxymethylcyclodecanyl ester, 2'-triisopropylsilylethoxymethylcyclodecanyl ester, 2'-t-butyldimethylsilylethoxymethylcyclodecanyl ester, tetrahydropyranylcyclodecanyl ester, tetrahydrothiopyranylcyclodecanyl ester, 3-bromotetrahydropyranylcyclodecanyl ester, 1-methoxycyclohexylcyclodecanyl ester, 4-methoxytetrahydropyranylcyclodecanyl ester, 4-methoxytetrahydrothiopyranylcyclodecanyl ester, 1,4-dioxan-2-ylcyclodecanyl ester, tetrahydrofuranylcyclodecanyl ester, tetrahydrothiofuranylcyclodecanyl ester, 2,3,3a,4,5,6,7,7a-octahydro-7,8,8-trimethyl-4,7-methanobenzofuran-2-ylcyclodecanyl ester, 2,2,2-trichloroethylcyclodecanyl ester, 2-trimethylsilylethylcyclodecanyl ester, t-butylcyclodecanyl ester, allylcyclodecanyl ester, 4,4',4"-tris-4',5'-dichlorophthalimidophenylmethylcyclodecanyl ester, 4,4',4"-tris-4',5'-dibromophthalimidophenylmethylcyclodecanyl ester, 4,4',4"-tris-4',5'-diiodophthalimidophenylmethylcyclodecanyl ester, 9-anthrylcyclodecanyl ester, 9-9'-phenyl-10'-oxoanthrylcyclodecanyl ester, tritironcyclodecanyl ester, 1,3-benzodithiolan-2-ylcyclodecanyl ester, benzisothiazolyl-S,S-dioxidocyclodecanyl ester, trimethylsilylcyclodecanyl ester, triethylsilylcyclodecanyl ester, triisopropylsilylcyclodecanyl ester, triethylstannylcyclodecanyl ester, ethylcyclohexyl ester, methylcyclohexyl ester, ethoxymethylcyclohexyl ester, methylthiomethylcyclohexyl ester, tetrahydropyranylcyclohexyl ester, tetrahydrofuranylcyclohexyl ester, methoxyethoxymethylcyclohexyl ester, 2-trimethylsilylethoxymethylcyclohexyl ester, 2,2,2-trichloroethylcyclohexyl ester, 2-chloroethylcyclohexyl ester, 2-bromoethylcyclohexyl ester, 2-iodoethylcyclohexyl ester, 2-fluoroethylcyclohexyl ester, ω-chloroalkylcyclohexyl ester, 2-trimethylsilylethylcyclohexyl ester, 2-methylthioethylcyclohexyl ester, 1,3-dithianyl-2- methylcyclohexyl ester, t-butylcyclohexyl ester, cyclopentylcyclohexyl ester, cyclohexylcyclohexyl ester, allylcyclohexyl ester, 3-buten-1-ylcyclohexyl ester, 4-trimethylsilyl-2-buten-1-ylcyclohexyl ester, 9-anthrylmethylcyclohexyl ester, 2-9',10'-dioxo-anthlymethylcyclohexyl ester, 1-pyrenylmethylcyclohexyl ester, 2-trifluoromethyl-6-chromylmethylcyclohexyl ester, piperonylcyclohexyl ester, 4-picolylcyclohexyl ester, trimethylsilylcyclohexyl ester, triethylsilylcyclohexyl ester, t-butyldimethylsilylcyclohexyl ester, isopropyldimethylsilylcyclohexyl ester, di-t-butyldimethylsilylcyclohexyl ester, thiocyclohexyl ester, oxazole, 2-alkyl-1,3-oxazoline, 4-alkyl-5-oxo-1,3-oxazoline, 5-alkyl-4-oxo-1,3-dioxosolane, orthocyclohexyl ester, pentaamine-cobalt complex, triethylstannylcyclohexyl ester, tri-n-butylstanylcyclohexyl ester, N-7-nitroindorilcyclohexyl ester, N-8-nitro-1,2,3,4-tetrahydroquinolyl amide, hydrazide, N-phenylhydrazide and N,N'-diisopropylhydrazide.

In particular, a compound having a naphthalene skeleton such as polyhydroxynaphthol and being protected with t-butoxycarbonyl group or t-butoxycarbonyl methyl group is desirable since it makes it possible to improve the light transmittance of the photosensitive composition to a light of 193 nm in wavelength.

Namely, the photosensitive composition of this invention may contain, as a preferable additive, compounds such as methyladamantyladamantane dicarbonate, methyladamantyladamantane carbonate, methylcyclohexyladamantane dicarbonate, tetrahydropyranyladamantane carbonate, tetrahydropyranyladamantane dicarbonate, methylcyclohexylcyclohexyladamantane dicarbonate, tetrahydropyranylcyclohexylcyclohexane dicarbonate, tetrahydrofuranyladamantane carbonate, tetrahydrofuranyladamantane dicarbonate and ethoxyethyladamantane carbonate.

The additive preferably used in the present invention is not limited to the aforementioned specific examples.

The mixing ratio of an additive having the aforementioned alicyclic skeleton in the photosensitive composition of this invention should preferably be in the range of 1% by weight to 90% by weight, more preferably 5% by weight to 70% by weight based on the resin moiety. If the mixing ratio of the additive is less than 1% by weight, the effect of incorporating the additive would be negligible. On the other hand, if the mixing ratio of the additive is more than 90% by weight, the coating property of the photosensitive composition would be deteriorated.

In addition to the aforementioned various components, the photosensitive composition of this invention may concurrently contain a compound represented by the following general formula (9). The simultaneous employment of this compound is effective in further enhancing the contrast.

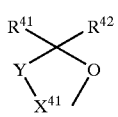

(9)

wherein $R^{41}$ and $R^{42}$ may be the same or different and are individually hydrogen atom, halogen atom, cyano group, nitro group, silyl group or a monovalent organic group; alternatively $R^{41}$ and $R^{42}$ may be combined with each other forming a ring; and $X^{41}$ is >C=O or —SO$_2$—; Y is a bivalent organic group; and wherein at least one of $R^{41}$, $R^{42}$ and Y is provided with a substituent group or a functional group which can be decomposed by an acid.

Examples of monovalent organic group to be introduced as $R^{41}$, $R^{42}$ in the compound represented by the aforementioned general formula (9) are alkyl groups such as methyl, ethyl, propyl, isopropyl, n-butyl, isobutyl, s-butyl and t-butyl; and substituted or unsubstituted alicyclic or heterocyclic groups such as cyclohexyl, piperidyl and pyranine.

As for the bivalent substituent group Y, it is possible to employ unsaturated aliphatic groups such as ethylene, propylene and butylene; and substituted or unsubstituted alicyclic or heterocyclic groups such as cyclohexane, pyrazine, pyrane and morpholane.

By making use of a copolymer of a vinyl compound or acrylic compound with an alkali-soluble acrylic compound such as methacrylic acid or acrylic acid or with an alkali-soluble vinyl compound as a resin component of the photosensitive material of this invention, and by suitably adding a photo-acid-generating agent and a photo-crosslinking agent to the copolymer, the photosensitive material of this invention can be made into a chemically amplified resist of negative type.

In this case, it is possible to employ, as the photo-acid-generating agent, halogenated alkyl-substituted triazine or naphthylidine compounds in addition to the photo-acid-generating agents exemplified above as being useful for a positive resist. As for the photo-crosslinking agent, it is possible to employ a vinyl or acrylic polymer having on its side chain an epoxy group, or a melamine type compound such as methylol-substituted triazine or naphthylidine compounds.

Next, examples of preparing the photosensitive material of this invention and the method of forming a resist pattern by making use of the photosensitive material will be explained with reference to a chemically amplified resist of positive type.

The photosensitive composition of this invention can be prepared using a polymer having a repeating unit represented by the aforementioned general formulas (u-1), (u-2) or (u-3) as a base resin, and dissolving the base resin in an organic solvent together with a photo-acid-generating agent, the resultant mixed solution being subsequently filtered thereby to obtain the photosensitive composition. If desired, an alkali-soluble resin as mentioned above may be incorporated into the photosensitive composition.

The organic solvents useful in this case are a ketone-type solvent such as cyclohexanone, acetone, methyl ethyl ketone and methylisobutyl ketone; a cellosolve-type solvent such as methylcellosolve, 2-ethoxyethyl acetate, 2-methoxyethyl acetate, 2-propoxyethyl acetate or 2-buthoxyethyl acetate; a glycol-type solvent such as propyleneglycol monomethyl-ether acetate; an ester-type solvent such as ethyl acetate, butyl acetate and isoamyl acetate; a lactone-type solvent such as γ-butyrolactone; and a nitrogen-containing solvent such as dimethylsulfoxide, hexamethylphosphoric triamide dimethylformamide and N-methylpyrrolidone. These solvents may be employed singly or in combination. These solvents may contain a suitable amount of aromatic solvent such as xylene and toluene; aliphatic alcohol such as isopropyl alcohol, n-propyl alcohol, ethyl alcohol, methyl alcohol, n-butyl alcohol, s-butyl alcohol, t-butyl alcohol and isobutyl alcohol.

In addition to the above components, a surfactant as a coating film-modifying agent; other kinds of polymer such as epoxy resin, polymethacrylate, propylene oxide-ethylene oxide copolymer and polystyrene; and a dye as a reflection-prohibiting agent may also be incorporated into the photosensitive composition of this invention.

The solution of the photosensitive composition prepared as mentioned above is then coated on the surface of a substrate by means of a spin-coating method or a dipping method. Then, the coated layer is dried at a temperature of 150° C. or less, or preferably at a temperature of 70 to 120° C. thereby forming a photosensitive resin layer (a resist film) comprising the aforementioned photosensitive composition as a main component. The substrate to be employed in this case may be a silicon wafer; a silicon wafer having a stepped portion formed of insulating films, electrodes or interconnecting wirings; or a blank mask; or Group III–V compounds (such as GaAs, AlGaAs) semiconductor wafer.

Then, the resist film is subjected to a patterning exposure, i.e., the resist film is irradiated through a predetermined mask with an actinic radiation. The actinic radiation to be employed in this exposure may be an ultraviolet rays of short wavelength, electron beam; X-rays; a low pressure mercury lamp light beam; an excimer laser beam such as a KrF or ArF excimer laser beam; a synchrotron orbital radiation beam; γ-rays; and an ion beam. However, a most prominent effect of the photosensitive composition of this invention can be obtained when an ArF excimer laser is employed as a light source in the aforementioned patterning exposure.

The resist film thus exposed is then subjected to a baking treatment by heating it at a temperature of 60 to 200° C. for 1 to 30 minutes using a hot plate or an oven, or through the irradiation of infrared rays.

Subsequently, the resist film thus baked is subjected to a developing treatment by way of a dipping method or spraying method using an aqueous alkaline solution, thereby obtaining a desired resist pattern. The aqueous alkaline solution useful as the developing solution may be an aqueous organic alkali solution such as an aqueous solution of tetramethylammonium hydroxide, or an aqueous inorganic alkali solution such as an aqueous solution of potassium hydroxide and sodium hydroxide. These aqueous alkaline solutions are used in general at the concentration of 15% or less. It is also possible to employ as a developing solution other organic solvents such as isopropyl alcohol, n-propyl alcohol, ethanol, methanol, 1-butanol, 2-butanol, 1-methyl-1-propanol and 1-methyl-2-propanol. These organic solvents may used singly or in combination.

After the developing treatment, the substrate and resist film may be rinsed with water, etc.

Since the photosensitive composition of this invention is minimal in absorption of light of short wavelength and excellent in transparency, it is possible to a resist pattern of ultra-fine line width with high precision. Moreover, since the resist pattern to be obtained is excellent in dry-etching resistance, the pattern can be transcribed, through a dry process using the resist pattern as an etching mask, to a substrate, etc. with high precision.

The high molecular compound to be incorporated as a base resin into the photosensitive composition of this invention contains a repeating unit represented by the aforementioned general formulas (u-1), (u-2) or (u-3). Further, since these repeating units contain not only a group having an alicyclic skeleton but also a group which is bonded to this group having an alicyclic skeleton and is capable of being decomposed by an acid, the following advantages can be obtained.

Namely, first, The synthesis of a polymer (synthesis of copolymer) is easy (charging and reactivity). Secondary, since a heteroatom and a polar group are contained therein, the hydrophobicity of the composition can be minimized. In particular, when the group to be decomposed by an acid contains Si, the resist pattern to be formed using the photosensitive composition of this invention would exhibit a more excellent dry-etching resistance.

When a group containing an alicyclic skeleton and an acid-decomposable group are individually contained in a separate monomer, it has been difficult to synthesize a copolymer because of the poor charging property and reactivity of the monomers. By contrast, according to this invention, since a group containing an alicyclic skeleton and an acid-decomposable group of specific kind are both contained in the same monomer, it is possible to minimize the hydrophobicity and hence to improve the adherence of the composition to a Si substrate, and at the same time, to prominently improve the sensitivity of the composition to an exposure light.

It has been confirmed through studies made by the present inventors that a compound having an alicyclic skeleton exhibits an excellent dry-etching resistance in spite of non-existence of an aromatic ring therein. Further, this compound having an alicyclic skeleton is excellent not only in dry-etching resistance but also in transparency as the absorption of a light region of short wavelength such as a KrF excimer laser beam, an ArF excimer laser beam and a fluorine laser beam can be minimized due to the absence of an aromatic ring.

Since the photosensitive composition according to this invention contains a high molecular compound formed through a polymerization of a monomer containing both alicyclic skeleton and acid-decomposable group as mentioned above, it is possible to obtain a photosensitive composition which is not only excellent in transparency to a light source of short wavelength such as an ultraviolet ray, a deep UV beam, a KrF excimer laser beam having a wavelength of 248 nm, an ArF excimer laser beam having a wavelength of 193 nm, a fluorine laser beam, an electron beam or an X-ray, but also capable of forming a resist pattern having a sufficient dry etching resistance. Therefore, by making use of the photosensitive composition of this invention having the aforementioned features, an ultrafine pattern having a line width of not more than subquarter micron can be formed with high precision.

Since the photosensitive composition of this invention comprising the aforementioned high molecular compound contains an alicyclic skeleton, i.e. a ring structure, the composition is excellent in dry-etching resistance. The reason for this feature may be attributed to the fact that even if one of carbon-carbon bond is cut off, the other carbon-carbon bond can be maintained in a bonded state.

The high molecular compound having a repeating unit represented by the aforementioned general formulas (u-1), (u-2) or (u-3), which constitutes the features of this invention, may be used not only for a chemically amplified resist, but also as a base resin of the conventional resist. Specifically, this high molecular compound can be employed as a base resin for a resin whose backbone chain is adapted to be cut off by an exposure of light, for a resin composition containing a compound whose solubility can be enhanced by a light exposure (a positive resist), for a resin which is capable of being crosslinked through a light exposure, or for resin composition containing a compound whose solubility can be lowered by a light exposure (a negative resist). These conventional resists can be manufactured by dissolving the base resin in an aforementioned solvent together with a photo-crosslinking agent or a photo-main chain-cutting agent, the resultant mixed solution being subsequently filtered thereby to obtain the resist.

Even when the photosensitive composition of this invention is used for the preparation of these conventional resists, it is possible, due to the employment of a high molecular compound constituted by a monomer containing both alicyclic skeleton and specific acid-decomposable group as a base resin, to obtain a resist excellent in transmittance to a light of short wavelength and to form a resist pattern excellent in dry-etching resistance.

This invention will be further explained with reference to the following examples. These examples however should not be construed as being limiting the scope of this invention.

Synthesis Example 1

Terpineol, acetyl chloride and trimethylamine were dissolved in methylene chloride to obtain a mixed solution, which was then refluxed under heating at a liquid temperature of 70° C. for 9 hours. Subsequently, the reaction of the mixed solution was quenched by adding therein an aqueous saturated solution of ammonium chloride, and then ethyl acetate was added thereto. The mixed solution was then allowed to be separated into 2 phases, and after the aqueous phase was extracted with ethyl acetate, the organic extractions were combined and washed with an aqueous saturated solution of ammonium chloride. Then, the organic phase thus washed was dried over a saturated salt water and anhydrous sodium sulfate. Finally, the resultant oily product was distilled under reduced pressure to obtain acetyl terpineol.

Synthesis Example 2

Terpineol, chloroacetyl chloride and sodium hydride were dissolved in tetrahydrofuran to obtain a mixed solution, which was then refluxed under heating at a liquid temperature of 70° C. for 9 hours. Subsequently, the reaction of the mixed solution was quenched by adding therein an aqueous saturated solution of ammonium chloride, and then ethyl acetate was added thereto. The mixed solution was then allowed to be separated into 2 phases, and after the aqueous phase was extracted with ethyl acetate, the organic extractions were combined and washed with an aqueous saturated solution of ammonium chloride. Then, the organic phase thus washed was dried over a saturated salt water and anhydrous sodium sulfate. Finally, the resultant oily product was distilled under reduced pressure to obtain chloroacetyl terpineol.

Synthesis Example 3

The same procedures as explained in the above Synthesis Example 2 were repeated except that chloroacetyl chloride was replaced by methyladamantyl chloride, thereby obtaining methyladamantyl terpineol.

Synthesis Example 4

Terpineol, dihydropyrane and p-toluenesulfonic acid were dissolved in dichloromethane to obtain a mixed solution, which was then mixed at room temperature for 8 hours. Subsequently, the reaction of the mixed solution was quenched by adding therein an aqueous saturated solution of sodium hydrogencarbonate, and then ethyl ether was added thereto. The mixed solution was then allowed to be separated into 2 phases, and after the aqueous phase was extracted with ethyl ether, the organic extractions were combined and washed with an aqueous saturated solution of sodium hydrogencarbonate. Then, the organic phase thus washed was dried over a saturated salt water and anhydrous sodium sulfate. Finally, the resultant oily product was distilled under reduced pressure to obtain tetrahydropyranyl terpineol.

Synthesis Example 5

Terpineol, t-butoxycarbonyl chloride and imidazole were dissolved in dimethyl formamide to obtain a mixed solution, which was then refluxed under heating at a liquid temperature of 70° C. for 9 hours. Subsequently, the reaction of the mixed solution was quenched by adding therein an aqueous saturated solution of ammonium chloride, and then ethyl ether was added thereto. The mixed solution was then allowed to be separated into 2 phases, and after the aqueous phase was extracted with ethyl ether, the organic extractions were combined and washed with an aqueous saturated solution of ammonium chloride. Then, the organic phase thus washed was dried over a saturated salt water and anhydrous sodium sulfate. Finally, the resultant oily product was distilled under reduced pressure to obtain t-butoxycarbonyl terpineol.

Synthesis Example 6

The same procedures as explained in the above Synthesis Example 2 were repeated except that chloroacetyl chloride was replaced by t-butyldimethylsilyl chloride, thereby obtaining 2-t-butyldimethylsiloxycyclohexyl-2-propanol.

Synthesis Example 7

The same procedures as explained in the above Synthesis Example 1 were repeated except that acetyl chloride was replaced by tetrahydropyranyloxycarbonyl chloride, thereby obtaining 2-tetrahydropyranyloxycarbonylmethoxycyclohexyl-2-propanol.

Synthesis Example 8

The same procedures as explained in the above Synthesis Example 5 were repeated except that t-butoxycarbonyl chloride was replaced by di-t-butylmethylsilyl chloride, thereby obtaining 2-di-t-butylmethylsiloxycyclohexyl-2-propanol.

Synthesis Example 9

The same procedures as explained in the above Synthesis Example 1 were repeated except that acetyl chloride was replaced by methoxycarbonylmethyl chloride, thereby obtaining 2-methoxycarbonylmethoxycyclohexyl-2-propanol.

Synthesis Example 10

The same procedures as explained in the above Synthesis Example 2 were repeated except that chloroacetyl chloride was replaced by triisopropylsilyl triflate, thereby obtaining 2-triisopropylcyclohexyl-2-propanol.

Synthesis Example 11

The same procedures as explained in the above Synthesis Example 2 were repeated except that terpineol was replaced by tricyclo[3.3.1.1$^{3,7}$]decanyl propanediol and that chloroacetyl chloride was replaced by t-butyldimethylsilyl chloride, thereby obtaining 2-t-butyldimethylsiloxy-tricyclo[3.3.1.1$^{3,7}$]decanyl-2-propanol.

Synthesis Example 12

The same procedures as explained in the above Synthesis Example 1 were repeated except that terpineol was replaced by tricyclo[3.3.1.1$^{3,7}$]decanyl propanediol and that acetyl chloride was replaced by tetrahydropyranyloxycarbonyl chloride, thereby obtaining 2-tetrahydropyranyloxycarbonylmethoxy-tricyclo[3.3.1.1$^{3,7}$]decanyl-2-propanol.

Synthesis Example 13

The same procedures as explained in the above Synthesis Example 5 were repeated except that terpineol was replaced by tricyclo[3.3.1.1$^{3,7}$]decanyl propanediol and that t-butoxycarbonyl chloride was replaced by di-t-butylmethylsilyl chloride, thereby obtaining 2-di-t-butylmethylsiloxy-tricyclo[3.3.1.1$^{3,7}$]decanyl-2-propanol.

Synthesis Example 14

The same procedures as explained in the above Synthesis Example 1 were repeated except that terpineol was replaced by tricyclo[3.3.1.1$^{3,7}$]decanyl propanediol and that acetyl chloride was replaced by methoxycarbonylmethyl chloride, thereby obtaining 2-methoxycarbonylmethoxy-tricyclo[3.3.1.1$^{3,7}$]decanyl-2-propanol.

Synthesis Example 15

The same procedures as explained in the above Synthesis Example 2 were repeated except that terpineol was replaced by tricyclo[3.3.1.1$^{3,7}$]decanyl propanediol and that chloroacetyl chloride was replaced by triisopropylsilyl triflate, thereby obtaining 2-triisopropylsiloxy-tricyclo[3.3.1.1$^{3,7}$]decanyl-2-propanol.

Synthesis Example 16

The same procedures as explained in the above Synthesis Example 2 were repeated except that terpineol was replaced by tricyclo[5.2.1.0$^{2,6}$]decanyl propanediol and that chloroacetyl chloride was replaced by t-butyldimethylsilyl chloride, thereby obtaining 2-t-butyldimethylsiloxy-tricyclo[5.2.1.0$^{2,6}$]decanyl-2-propanol.

Synthesis Example 17

The same procedures as explained in the above Synthesis Example 1 were repeated except that terpineol was replaced by tricyclo[5.2.1.0$^{2,6}$]decanyl propanediol and that acetyl chloride was replaced by tetrahydropyranyloxycarbonyl chloride, thereby obtaining 2-tetrahydropyranyloxycarbonylmethoxy-tricyclo[5.2.1.0$^{2,6}$]decanyl-2-propanol.

Synthesis Example 18

The same procedures as explained in the above Synthesis Example 5 were repeated except that terpineol was replaced by tricyclo[5.2.1.0$^{2,6}$]decanyl propanediol and that t-butoxycarbonyl chloride was replaced by di-t-butylmethylsilyl chloride, thereby obtaining 2-di-t-butylmethylsiloxy-tricyclo[5.2.1.0$^{2,6}$]decanyl-2-propanol.

Synthesis Example 19

The same procedures as explained in the above Synthesis Example 1 were repeated except that terpineol was replaced by tricyclo[5.2.1.0$^{2,6}$]decanyl propanediol and that acetyl chloride was replaced by methoxycarbonylmethyl chloride, thereby obtaining 2-methoxycarbonylmethoxy-tricyclo[5.2.1.0$^{2,6}$]decanyl-2-propanol.

Synthesis Example 20

The same procedures as explained in the above Synthesis Example 2 were repeated except that terpineol was replaced by tricyclo[5.2.1.0$^{2,6}$]decanyl propanediol and that chloroacetyl chloride was replaced by triisopropylsilyl triflate, thereby obtaining 2-triisopropylsiloxy-tricyclo[5.2.1.0$^{2,6}$]decanyl-2-propanol.

Synthesis Example 21

The same procedures as explained in the above Synthesis Example 2 were repeated except that terpineol was replaced by tetracyclo[6.2.1.1$^{3,6}$.0$^{2,7}$]dodecanyl propanediol and that chloroacetyl chloride was replaced by t-butyldimethylsilyl chloride, thereby obtaining 2-t-butyldimethylsiloxy-tetracyclo[6.2.1.1$^{3,6}$.0$^{2,7}$]dodecanyl-2-propanol.

Synthesis Example 22

The same procedures as explained in the above Synthesis Example 1 were repeated except that terpineol was replaced by tetracyclo[6.2.1.1$^{3,6}$.0$^{2,7}$]dodecanyl propanediol and that acetyl chloride was replaced by tetrahydropyranyloxycarbonyl chloride, thereby obtaining 2-tetrahydropyranyloxycarbonylmethoxy-tetracyclo[6.2.1.1$^{3,6}$.0$^{2,7}$]dodecanyl-2-propanol.

Synthesis Example 23

The same procedures as explained in the above Synthesis Example 5 were repeated except that terpineol was replaced by tetracyclo[6.2.1.1$^{3,6}$.0$^{2,7}$]dodecanyl propanediol and that t-butoxycarbonyl chloride was replaced by di-t-butylmethylsilyl chloride, thereby obtaining 2-di-t-butylmethylsiloxy-tetracyclo[6.2.1.1$^{3,6}$.0$^{2,7}$]dodecanyl-2-propanol.

Synthesis Example 24

The same procedures as explained in the above Synthesis Example 1 were repeated except that terpineol was replaced by tetracyclo[6.2.1.1$^{3,6}$.0$^{2,7}$]dodecanyl propanediol and that acetyl chloride was replaced by methoxycarbonylmethyl chloride, thereby obtaining 2-methoxycarbonylmethoxy-tetracyclo[6.2.1.1$^{3,6}$.0$^{2,7}$]dodecanyl-2-propanol.

Synthesis Example 25

The same procedures as explained in the above Synthesis Example 2 were repeated except that terpineol was replaced by tetracyclo[6.2.1.1$^{3,6}$.0$^{2,7}$]dodecanyl propanediol and that chloroacetyl chloride was replaced by triisopropylsilyl triflate, thereby obtaining 2-triisopropylsiloxy-tetracyclo[6.2.1.1$^{3,6}$.0$^{2,7}$]dodecanyl-2-propanol.

Synthesis Example 26

The same procedures as explained in the above Synthesis Example 2 were repeated except that terpineol was replaced by methyl-tricyclo[3.3.1.1$^{3,7}$]decanediol and that chloroacetyl chloride was replaced by t-butyldimethylsilyl chloride, thereby obtaining t-butyldimethylsiloxymethyl tricyclo[3.3.1.1$^{3,7}$]decanyl alcohol.

Synthesis Example 27

The same procedures as explained in the above Synthesis Example 1 were repeated except that terpineol was replaced by methyl-tricyclo[3.3.1.1$^{3,7}$]decanediol and that acetyl chloride was replaced by tetrahydropyranyloxycarbonyl chloride, thereby obtaining tetrahydropyranyloxycarbonylmethoxymethyl-tricyclo[3.3.1.1$^{3,7}$]decanyl alcohol.

Synthesis Example 28

The same procedures as explained in the above Synthesis Example 5 were repeated except that terpineol was replaced by methyl-tricyclo[3.3.1.1$^{3,7}$]decanediol and that t-butoxycarbonyl chloride was replaced by di-t-butylmethylsilyl chloride, thereby obtaining di-t-butylmethylsiloxymethyl-tricyclo[3.3.1.1$^{3,7}$]decanyl alcohol.

Synthesis Example 29

The same procedures as explained in the above Synthesis Example 1 were repeated except that terpineol was replaced by methyl-tricyclo[3.3.1.1$^{3,7}$]decanediol and that acetyl chloride was replaced by methoxycarbonylmethyl chloride, thereby obtaining methoxycarbonylmethoxymethyl-tricyclo[3.3.1.1$^{3,7}$]decanyl alcohol.

Synthesis Example 30

The same procedures as explained in the above Synthesis Example 2 were repeated except that terpineol was replaced by methyl-tricyclo[3.3.1.1$^{3,7}$]decanediol and that chloroacetyl chloride was replaced by triisopropylsilyl triflate, thereby obtaining triisopropylsiloxy-methyltricyclo[3.3.1.1$^{3,7}$]decanyl alcohol.

Synthesis Example 31

2-t-butoxycarbonylmethoxycyclohexyl-2-propanol, methacrylic chloride and butyl lithium were dissolved in tetrahydrofuran to obtain a mixed solution, which was then refluxed at room temperature for 8 hours. Subsequently, the reaction of the mixed solution was quenched by adding therein an aqueous saturated solution of sodium hydrogencarbonate, and then ethyl ether was added thereto. The mixed solution was then allowed to be separated into 2 phases, and after the aqueous phase was extracted with ethyl ether, the organic extractions were combined and washed with an aqueous saturated solution of sodium hydrogencarbonate. Then, the organic phase thus washed was dried over anhydrous sodium sulfate. Finally, after being concentrated, the resultant oily product was distilled under reduced pressure to obtain 2'-t-butoxycarbonylmethoxycyclohexyl-2'-propyl methacrylate.

Synthesis Example 32

The same procedures as explained in the above Synthesis Example 31 were repeated except that 2-t-butoxycarbonylmethoxycyclohexyl-2-propanol was replaced by 2-t-butoxycarbonylmethoxy-tricyclo[3.3.1.1$^{3,7}$]decanyl-2-propanol, thereby obtaining 2'-t-butoxycarbonylmethoxy-tricyclo[3.3.1.1$^{3",7"}$]decanyl-2'-propyl methacrylate.

Synthesis Example 33

The same procedures as explained in the above Synthesis Example 31 were repeated except that 2-t-butoxycarbonylmethoxycyclohexyl-2-propanol was replaced by 2-t-butoxycarbonylmethoxy-tricyclo[5.2.1.0$^{2,6}$]decanyl-2-propanol, thereby obtaining 2'-t-butoxycarbonylmethoxy-tricyclo[5.2.1.0$^{2",6"}$]decanyl-2'-propyl methacrylate.

Synthesis Example 34

The same procedures as explained in the above Synthesis Example 31 were repeated except that 2-t-butoxycarbonylmethoxycyclohexyl-2-propanol was replaced by 2-t-butoxycarbonylmethoxy-tetracyclo[6.2.1.1$^{3,6}$.0$^{2,7}$]dodecanyl-2-propanol, thereby obtaining 2'-t-butoxycarbonylmethoxy-tetracyclo[6.2.1.1$^{3",6"}$.0$^{2",7"}$]dodecanyl-2'-propyl methacrylate.

Synthesis Example 35

The same procedures as explained in the above Synthesis Example 31 were repeated except that 2-t-butoxycarbonylmethoxycyclohexyl-2-propanol was replaced by t-butoxycarbonylmethoxymethyl-tricyclo[3.3.1.1$^{3,7}$]decanyl alcohol, thereby obtaining t-butoxycarbonylmethoxymethyl-tricyclo[3.3.1.1$^{3,7}$]decanyl methacrylate.

Synthesis Example 36

The same procedures as explained in the above Synthesis Example 31 were repeated except that 2-t-butoxycarbonylmethoxycyclohexyl-2-propanol was replaced by 2-t-butyldimethylsiloxycyclohexyl-2-propanol, thereby obtaining 2'-t-butyldimethylsiloxycyclohexyl-2'-propyl methacrylate.

Synthesis Example 37

The same procedures as explained in the above Synthesis Example 31 were repeated except that 2-t-butoxycarbonylmethoxycyclohexyl-2-propanol was replaced by 2-t-butyldimethylsiloxy-tricyclo[3.3.1.1$^{3,7}$]decanyl-2-propanol, thereby obtaining 2'-t-butyldimethylsiloxy-tricyclo[3.3.1.1$^{3",7"}$]decanyl-2'-propyl methacrylate.

Synthesis Example 38

The same procedures as explained in the above Synthesis Example 31 were repeated except that 2-t-butoxycarbonylmethoxycyclohexyl-2-propanol was replaced by 2-t-butyldimethylsiloxy-tricyclo[5.2.1.0$^{2,6}$]decanyl-2-propanol, thereby obtaining 2'-t-butyldimethylsiloxy-tricyclo[5.2.1.0$^{2",6"}$]decanyl-2'-propyl methacrylate.

Synthesis Example 39

The same procedures as explained in the above Synthesis Example 31 were repeated except that 2-t-butoxycarbonylmethoxycyclohexyl-2-propanol was replaced by 2-t-butyldimethylsiloxy-tetracyclo[6.2.1.1$^{3,6}$.0$^{2,7}$]dodecanyl-2-propanol, thereby obtaining 2'-t-butyldimethylsiloxy-tetracyclo[6.2.1.1$^{3",6"}$.0$^{2",7"}$]dodecanyl-2'-propyl methacrylate.

Synthesis Example 40

The same procedures as explained in the above Synthesis Example 31 were repeated except that 2-t-butoxycarbonylmethoxycyclohexyl-2-propanol was replaced by t-butyldimethylsiloxymethyl-tricyclo[3.3.1.1$^{3,7}$]decanyl alcohol, thereby obtaining t-butyldimethylsiloxymethyl-tricyclo[3.3.1.1$^{3,7}$]decanyl methacrylate.

Synthesis Example 41

The same procedures as explained in the above Synthesis Example 31 were repeated except that 2-t-butoxycarbonylmethoxycyclohexyl-2-propanol was replaced by 2-tetrahydropyranyloxycarbonylmethoxycyclohexyl-2-propanol, thereby obtaining 2'-tetrahydropyranyloxycarbonylmethoxycyclohexyl-2'-propyl methacrylate.

Synthesis Example 42

The same procedures as explained in the above Synthesis Example 31 were repeated except that 2-t-butoxycarbonylmethoxycyclohexyl-2-propanol was replaced by 2-tetrahydropyranyloxycarbonylmethoxy-tricyclo[3.3.1.1$^{3,7}$]decanyl-2-propanol, thereby obtaining 2'-tetrahydropyranyloxycarbonylmethoxy-tricyclo[3.3.1.1$^{3",7"}$]decanyl-2'-propyl methacrylate.

Synthesis Example 43

The same procedures as explained in the above Synthesis Example 31 were repeated except that 2-t-butoxycarbonylmethoxycyclohexyl-2-propanol was replaced by 2-tetrahydropyranyloxycarbonylmethoxy-tricyclo[5.2.1.0$^{2,6}$]decanyl-2-propanol, thereby obtaining 2'-tetrahydropyranyloxycarbonylmethoxy-tetracyclo[5.2.1.0$^{2",6"}$]decanyl-2'-propyl methacrylate.

Synthesis Example 44

The same procedures as explained in the above Synthesis Example 31 were repeated except that 2-t-butoxycarbonylmethoxycyclohexyl-2-propanol was replaced by 2-tetrahydropyranyloxycarbonylmethoxy-tetracyclo[6.2.1.1$^{3,6}$.0$^{2,7}$]dodecanyl-2-propanol, thereby obtaining 2'-tetrahydropyranyloxycarbonylmethoxy-tetracyclo[6.2.1.1$^{3",6"}$.0$^{2",7"}$]dodecanyl-2'-propyl methacrylate.

Synthesis Example 45

The same procedures as explained in the above Synthesis Example 31 were repeated except that 2-t-butoxycarbonylmethoxycyclohexyl-2-propanol was replaced by tetrahydropyranyloxycarbonylmethoxymethyl-tricyclo[3.3.1.1$^{3,7}$]decanyl alcohol, thereby obtaining tetrahydropyranyloxycarbonylmethoxymethyl-tricyclo[3.3.1.1$^{3,7}$]decanyl methacrylate.

Synthesis Example 46

The same procedures as explained in the above Synthesis Example 31 were repeated except that 2-t-butoxycarbonylmethoxycyclohexyl-2-propanol was replaced by 2-di-t-butylmethylsiloxycyclohexyl-2-propanol, thereby obtaining 2'-di-t-butylmethylsiloxycyclohexyl-2'-propyl methacrylate.

Synthesis Example 47

The same procedures as explained in the above Synthesis Example 31 were repeated except that 2-t-butoxycarbonylmethoxycyclohexyl-2-propanol was replaced by 2-di-t-butylmethylsiloxy-tricyclo[3.3.1.1$^{3,7}$]decanyl-2-propanol, thereby obtaining 2'-di-t-butylmethylsiloxy-tricyclo[3.3.1.1$^{3",7"}$]decanyl-2'-propyl methacrylate.

Synthesis Example 48

The same procedures as explained in the above Synthesis Example 31 were repeated except that 2-t-butoxycarbonylmethoxycyclohexyl-2-propanol was replaced by 2-di-t-butylmethylsiloxy-tricyclo[5.2.1.0$^{2,6}$]decanyl-2-propanol, thereby obtaining 2'-di-t-butylmethylsiloxy-tricyclo[5.2.1.0$^{2",6"}$]decanyl-2'-propyl methacrylate.

Synthesis Example 49

The same procedures as explained in the above Synthesis Example 31 were repeated except that 2-t-butoxycarbonylmethoxycyclohexyl-2-propanol was replaced by 2-di-t-butylmethylsiloxy-tetracyclo[6.2.1.1$^{3,6}$.0$^{2,7}$]dodecanyl-2-propanol, thereby obtaining 2'-di-t-butylmethylsiloxy-tetracyclo[6.2.1.1$^{3",6"}$.0$^{2",7"}$]dodecanyl-2'-propyl methacrylate.

Synthesis Example 50

The same procedures as explained in the above Synthesis Example 31 were repeated except that 2-t-butoxycarbonylmethoxycyclohexyl-2-propanol was replaced by di-t-butylmethylsiloxymethyl-tricyclo[3.3.1.1$^{3,7}$]decanyl alcohol, thereby obtaining di-t-butylmethylsiloxymethyl-tricyclo[3.3.1.1$^{3,7}$]decanyl methacrylate.

Synthesis Example 51

The same procedures as explained in the above Synthesis Example 31 were repeated except that 2-t-butoxycarbonylmethoxycyclohexyl-2-propanol was replaced by 2-methoxycarbonylmethoxycyclohexyl-2-propanol, thereby obtaining 2'-methoxycarbonylmethoxycyclohexyl-2'-propyl methacrylate.

Synthesis Example 52

The same procedures as explained in the above Synthesis Example 31 were repeated except that 2-t-butoxycarbonylmethoxycyclohexyl-2-propanol was replaced by 2-methoxycarbonylmethoxy-tricyclo[3.3.1.1$^{3,7}$]decanyl-2-propanol, thereby obtaining 2'-methoxycarbonylmethoxy-tricyclo[3.3.1.1$^{3",7"}$]decanyl-2'-propyl methacrylate.

Synthesis Example 53

The same procedures as explained in the above Synthesis Example 31 were repeated except that 2-t-butoxycarbonylmethoxycyclohexyl-2-propanol was replaced by 2-methoxycarbonylmethoxy-tricyclo[5.2.1.0$^{2,6}$]decanyl-2-propanol, thereby obtaining 2'-methoxycarbonylmethoxy-tricyclo[5.2.1.0$^{2",6"}$]decanyl-2'-propyl methacrylate.

Synthesis Example 54

The same procedures as explained in the above Synthesis Example 31 were repeated except that 2-t-butoxycarbonylmethoxycyclohexyl-2-propanol was replaced by 2-methoxycarbonylmethoxy-tetracyclo[6.2.1.1$^{3,6}$.0$^{2,7}$]dodecanyl-2-propanol, thereby obtaining 2'-methoxycarbonylmethoxy-tetracyclo[6.2.1.1$^{3",6"}$.0$^{2",7"}$]dodecanyl-2'-propyl methacrylate.

Synthesis Example 55

The same procedures as explained in the above Synthesis Example 31 were repeated except that 2-t-butoxycarbonylmethoxycyclohexyl-2-propanol was replaced by methoxycarbonylmethoxymethyl-tricyclo[3.3.1.1$^{3,7}$]decanyl alcohol, thereby obtaining methoxycarbonylmethoxymethyl-tricyclo[3.3.1.1$^{3,7}$]decanyl methacrylate.

Synthesis Example 56

The same procedures as explained in the above Synthesis Example 31 were repeated except that 2-t-butoxycarbonylmethoxycyclohexyl-2-propanol was

Synthesis Example 57

The same procedures as explained in the above Synthesis Example 31 were repeated except that 2-t-butoxycarbonylmethoxycyclohexyl-2-propanol was replaced by 2-triisopropylsiloxy-tricyclo[3.3.1.1$^{3,7}$]decanyl-2-propanol, thereby obtaining 2'-triisopropylsiloxy-tricyclo[3.3.1.1$^{3",7"}$]decanyl-2'-propyl methacrylate.

Synthesis Example 58

The same procedures as explained in the above Synthesis Example 31 were repeated except that 2-t-butoxycarbonylmethoxycyclohexyl-2-propanol was replaced by 2-triisopropylsiloxy-tricyclo[5.2.1.0$^{2,6}$]decanyl-2-propanol, thereby obtaining 2'-triisopropylsiloxy-tricyclo[5.2.1.0$^{2",6"}$]decanyl-2'-propyl methacrylate.

Synthesis Example 59

The same procedures as explained in the above Synthesis Example 31 were repeated except that 2-t-butoxycarbonylmethoxycyclohexyl-2-propanol was replaced by 2-triisopropylsiloxy-tetracyclo[6.2.1.1$^{3,6}$.0$^{2,7}$]dodecanyl-2-propanol, thereby obtaining 2'-triisopropylsiloxy-tetracyclo[6.2.1.1$^{3",6"}$.0$^{2",7"}$]dodecanyl-2'-propyl methacrylate.

Synthesis Example 60

The same procedures as explained in the above Synthesis Example 31 were repeated except that 2-t-butoxycarbonylmethoxycyclohexyl-2-propanol was replaced by triisopropylsiloxymethyl-tricyclo[3.3.1.1$^{3,7}$]decanyl alcohol, thereby obtaining triisopropylsiloxymethyl-tricyclo[3.3.1.1$^{3,7}$]decanyl methacrylate.

Synthesis Example 61

The same procedures as explained in the above Synthesis Example 31 were repeated except that methacrylic chloride was replaced by acrylic chloride, thereby obtaining 2'-t-butoxycarbonylmethoxycyclohexyl-2'-propyl acrylate.

Synthesis Example 62

The same procedures as explained in the above Synthesis Example 61 were repeated except that 2-t-butoxycarbonylmethoxycyclohexyl-2-propanol was replaced by 2-t-butoxycarbonylmethoxy-tricyclo[3.3.1.1$^{3,7}$]decanyl-2-propanol, thereby obtaining 2'-t-butoxycarbonylmethoxy-tricyclo[3.3.1.1$^{3",7"}$]decanyl-2'-propyl acrylate.

Synthesis Example 63

The same procedures as explained in the above Synthesis Example 61 were repeated except that 2-t-butoxycarbonylmethoxycyclohexyl-2-propanol was replaced by 2-t-butoxycarbonylmethoxy-tricyclo[5.2.1.0$^{2,6}$]decanyl-2-propanol, thereby obtaining 2'-t-butoxycarbonylmethoxy-tricyclo[5.2.1.0$^{2",6"}$]decanyl-2'-propyl acrylate.

Synthesis Example 64

The same procedures as explained in the above Synthesis Example 61 were repeated except that 2-t-butoxycarbonylmethoxycyclohexyl-2-propanol was replaced by 2-t-butoxycarbonylmethoxy-tetracyclo[6.2.1.1$^{3,6}$.0$^{2,7}$]dodecanyl-2-propanol, thereby obtaining 2'-t-butoxycarbonylmethoxy-tetracyclo[6.2.1.1$^{3",6"}$.0$^{2",7"}$]dodecanyl-2'-propyl acrylate.

Synthesis Example 65

The same procedures as explained in the above Synthesis Example 61 were repeated except that 2-t-butoxycarbonylmethoxycyclohexyl-2-propanol was replaced by t-butoxycarbonylmethoxymethyl-tricyclo[3.3.1.1$^{3,7}$]decanyl alcohol, thereby obtaining t-butoxycarbonylmethoxymethyl-tricyclo[3.3.1.1$^{3,7}$]decanyl acrylate.

Synthesis Example 66

The same procedures as explained in the above Synthesis Example 61 were repeated except that 2-t-butoxycarbonylmethoxycyclohexyl-2-propanol was replaced by 2-t-butyldimethylsiloxycyclohexyl-2-propanol, thereby obtaining 2'-t-butyldimethylsiloxycyclohexyl-2'-propyl acrylate.

Synthesis Example 67

The same procedures as explained in the above Synthesis Example 61 were repeated except that 2-t-butoxycarbonylmethoxycyclohexyl-2-propanol was replaced by 2-t-butyldimethylsiloxy-tricyclo[3.3.1.1$^{3,7}$]decanyl-2-propanol, thereby obtaining 2'-t-butyldimethylsiloxy-tricyclo[3.3.1.1$^{3",7"}$]decanyl-2'-propyl acrylate.

Synthesis Example 68

The same procedures as explained in the above Synthesis Example 61 were repeated except that 2-t-butoxycarbonylmethoxycyclohexyl-2-propanol was replaced by 2-t-butyldimethylsiloxy-tricyclo[5.2.1.0$^{2,6}$]decanyl-2-propanol, thereby obtaining 2'-t-butyldimethylsiloxy-tricyclo[5.2.1.0$^{2",6"}$]decanyl-2'-propyl acrylate.

Synthesis Example 69

The same procedures as explained in the above Synthesis Example 61 were repeated except that 2-t-butoxycarbonylmethoxycyclohexyl-2-propanol was replaced by 2-t-butyldimethylsiloxy-tetracyclo[6.2.1.1$^{3,6}$.0$^{2,7}$]dodecanyl-2-propanol, thereby obtaining 2'-t-butyldimethylsiloxy-tetracyclo[6.2.1.1$^{3",6"}$.0$^{2",7"}$]dodecanyl-2'-propyl acrylate.

Synthesis Example 70

The same procedures as explained in the above Synthesis Example 61 were repeated except that 2-t-butoxycarbonylmethoxycyclohexyl-2-propanol was replaced by t-butyldimethylsiloxymethyl-tricyclo[3.3.1.1$^{3,7}$]decanyl alcohol, thereby obtaining t-butyldimethylsiloxymethyl-tricyclo[3.3.1.1$^{3,7}$]decanyl acrylate.

Synthesis Example 71

The same procedures as explained in the above Synthesis Example 61 were repeated except that 2-t-butoxycarbonylmethoxycyclohexyl-2-propanol was replaced by 2-tetrahydropyranyloxycarbonylmethoxycyclohexyl-2-propanol, thereby obtaining 2'-tetrahydropyranyloxycarbonylmethoxycyclohexyl-2'-propyl acrylate.

Synthesis Example 72

The same procedures as explained in the above Synthesis Example 61 were repeated except that 2-t-butoxycarbonylmethoxycyclohexyl-2-propanol was replaced by 2-tetrahydropyranyloxycarbonylmethoxy-tricyclo[3.3.1.1$^{3,7}$]decanyl-2-propanol, thereby obtaining 2'-tetrahydropyranyloxycarbonylmethoxy-tricyclo[3.3.1.1$^{3'',7''}$]decanyl-2'-propyl acrylate.

Synthesis Example 73

The same procedures as explained in the above Synthesis Example 61 were repeated except that 2-t-butoxycarbonylmethoxycyclohexyl-2-propanol was replaced by 2-tetrahydropyranyloxycarbonylmethoxy-tricyclo[5.2.1.0$^{2,6}$]decanyl-2-propanol, thereby obtaining 2'-tetrahydropyranyloxycarbonylmethoxy-tricyclo[5.2.1.0$^{2'',6''}$]decanyl-2'-propyl acrylate.

Synthesis Example 74

The same procedures as explained in the above Synthesis Example 61 were repeated except that 2-t-butoxycarbonylmethoxycyclohexyl-2-propanol was replaced by 2-tetrahydropyranyloxycarbonylmethoxy-tetracyclo[6.2.1.1$^{3,6}$.0$^{2,7}$]dodecanyl-2-propanol, thereby obtaining 2'-tetrahydropyranyloxycarbonylmethoxy-tetracyclo[6.2.1.1$^{3'',6''}$.0$^{2'',7''}$]dodecanyl-2'-propyl acrylate.

Synthesis Example 75

The same procedures as explained in the above Synthesis Example 61 were repeated except that 2-t-butoxycarbonylmethoxycyclohexyl-2-propanol was replaced by tetrahydropyranyloxycarbonylmethoxymethyl-tricyclo[3.3.1.1$^{3,7}$]decanyl alcohol, thereby obtaining tetrahydropyranyloxycarbonylmethoxymethyl-tricyclo[3.3.1.1$^{3,7}$]decanyl acrylate.

Synthesis Example 76

The same procedures as explained in the above Synthesis Example 61 were repeated except that 2-t-butoxycarbonylmethoxycyclohexyl-2-propanol was replaced by 2-di-t-butylmethylsiloxycyclohexyl-2-propanol, thereby obtaining 2'-di-t-butylmethylsiloxycyclohexyl-2'-propyl acrylate.

Synthesis Example 77

The same procedures as explained in the above Synthesis Example 61 were repeated except that 2-t-butoxycarbonylmethoxycyclohexyl-2-propanol was replaced by 2-di-t-butylmethylsiloxy-tricyclo[3.3.1.1$^{3,7}$]decanyl-2-propanol, thereby obtaining 2'-di-t-butylmethylsiloxy-tricyclo[3.3.1.1$^{3'',7''}$]decanyl-2'-propyl acrylate.

Synthesis Example 78

The same procedures as explained in the above Synthesis Example 61 were repeated except that 2-t-butoxycarbonylmethoxycyclohexyl-2-propanol was replaced by 2-di-t-butylmethylsiloxy-tricyclo[5.2.1.0$^{2,6}$]decanyl-2-propanol, thereby obtaining 2'-di-t-butylmethylsiloxy-tetracyclo[5.2.1.0$^{2'',6''}$]decanyl-2'-propyl acrylate.

Synthesis Example 79

The same procedures as explained in the above Synthesis Example 61 were repeated except that 2-t-butoxycarbonylmethoxycyclohexyl-2-propanol was replaced by 2-di-t-butylmethylsiloxy-tetracyclo[6.2.1.1$^{3,6}$.0$^{2,7}$]dodecanyl-2-propanol, thereby obtaining 2'-di-t-butylmethylsiloxy-tetracyclo[6.2.1.1$^{3'',6''}$.0$^{2'',7''}$]dodecanyl-2'-propyl acrylate.

Synthesis Example 80

The same procedures as explained in the above Synthesis Example 61 were repeated except that 2-t-butoxycarbonylmethoxycyclohexyl-2-propanol was replaced by di-t-butylmethylsiloxymethyl-tricyclo[3.3.1.1$^{3,7}$]decanyl alcohol, thereby obtaining di-t-butylmethylsiloxymethyl-tricyclo[3.3.1.1$^{3,7}$]decanyl acrylate.

Synthesis Example 81

The same procedures as explained in the above Synthesis Example 61 were repeated except that 2-t-butoxycarbonylmethoxycyclohexyl-2-propanol was replaced by 2-methoxycarbonylmethoxycyclohexyl-2-propanol, thereby obtaining 2'-methoxycarbonylmethoxycyclohexyl-2'-propyl acrylate.

Synthesis Example 82

The same procedures as explained in the above Synthesis Example 61 were repeated except that 2-t-butoxycarbonylmethoxycyclohexyl-2-propanol was replaced by 2-methoxycarbonylmethoxy-tricyclo[3.3.1.1$^{3,7}$]decanyl-2-propanol, thereby obtaining 2'-methoxycarbonylmethoxy-tricyclo[3.3.1.1$^{3'',7''}$]decanyl-2'-propyl acrylate.

Synthesis Example 83

The same procedures as explained in the above Synthesis Example 61 were repeated except that 2-t-butoxycarbonylmethoxycyclohexyl-2-propanol was replaced by 2-methoxycarbonylmethoxy-tricyclo[5.2.1.0$^{2,6}$]decanyl-2-propanol, thereby obtaining 2'-methoxycarbonylmethoxy-tricyclo[5.2.1.0$^{2'',6''}$]decanyl-2'-propyl acrylate.

Synthesis Example 84

The same procedures as explained in the above Synthesis Example 61 were repeated except that 2-t-butoxycarbonylmethoxycyclohexyl-2-propanol was replaced by 2-methoxycarbonylmethoxy-tetracyclo[6.2.1.1$^{3,6}$.0$^{2,7}$]dodecanyl-2-propanol, thereby obtaining 2'-methoxycarbonylmethoxy-tetracyclo[6.2.1.1$^{3'',6''}$.0$^{2'',7''}$]dodecanyl-2'-propyl acrylate.

Synthesis Example 85

The same procedures as explained in the above Synthesis Example 61 were repeated except that 2-t-butoxycarbonylmethoxycyclohexyl-2-propanol was replaced by methoxycarbonylmethoxymethyl-tricyclo[3.3.1.1$^{3,7}$]decanyl alcohol, thereby obtaining methoxycarbonylmethoxymethyl-tricyclo[3.3.1.1$^{3,7}$]decanyl acrylate.

Synthesis Example 86

The same procedures as explained in the above Synthesis Example 61 were repeated except that 2-t- butoxycarbonylmethoxycyclohexyl-2-propanol was replaced by 2-triisopropylsiloxycyclohexyl-2-propanol, thereby obtaining 2'-triisopropylsiloxycyclohexyl-2'-propyl acrylate.

Synthesis Example 87

The same procedures as explained in the above Synthesis Example 61 were repeated except that 2-t-butoxycarbonylmethoxycyclohexyl-2-propanol was replaced by 2-triisopropylsiloxy-tricyclo[$3.3.1.1^{3,7}$]decanyl-2-propanol, thereby obtaining 2'-triisopropylsiloxy-tricyclo[$3.3.1.1^{3'',7''}$]decanyl-2'-propyl acrylate.

Synthesis Example 88

The same procedures as explained in the above Synthesis Example 61 were repeated except that 2-t-butoxycarbonylmethoxycyclohexyl-2-propanol was replaced by 2-triisopropylsiloxy-tricyclo[$5.2.1.0^{2,6}$]decanyl-2-propanol, thereby obtaining 2'-triisopropylsiloxy-tricyclo[$5.2.1.0^{2'',6''}$]decanyl-2'-propyl acrylate.

Synthesis Example 89

The same procedures as explained in the above Synthesis Example 61 were repeated except that 2-t-butoxycarbonylmethoxycyclohexyl-2-propanol was replaced by 2-triisopropylsiloxy-tetracyclo[$6.2.1.1^{3,6}.0^{2,7}$]dodecanyl-2-propanol, thereby obtaining 2'-triisopropylsiloxy-tetracyclo[$6.2.1.1^{3'',6''}.0^{2'',7''}$]dodecanyl-2'-propyl acrylate.

Synthesis Example 90

The same procedures as explained in the above Synthesis Example 61 were repeated except that 2-t-butoxycarbonylmethoxycyclohexyl-2-propanol was replaced by triisopropylsiloxymethyl-tricyclo[$3.3.1.1^{3,7}$] decanyl alcohol, thereby obtaining triisopropylsiloxymethyl-tricyclo[$3.3.1.1^{3,7}$]decanyl acrylate.

Synthesis Example 91

The same procedures as explained in the above Synthesis Example 31 were repeated except that methacrylic chloride was replaced by cyanoacrylic chloride, thereby obtaining 2'-t-butoxycarbonylmethoxycyclohexyl-2'-propyl cyanoacrylate.

Synthesis Example 92

The same procedures as explained in the above Synthesis Example 91 were repeated except that 2-t-butoxycarbonylmethoxycyclohexyl-2-propanol was replaced by 2-t-butoxycarbonylmethoxy-tricyclo[$3.3.1.^{3,7}$]decanyl-2-propanol, thereby obtaining 2'-t-butoxycarbonylmethoxy-tricyclo[$3.3.1.1^{3'',7''}$]decanyl-2'-propyl cyanoacrylate.

Synthesis Example 93

The same procedures as explained in the above Synthesis Example 91 were repeated except that 2-t-butoxycarbonylmethoxycyclohexyl-2-propanol was replaced by 2-t-butoxycarbonylmethoxy-tricyclo[$5.2.1.0^{2,6}$] decanyl-2-propanol, thereby obtaining 2'-t-butoxycarbonylmethoxy-tricyclo[$5.2.1.0^{2'',6''}$]decanyl-2'-propyl cyanoacrylate.

Synthesis Example 94

The same procedures as explained in the above Synthesis Example 91 were repeated except that 2-t-butoxycarbonylmethoxycyclohexyl-2-propanol was replaced by 2-t-butoxycarbonylmethoxy-tetracyclo[$6.2.1.1^{3,6}.0^{2,7}$]dodecanyl-2-propanol, thereby obtaining 2'-t-butoxycarbonylmethoxy-tetracyclo[$6.2.1.1^{3'',6''}.0^{2'',7''}$] dodecanyl-21-propyl cyanoacrylate.

Synthesis Example 95

The same procedures as explained in the above Synthesis Example 91 were repeated except that 2-t-butoxycarbonylmethoxycyclohexyl-2-propanol was replaced by t-butoxycarbonylmethoxymethyl-tricyclo [$3.3.1.1^{3,7}$]decanyl alcohol, thereby obtaining t-butoxycarbonylmethoxymethyl-tricyclo[$3.3.1.1^{3,7}$] decanyl cyanoacrylate.

Synthesis Example 96

The same procedures as explained in the above Synthesis Example 91 were repeated except that 2-t-butoxycarbonylmethoxycyclohexyl-2-propanol was replaced by 2-t-butyldimethylsiloxycyclohexyl-2-propanol, thereby obtaining 2'-t-butyldimethylsiloxycyclohexyl-2'-propyl cyanoacrylate.

Synthesis Example 97

The same procedures as explained in the above Synthesis Example 91 were repeated except that 2-t-butoxycarbonylmethoxycyclohexyl-2-propanol was replaced by 2-t-butyldimethylsiloxy-tricyclo[$3.3.1.1^{3,7}$] decanyl-2-propanol, thereby obtaining 2'-t-butyldimethylsiloxy-tricyclo[$3.3.1.1^{3'',7''}$]decanyl-2'-propyl cyanoacrylate.

Synthesis Example 98

The same procedures as explained in the above Synthesis Example 91 were repeated except that 2-t-butoxycarbonylmethoxycyclohexyl-2-propanol was replaced by 2-t-butyldimethylsiloxy-tricyclo[$5.2.1.0^{2,6}$] decanyl-2-propanol, thereby obtaining 2'-t-butyldimethylsiloxy-tricyclo[$5.2.1.0^{2'',6''}$]decanyl-2'-propyl cyanoacrylate.

Synthesis Example 99

The same procedures as explained in the above Synthesis Example 91 were repeated except that 2-t-butoxycarbonylmethoxycyclohexyl-2-propanol was replaced by 2-t-butyldimethylsiloxy-tetracyclo[$6.2.1.1^{3,6}.0^{2,7}$]dodecanyl-2-propanol, thereby obtaining 2'-t-butyldimethylsiloxy-tetracyclo[$6.2.1.1^{3'',6''}.0^{2'',7''}$] dodecanyl-2'-propyl cyanoacrylate.

Synthesis Example 100

The same procedures as explained in the above Synthesis Example 91 were repeated except that 2-t-butoxycarbonylmethoxycyclohexyl-2-propanol was replaced by t-butyldimethylsiloxymethyl-tricyclo[$3.3.1.1^{3,7}$]decanyl alcohol, thereby obtaining t-butyldimethylsiloxymethyl-tricyclo[$3.3.1.1^{3,7}$]decanyl cyanoacrylate.

Synthesis Example 101

The same procedures as explained in the above Synthesis Example 91 were repeated except that 2-t-butoxycarbonylmethoxycyclohexyl-2-propanol was replaced by 2-tetrahydropyranyloxycarbonylmethoxycyclohexyl-2-propanol, thereby obtaining 2'-tetrahydropyranyloxycarbonylmethoxycyclohexyl-2'-propyl cyanoacrylate.

Synthesis Example 102

The same procedures as explained in the above Synthesis Example 91 were repeated except that 2-t-butoxycarbonylmethoxycyclohexyl-2-propanol was replaced by 2-tetrahydropyranyloxycarbonylmethoxy-tricyclo[3.3.1.1$^{3,7}$]decanyl-2-propanol, thereby obtaining 2'-tetrahydropyranyloxycarbonylmethoxy-tricyclo[3.3.1.1$^{3'',7''}$]decanyl-2'-propyl cyanoacrylate.

Synthesis Example 103

The same procedures as explained in the above Synthesis Example 91 were repeated except that 2-t-butoxycarbonylmethoxycyclohexyl-2-propanol was replaced by 2-tetrahydropyranyloxycarbonylmethoxy-tricyclo[5.2.1.0$^{2,6}$]decanyl-2-propanol, thereby obtaining 2'-tetrahydropyranyloxycarbonylmethoxy-tricyclo[5.2.1.0$^{2'',6''}$]decanyl-2'-propyl cyanoacrylate.

Synthesis Example 104

The same procedures as explained in the above Synthesis Example 91 were repeated except that 2-t-butoxycarbonylmethoxycyclohexyl-2-propanol was replaced by 2-tetrahydropyranyloxycarbonylmethoxy-tetracyclo[6.2.1.1$^{3,6}$.0$^{2,7}$]dodecanyl-2-propanol, thereby obtaining 2'-tetrahydropyranyloxycarbonylmethoxy-tetracyclo[6.2.1.1$^{3'',6''}$.0$^{2'',7''}$]dodecanyl-2'cyanoacrylate.

Synthesis Example 105

The same procedures as explained in the above Synthesis Example 91 were repeated except that 2-t-butoxycarbonylmethoxycyclohexyl-2-propanol was replaced by tetrahydropyranyloxycarbonylmethoxymethyl-tricyclo[3.3.1.1$^{3,7}$]decanyl alcohol, thereby obtaining tetrahydropyranyloxycarbonylmethoxymethyl-tricyclo[3.3.1.1$^{3,7}$]decanyl cyanoacrylate.

Synthesis Example 106

The same procedures as explained in the above Synthesis Example 91 were repeated except that 2-t-butoxycarbonylmethoxycyclohexyl-2-propanol was replaced by 2-di-t-butylmethylsiloxycyclohexyl-2-propanol, thereby obtaining 2'-di-t-butylmethylsiloxycyclohexyl-2'-propyl cyanoacrylate.

Synthesis Example 107

The same procedures as explained in the above Synthesis Example 91 were repeated except that 2-t-butoxycarbonylmethoxycyclohexyl-2-propanol was replaced by 2-di-t-butylmethylsiloxy-tricyclo[3.3.1.1$^{3,7}$]decanyl-2-propanol, thereby obtaining 2'-di-t-butylmethylsiloxy-tricyclo[3.3.1.1$^{3'',7''}$]decanyl-2'-propyl cyanoacrylate.

Synthesis Example 108

The same procedures as explained in the above Synthesis Example 91 were repeated except that 2-t-butoxycarbonylmethoxycyclohexyl-2-propanol was replaced by 2-di-t-butylmethylsiloxy-tricyclo[5.2.1.0$^{2,6}$]decanyl-2-propanol, thereby obtaining 2'-di-t-butylmethylsiloxy-tricyclo[5.2.1.0$^{2'',6''}$]decanyl-2'-propyl cyanoacrylate.

Synthesis Example 109

The same procedures as explained in the above Synthesis Example 91 were repeated except that 2-t-butoxycarbonylmethoxycyclohexyl-2-propanol was replaced by 2-di-t-butylmethylsiloxy-tetracyclo[6.2.1.1$^{3,6}$.0$^{2,7}$]dodecanyl-2-propanol, thereby obtaining 2'-di-t-butylmethylsiloxy-tetracyclo[6.2.1.1$^{3'',6''}$.0$^{2'',7''}$]dodecanyl-2'-propyl cyanoacrylate.

Synthesis Example 110

The same procedures as explained in the above Synthesis Example 91 were repeated except that 2-t-butoxycarbonylmethoxycyclohexyl-2-propanol was replaced by di-t-butylmethylsiloxymethyl-tricyclo[3.3.1.1$^{3,7}$]decanyl alcohol, thereby obtaining di-t-butylmethylsiloxymethyl-tricyclo[3.3.1.1$^{3,7}$]decanyl cyanoacrylate.

Synthesis Example 111

The same procedures as explained in the above Synthesis Example 91 were repeated except that 2-t-butoxycarbonylmethoxycyclohexyl-2-propanol was replaced by 2-methoxycarbonylmethoxycyclohexyl-2-propanol, thereby obtaining 2'-methoxycarbonylmethoxycyclohexyl-2'-propyl cyanoacrylate.

Synthesis Example 112

The same procedures as explained in the above Synthesis Example 91 were repeated except that 2-t-butoxycarbonylmethoxycyclohexyl-2-propanol was replaced by 2-methoxycarbonylmethoxy-tricyclo[3.3.1.1$^{3,7}$]decanyl-2-propanol, thereby obtaining 2'-methoxycarbonylmethoxy-tricyclo[3.3.1.1$^{3'',7''}$]decanyl-2'-propyl cyanoacrylate.

Synthesis Example 113

The same procedures as explained in the above Synthesis Example 91 were repeated except that 2-t-butoxycarbonylmethoxycyclohexyl-2-propanol was replaced by 2-methoxycarbonylmethoxy-tricyclo[5.2.1.0$^{2,6}$]decanyl-2propanol, thereby obtaining 2'-methoxycarbonylmethoxy-tricyclo[5.2.1.0$^{2'',6''}$]decanyl-2'-propyl cyanoacrylate.

Synthesis Example 114

The same procedures as explained in the above Synthesis Example 91 were repeated except that 2-t-butoxycarbonylmethoxycyclohexyl-2-propanol was replaced by 2-methoxycarbonylmethoxy-tetracyclo[6.2.1.1$^{3,6}$.0$^{2,7}$]dodecanyl-2-propanol, thereby obtaining 2'-methoxycarbonylmethoxy-tetracyclo[6.2.1.1$^{3'',6''}$.0$^{2'',7''}$]dodecanyl-2'-propyl cyanoacrylate.

Synthesis Example 115

The same procedures as explained in the above Synthesis Example 91 were repeated except that 2-t-butoxycarbonylmethoxycyclohexyl-2-propanol was replaced by methoxycarbonylmethoxymethyl-tricyclo[3.3.1.1$^{3,7}$]decanyl alcohol, thereby obtaining methoxycarbonylmethoxymethyl-tricyclo[3.3.1.1$^{3,7}$]decanyl cyanoacrylate.

Synthesis Example 116

The same procedures as explained in the above Synthesis Example 91 were repeated except that 2-t- butoxycarbonylmethoxycyclohexyl-2-propanol was replaced by 2-triisopropylsiloxycyclohexyl-2-propanol, thereby obtaining 2'-triisopropylsiloxycyclohexyl-2'-propyl cyanoacrylate.

Synthesis Example 117

The same procedures as explained in the above Synthesis Example 91 were repeated except that 2-t-butoxycarbonylmethoxycyclohexyl-2-propanol was replaced by 2-triisopropylsiloxy-tricyclo[$3.3.1.1^{3,7}$]decanyl-2-propanol, thereby obtaining 2'-triisopropylsiloxy-tricyclo[$3.3.1.1^{3'',7''}$]decanyl-2'-propyl cyanoacrylate.

Synthesis Example 118

The same procedures as explained in the above Synthesis Example 91 were repeated except that 2-t-butoxycarbonylmethoxycyclohexyl-2-propanol was replaced by 2-triisopropylsiloxy-tricyclo[$5.2.1.0^{2,6}$]decanyl-2-propanol, thereby obtaining 2'-triisopropylsiloxy-tricyclo[$5.2.1.0^{2'',6''}$]decanyl-2'-propyl cyanoacrylate.

Synthesis Example 119

The same procedures as explained in the above Synthesis Example 91 were repeated except that 2-t-butoxycarbonylmethoxycyclohexyl-2-propanol was replaced by 2-triisopropylsiloxy-tetracyclo[$6.2.1.1^{3,6}.0^{2,7}$]dodecanyl-2-propanol, thereby obtaining 2'-triisopropylsiloxy-tetracyclo[$6.2.1.1^{3'',6''}.0^{2'',7''}$]dodecanyl-2'-propyl cyanoacrylate.

Synthesis Example 120

The same procedures as explained in the above Synthesis Example 91 were repeated except that 2-t-butoxycarbonylmethoxycyclohexyl-2-propanol was replaced by triisopropylsiloxymethyl-tricyclo[$3.3.1.1^{3,7}$]decanyl alcohol, thereby obtaining triisopropylsiloxymethyl-tricyclo[$3.3.1.1,^{3,7}$]decanyl cyanoacrylate.

Synthesis Example 121

The same procedures as explained in the above Synthesis Example 31 were repeated except that methacrylic chloride was replaced by chloroacrylic chloride, thereby obtaining 2'-t-butoxycarbonylmethoxycyclohexyl-2'-propyl chloroacrylate.

Synthesis Example 122

The same procedures as explained in the above Synthesis Example 121 were repeated except that 2-t-butoxycarbonylmethoxycyclohexyl-2-propanol was replaced by 2-t-butoxycarbonylmethoxy-tricyclo[$3.3.1.1^{3,7}$]decanyl-2-propanol, thereby obtaining 2'-t-butoxycarbonylmethoxy-tricyclo[$3.3.1.1^{3'',7''}$]decanyl-2'-propyl chloroacrylate.

Synthesis Example 123

The same procedures as explained in the above Synthesis Example 121 were repeated except that 2-t-butoxycarbonylmethoxycyclohexyl-2-propanol was replaced by 2-t-butoxycarbonylmethoxy-tricyclo[$5.2.1.0^{2,6}$]decanyl-2-propanol, thereby obtaining 2'-t-butoxycarbonylmethoxy-tricyclo[$5.2.1.0^{2'',6''}$]decanyl-2'-propyl chloroacrylate.

Synthesis Example 124

The same procedures as explained in the above Synthesis Example 121 were repeated except that 2-t-butoxycarbonylmethoxycyclohexyl-2-propanol was replaced by 2-t-butoxycarbonylmethoxy-tetracyclo[$6.2.1.1^{3,6}.0^{2,7}$]dodecanyl-2-propanol, thereby obtaining 2'-t-butoxycarbonylmethoxy-tetracyclo[$6.2.1.1^{3'',6''}.0^{2'',7''}$]dodecanyl-2'-propyl chloroacrylate.

Synthesis Example 125

The same procedures as explained in the above Synthesis Example 121 were repeated except that 2-t-butoxycarbonylmethoxycyclohexyl-2-propanol was replaced by t-butoxycarbonylmethoxymethyl-tricyclo[$3.3.1.1^{3,7}$]decanyl alcohol, thereby obtaining t-butoxycarbonylmethoxymethyl-tricyclo[$3.3.1.1^{3,7}$]decanyl chloroacrylate.

Synthesis Example 126

The same procedures as explained in the above Synthesis Example 121 were repeated except that 2-t-butoxycarbonylmethoxycyclohexyl-2-propanol was replaced by 2-t-butyldimethylsiloxycyclohexyl-2-propanol, thereby obtaining 2'-t-butyldimethylsiloxycyclohexyl-2'-propyl chloroacrylate.

Synthesis Example 127

The same procedures as explained in the above Synthesis Example 121 were repeated except that 2-t-butoxycarbonylmethoxycyclohexyl-2-propanol was replaced by 2-t-butyldimethylsiloxy-tricyclo[$3.3.1.1^{3,7}$]decanyl-2-propanol, thereby obtaining 2'-t-butyldimethylsiloxy-tricyclo[$3.3.1.1^{3'',7''}$]decanyl-2'-propyl chloroacrylate.

Synthesis Example 128

The same procedures as explained in the above Synthesis Example 121 were repeated except that 2-t-butoxycarbonylmethoxycyclohexyl-2-propanol was replaced by 2-t-butyldimethylsiloxy-tricyclo[$5.2.1.0^{2,6}$]decanyl-2-propanol, thereby obtaining 2'-t-butyldimethylsiloxy-tricyclo[$5.2.1.0^{2'',6''}$]decanyl-2'-propyl chloroacrylate.

Synthesis Example 129

The same procedures as explained in the above Synthesis Example 121 were repeated except that 2-t-butoxycarbonylmethoxycyclohexyl-2-propanol was replaced by 2-t-butyldimethylsiloxy-tetracyclo[$6.2.1.1^{3,6}.0^{2,7}$]dodecanyl-2-propanol, thereby obtaining 2'-t-butyldimethylsiloxy-tetracyclo[$6.2.1.1^{3'',6''}.0^{2'',7''}$]dodecanyl-2'-propyl chloroacrylate.

Synthesis Example 130

The same procedures as explained in the above Synthesis Example 121 were repeated except that 2-t-butoxycarbonylmethoxycyclohexyl-2-propanol was replaced by 2-t-butyldimethylsiloxymethyl-tricyclo[$3.3.1.1^{3,7}$]decanyl alcohol, thereby obtaining t-butyldimethylsiloxymethyl-tricyclo[$3.3.1.1^{3,7}$]decanyl chloroacrylate.

Synthesis Example 131

The same procedures as explained in the above Synthesis Example 121 were repeated except that 2-t-butoxycarbonylmethoxycyclohexyl-2-propanol was replaced by 2-tetrahydropyranyloxycarbonylmethoxycyclohexyl-2-propanol, thereby obtaining 2'-tetrahydropyranyloxycarbonylmethoxycyclohexyl-2'-propyl chloroacrylate.

Synthesis Example 132

The same procedures as explained in the above Synthesis Example 121 were repeated except that 2-t-butoxycarbonylmethoxycyclohexyl-2-propanol was replaced by 2-tetrahydropyranyloxycarbonylmethoxy-tricyclo[$3.3.1.1^{3,7}$]decanyl-2-propanol, thereby obtaining 2'-tetrahydropyranyloxycarbonylmethoxy-tricyclo[$3.3.1.1^{3'',7''}$]decanyl-2'-propyl chloroacrylate.

Synthesis Example 133

The same procedures as explained in the above Synthesis Example 121 were repeated except that 2-t-butoxycarbonylmethoxycyclohexyl-2-propanol was replaced by 2-tetrahydropyranyloxycarbonylmethoxy-tricyclo[$5.2.1.0^{2,6}$]decanyl-2-propanol, thereby obtaining 2'-tetrahydropyranyloxycarbonylmethoxy-tricyclo[$5.2.1.0^{2'',6''}$]decanyl-2'-propyl chloroacrylate.

Synthesis Example 134

The same procedures as explained in the above Synthesis Example 121 were repeated except that 2-t-butoxycarbonylmethoxycyclohexyl-2-propanol was replaced by 2-tetrahydropyranyloxycarbonylmethoxy-tetracyclo[$6.2.1.1^{3,6}.0^{2,7}$]dodecanyl-2-propanol, thereby obtaining 2'-tetrahydropyranyloxycarbonylmethoxy-tetracyclo[$6.2.1.1^{3'',6''}.0^{2'',7''}$]dodecanyl-2'-propyl chloroacrylate.

Synthesis Example 135

The same procedures as explained in the above Synthesis Example 121 were repeated except that 2-t-butoxycarbonylmethoxycyclohexyl-2-propanol was replaced by tetrahydropyranyloxycarbonylmethoxymethyl-tricyclo[$3.3.1.1^{3,7}$]decanyl alcohol, thereby obtaining tetrahydropyranyloxycarbonylmethoxymethyl-tricyclo[$3.3.1.1^{3,7}$]decanyl chloroacrylate.

Synthesis Example 136

The same procedures as explained in the above Synthesis Example 121 were repeated except that 2-t-butoxycarbonylmethoxycyclohexyl-2-propanol was replaced by 2-di-t-butylmethylsiloxycyclohexyl-2-propanol, thereby obtaining 2'-di-t-butylmethylsiloxycyclohexyl-2'-propyl chloroacrylate.

Synthesis Example 137

The same procedures as explained in the above Synthesis Example 121 were repeated except that 2-t-butoxycarbonylmethoxycyclohexyl-2-propanol was replaced by 2-di-t-butylmethylsiloxy-tricyclo[$3.3.1.1^{3,7}$]decanyl-2-propanol, thereby obtaining 2'-di-t-butylmethylsiloxy-tricyclo[$3.3.1.1^{3'',7''}$]decanyl-2'-propyl chloroacrylate.

Synthesis Example 138

The same procedures as explained in the above Synthesis Example 121 were repeated except that 2-t-butoxycarbonylmethoxycyclohexyl-2-propanol was replaced by 2-di-t-butylmethylsiloxy-tricyclo[$5.2.1.0^{2,6}$] decanyl-2-propanol, thereby obtaining 2'-di-t-butylmethylsiloxy-tricyclo[$5.2.1.0^{2'',6''}$]decanyl-2'-propyl chloroacrylate.

Synthesis Example 139

The same procedures as explained in the above Synthesis Example 121 were repeated except that 2-t-butoxycarbonylmethoxycyclohexyl-2-propanol was replaced by 2-di-t-butylmethylsiloxy-tetracyclo[$6.2.1.1^{3,6}.0^{2,7}$]dodecanyl-2-propanol, thereby obtaining 2'-di-t-butylmethylsiloxy-tetracyclo[$6.2.1.1^{3'',6''}.0^{2'',7''}$]dodecanyl-2'-propyl chloroacrylate.

Synthesis Example 140

The same procedures as explained in the above Synthesis Example 121 were repeated except that 2-t-butoxycarbonylmethoxycyclohexyl-2-propanol was replaced by di-t-butylmethylsiloxymethyl-tricyclo[$3.3.1.1^{3,7}$]decanyl alcohol, thereby obtaining di-t-butylmethylsiloxymethyl-tricyclo[$3.3.1.1^{3,7}$]decanyl chloroacrylate.

Synthesis Example 141

The same procedures as explained in the above Synthesis Example 121 were repeated except that 2-t-butoxycarbonylmethoxycyclohexyl-2-propanol was replaced by 2-methoxycarbonylmethoxycyclohexyl-2-propanol, thereby obtaining 2'-methoxycarbonylmethoxycyclohexyl-2'-propyl chloroacrylate.

Synthesis Example 142

The same procedures as explained in the above Synthesis Example 121 were repeated except that 2-t-butoxycarbonylmethoxycyclohexyl-2-propanol was replaced by 2-methoxycarbonylmethoxy-tricyclo[$3.3.1.1^{3,7}$]decanyl-2-propanol, thereby obtaining 2'-methoxycarbonylmethoxy-tricyclo[$3.3.1.1^{3'',7''}$]decanyl-2'-propyl chloroacrylate.

Synthesis Example 143

The same procedures as explained in the above Synthesis Example 121 were repeated except that 2-t-butoxycarbonylmethoxycyclohexyl-2-propanol was replaced by 2-methoxycarbonylmethoxy-tricyclo[$5.2.1.0^{2,6}$]decanyl-2-propanol, thereby obtaining 2'-methoxycarbonylmethoxy-tricyclo[$5.2.1.0^{2'',6''}$]decanyl-2'-propyl chloroacrylate.

Synthesis Example 144

The same procedures as explained in the above Synthesis Example 121 were repeated except that 2-t-butoxycarbonylmethoxycyclohexyl-2-propanol was replaced by 2-methoxycarbonylmethoxy-tetracyclo[$6.2.1.1^{3,6}.0^{2,7}$]dodecanyl-2-propanol, thereby obtaining 2'-methoxycarbonylmethoxy-tetracyclo[$6.2.1.1^{3'',6''}.0^{2'',7''}$]dodecanyl-2'-propyl chloroacrylate.

Synthesis Example 145

The same procedures as explained in the above Synthesis Example 121 were repeated except that 2-t-butoxycarbonylmethoxycyclohexyl-2-propanol was replaced by methoxycarbonylmethoxymethyl-tricyclo[$3.3.1.1^{3,7}$]decanyl alcohol, thereby obtaining methoxycarbonylmethoxymethyl- tricyclo[3.3.1.1$^{3,7}$] decanyl chloroacrylate.

Synthesis Example 146

The same procedures as explained in the above Synthesis Example 121 were repeated except that 2-t-butoxycarbonylmethoxycyclohexyl-2-propanol was replaced by 2-triisopropylsiloxycyclohexyl-2-propanol, thereby obtaining 2'-triisopropylsiloxycyclohexyl-2'-propyl chloroacrylate.

Synthesis Example 147

The same procedures as explained in the above Synthesis Example 121 were repeated except that 2-t-butoxycarbonylmethoxycyclohexyl-2-propanol was replaced by 2-triisopropylsiloxy-tricyclo[3.3.1.1$^{3,7}$]decanyl-2-propanol, thereby obtaining 2'-triisopropylsiloxy-tricyclo[3.3.1.1$^{3'',7''}$]decanyl-2'-propyl chloroacrylate.

Synthesis Example 148

The same procedures as explained in the above Synthesis Example 121 were repeated except that 2-t-butoxycarbonylmethoxycyclohexyl-2-propanol was replaced by 2-triisopropylsiloxy-tricyclo[5.2.1.0$^{2,6}$]decanyl-2-propanol, thereby obtaining 2'-triisopropylsiloxy-tricyclo[5.2.1.0$^{2'',6''}$]decanyl-2'-propyl chloroacrylate.

Synthesis Example 149

The same procedures as explained in the above Synthesis Example 121 were repeated except that 2-t-butoxycarbonylmethoxycyclohexyl-2-propanol was replaced by 2-triisopropylsiloxy-tetracyclo[6.2.1.1$^{3,6}$.0$^{2,7}$]dodecanyl-2-propanol, thereby obtaining 2'-triisopropylsiloxy-tetracyclo[6.2.1.1$^{3'',6''}$.0$^{2'',7''}$,]dodecanyl-2'-propyl chloroacrylate.

Synthesis Example 150

The same procedures as explained in the above Synthesis Example 121 were repeated except that 2-t-butoxycarbonylmethoxycyclohexyl-2-propanol was replaced by triisopropylsiloxymethyl-tricyclo[3.3.1.1$^{3,7}$] decanyl alcohol, thereby obtaining triisopropylsiloxymethyl-tricyclo[3.3.1.1$^{3,7}$]decanyl chloroacrylate.

Synthesis Example 151

The same procedures as explained in the above Synthesis Example 2 were repeated except that chloroacetyl chloride was replaced by t-butoxycarbonylmethyl chloride, thereby obtaining 2-t-butoxycarbonylmethoxycyclohexyl-2-propanol.

Synthesis Example 152

The same procedures as explained in the above Synthesis Example 2 were repeated except that terpineol was replaced by tricyclo[3.3.1.1$^{3,7}$]decanyl propanediol and that chloroacetyl chloride was replaced by t-butoxycarbonylmethyl chloride, thereby obtaining 2-t-butoxycarbonylmethoxy-tricyclo[3.3.1.1$^{3'',7''}$]decanyl-2-propanol.

Synthesis Example 153

The same procedures as explained in the above Synthesis Example 2 were repeated except that terpineol was replaced by tricyclo[5.2.1.0$^{2,6}$]decanyl propanediol and that chloroacetyl chloride was replaced by t-butoxycarbonylmethyl chloride, thereby obtaining 2-t-butoxycarbonylmethoxy-tricyclo[5.2.1.0$^{2'',6''}$]decanyl-2-propanol.

Synthesis Example 154

The same procedures as explained in the above Synthesis Example 2 were repeated except that terpineol was replaced by tetracyclo[6.2.1.1$^{3,6}$.0$^{2,7}$]dodecanyl propanediol and that chloroacetyl chloride was replaced by t-butoxycarbonylmethyl chloride, thereby obtaining 2-t-butoxycarbonylmethoxy-tetracyclo[6.2.1.1$^{3'',6''}$.0$^{2'',7''}$] dodecanyl-2-propanol.

Synthesis Example 155

The same procedures as explained in the above Synthesis Example 2 were repeated except that terpineol was replaced by methyl-tricyclo[3.3.1.1$^{3,7}$]decanediol and that chloroacetyl chloride was replaced by t-butoxycarbonylmethyl chloride, thereby obtaining t-butoxycarbonylmethoxymethyl-tricyclo[3.3.1.1$^{3,7}$) decanyl alcohol.

Example 1 and Comparative Example

First of all, a copolymer consisting of acetylterpinyl methacrylate and t-butyl methacrylate (1:1) was prepared as a base resin. The acetylterpinyl methacrylate employed in this case was synthesized in the same manner as explained in the aforementioned Synthesis Example 31 except that acetylterpineol was substituted for 2-t-butoxycarbonylmethoxycyclohexyl-2-propanol employed therein.

Then, as a photo-acid generating agent, triphenylsulfonium triflate was added to this base resin at a ratio of 1 mole % based on this base resin, and the resultant mixture was dissolved in cyclohexanone, thereby preparing a cyclohexanone solution.

The resultant solution of photosensitive composition was coated on a silicon wafer to a thickness of 0.3 $\mu$m and then prebaked at a temperature of 100° C. to form a resist film. Then, a predetermined region of the resist film was exposed to an ArF excimer laser (3 mJ cm$^{-2}$), and thereafter developed using tetramethylammonium hydroxide to form a pattern on which evaluations on the patterning property thereof was subsequently made.

As result, it was found possible to form a line and space pattern of 0.13 $\mu$m in line width.

Furthermore, the etching rate of the photosensitive composition was measured using carbon tetrafluoride (CF$_4$) gas. The evaluation of dry-etching property was performed under the conditions of: 12.6 sccm in flow rate of CF$_4$, 10 mtorr in vacuum degree, and 150 W in output of microwave.

On the other hand, as a comparative polymer, a copolymer consisting of menthyl methacrylate and t-butyl methacrylate (1:1) was prepared. Then, as a photo-acid generating agent, triphenylsulfonium triflate was added to this copolymer at a ratio of 1 mole % based on this copolymer, and the resultant mixture was dissolved in ethyl Cellosolve acetate, thereby preparing an ethyl Cellosolve acetate solution.

A resist pattern was formed in the same manner as described above except that this ethyl Cellosolve acetate solution of photosensitive composition was employed and that the exposure dosage was changed to 50 mJ/cm$^2$. Then, the resolution of the resist pattern was investigated, and the etching rate of the photosensitive composition by making use of carbon tetrafluoride gas was performed under the same conditions as mentioned above. The results are summarized in the following Table 1.

TABLE 1

|  | Resolution/μm | Etching resistance* |
|---|---|---|
| This invention | 0.13 | 1.2 |
| Comp. Example | 0.18 | 1 |

*Relative value

The etching resistance indicated in Table 1 is a relative value where the etching resistance of the photosensitive composition of the Comparative Example was defined as 1. As shown in Table 1, the photosensitive composition of this invention wherein a high molecular compound containing a monomer having both alicyclic group and acid-decomposable group therein was employed as a base resin indicated more excellent properties both in resolution and in dry-etching resistance as compared with the photosensitive composition of the Comparative Example.

Example 2

First of all, a copolymer consisting of tetrahydropyranylterpinyl acrylate and t-butyl acrylate (1:1) was prepared as a base resin. The tetrahydropyranylterpinyl acrylate employed in this case was synthesized in the same manner as explained in the aforementioned Synthesis Example 61 except that tetrahydropyranylterpineol was substituted for 2-t-butoxycarbonylmethoxycyclohexyl-2-propanol employed therein.

Then, as a photo-acid generating agent, triphenylsulfonium triflate was added to this base resin at a ratio of 1 mole % based on this base resin, and the resultant mixture was dissolved in cyclohexanone to prepare a cyclohexanone solution.

The resultant solution of photosensitive composition was employed to evaluate the patterning property of the photosensitive composition in the same manner as described in the aforementioned Example 1. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.4, indicating an excellent etching resistance as compared with the value of 1 in etching resistance of the Comparative Example.

Example 3

First of all, a copolymer consisting of methyladamantylterpinyl acrylate and ethoxyethyl acrylate (1:1) was prepared as a base resin. The methyladamantylterpinyl acrylate employed in this case was synthesized in the same manner as explained in the aforementioned Synthesis Example 61 except that methyladamantylterpineol was substituted for 2-t-butoxycarbonylmethoxycyclohexyl-2-propanol employed therein.

Then, as a photo-acid generating agent, triphenylsulfonium triflate was added to this base resin at a ratio of 1 mole % based on this base resin, and the resultant mixture was dissolved in cyclohexanone to prepare a cyclohexanone solution.

The resultant solution of photosensitive composition was employed to evaluate the patterning property of the photosensitive composition in the same manner as described in the aforementioned Example 1. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.3, indicating an excellent etching resistance as compared with the value of 1 in etching resistance of the Comparative Example.

Example 4

First of all, a copolymer consisting of acetyleudesmyl acrylate and tetrahydropyranyl acrylate (1:1) was prepared as a base resin. The acetyleudesmyl acrylate employed in this case was synthesized as follows. Namely, the same procedures as those of the aforementioned Synthesis Example 2 were repeated except that eudesmol was substituted for terpineol and that acetyl chloride was substituted for chloroacetyl chloride, thereby obtaining acetyleudesmol. Then, the same procedures as those of the aforementioned Synthesis Example 61 were repeated except that acetyleudesmol was substituted for 2-t-butoxycarbonylmethoxycyclohexyl-2-propanol, thereby obtaining acetyleudesmyl acrylate.

Then, as a photo-acid generating agent, triphenylsulfonium triflate was added to this base resin at a ratio of 1 mole % based on this base resin, and the resultant mixture was dissolved in cyclohexanone to prepare a cyclohexanone solution.

The resultant solution of photosensitive composition was employed to evaluate the patterning property of the photosensitive composition in the same manner as described in the aforementioned Example 1. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.4, indicating an excellent etching resistance as compared with the value of 1 in etching resistance of the Comparative Example.

Example 5

First of all, a copolymer consisting of tetrahydropyranyleudesmyl acrylate and tetrahydropyranyl acrylate (1:1) was prepared as a base resin. The tetrahydropyranyleudesmyl acrylate employed in this case was synthesized as follows. Namely, the same procedures as those of the aforementioned Synthesis Example 4 were repeated except that eudesmol was substituted for terpineol, thereby obtaining tetrahydropyranyleudesmol. Then, the same procedures as those of the aforementioned Synthesis Example 61 were repeated except that tetrahydropyranyleudesmol was substituted for 2-t-butoxycarbonylmethoxycyclohexyl-2-propanol, thereby obtaining tetrahydropyranyleudesmyl acrylate.

Then, triphenylsulfonium triflate as a photo-acid generating agent, and methyladamantyladamantane dicarbonate as an additive were added to this base resin, and the resultant mixture was dissolved in cyclohexanone to prepare a cyclohexanone solution. The mixing ratio of the photo-acid generating agent was 1 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 1. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.3, indicating an excellent etching resistance as compared with the value of 1 in etching resistance of the Comparative Example.

Example 6

First of all, a copolymer consisting of tetrahydropyranylguaioyl acrylate and tetrahydropyranyl acrylate (1:1) was prepared as a base resin. The tetrahydropyranylguaioyl acrylate employed in this case was synthesized as follows. Namely, the same procedures as those of the aforementioned Synthesis Example 4 were repeated except that guaiol was substituted for terpineol, thereby obtaining tetrahydropyranylguaiol. Then, the same procedures as those of the aforementioned Synthesis Example 61 were repeated except that tetrahydropyranylguaiol was substituted for 2-t-butoxycarbonylmethoxycyclohexyl-2-propanol, thereby obtaining tetrahydropyranylguaioyl acrylate.

Then, trinaphthylsulfonium triflate as a photo-acid generating agent, and methyladamantyladamantane carbonate as an additive were added to this base resin, and the resultant mixture was dissolved in cyclohexanone to prepare a cyclohexanone solution. The mixing ratio of the photo-acid generating agent was 5 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 1. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 7

First of all, a copolymer consisting of methyladamantylguaioyl acrylate and methoxyethyl acrylate (1:1) was prepared as a base resin. The methyladamantylguaioyl acrylate employed in this case was synthesized as follows. Namely, the same procedures as those of the aforementioned Synthesis Example 2 were repeated except that guaiol was substituted for terpineol and that methyladamantyl-methyl chloride was substituted for chloroacetyl chloride, thereby obtaining methyladamantylguaiol. Then, the same procedures as those of the aforementioned Synthesis Example 61 were repeated except that methyladamantylguaiol was substituted for 2-t-butoxycarbonylmethoxycyclohexyl-2-propanol, thereby obtaining methyladamantylguaioyl acrylate.

Then, dinaphthyliodonium triflate as a photo-acid generating agent, and methyladamantyladamantane carbonate as an additive were added to this base resin, and the resultant mixture was dissolved in cyclohexanone to prepare a cyclohexanone solution. The mixing ratio of the photo-acid generating agent was 5 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 1. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.3, indicating an excellent etching resistance as compared with the value of 1 in etching resistance of the Comparative Example.

Example 8

First of all, a copolymer consisting of methyladamantyleudesmyl acrylate and methoxyethyl acrylate (1:1) was prepared as a base resin. The methyladamantyleudesmyl acrylate employed in this case was synthesized as follows. Namely, the same procedures as those of the aforementioned Synthesis Example 2 were repeated except that eudesmol was substituted for terpineol and that methyladamantyl chloride was substituted for chloroacetyl chloride, thereby obtaining methyladamantyleudesmol. Then, the same procedures as those of the aforementioned Synthesis Example 61 were repeated except that methyladamantyleudesmol was substituted for 2-t-butoxycarbonylmethoxycyclohexyl-2-propanol, thereby obtaining methyladamantyleudesmyl acrylate.

Then, dinaphthyliodonium triflate as a photo-acid generating agent, and methylcyclohexyladamantane carbonate as an additive were added to this base resin, and the resultant mixture was dissolved in cyclohexanone to prepare a cyclohexanone solution. The mixing ratio of the photo-acid generating agent was 5 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 1. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.3, indicating an excellent etching resistance as compared with the value of 1 in etching resistance of the Comparative Example.

Example 9

First of all, a copolymer consisting of trimethylsilylterpinyl acrylate and methoxyethyl acrylate (1:1) was prepared as a base resin. The trimethylsilylterpinyl acrylate employed in this case was synthesized as follows.

Namely, the same procedures as those of the aforementioned Synthesis Example 5 were repeated except that trimethylsilyl chloride was substituted for t-butoxycarbonyl chloride, thereby obtaining trimethylsilyl terpineol. Then, the same procedures as those of the aforementioned Synthesis Example 61 were repeated except that trimethylsilyl terpineol was substituted for 2-t-butoxycarbonylmethoxycyclohexyl-2propanol, thereby obtaining trimethylsilylterpinyl acrylate.

Then, dinaphthyliodonium triflate as a photo-acid generating agent, and methyladamantyladamantane carbonate as an additive were added to this base resin, and the resultant mixture was dissolved in cyclohexanone to prepare a cyclohexanone solution. The mixing ratio of the photo-acid generating agent was 5 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 1. As result, it was found possible to form a line and space pattern of 0.13 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.3, indicating an excellent etching resistance as compared with the value of 1 in etching resistance of the Comparative Example.

Example 10

First of all, a copolymer consisting of t-butoxycarbonylterpinyl acrylate and methoxyethyl acrylate (1:1) was prepared as a base resin. Then, triphenylsulfonium triflate as a photo-acid generating agent, and methyladamantyladamantane carbonate as an additive were added to this base resin, and the resultant mixture was dissolved in cyclohexanone to prepare a cyclohexanone solution. The mixing ratio of the photo-acid generating agent was 1 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 1. As result, it was found possible to form a line and space pattern of 0.13 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.3, indicating an excellent etching resistance as compared with the value of 1 in etching resistance of the Comparative Example.

Example 11

First of all, a copolymer consisting of t-butoxycarbonylmethylterpinyl acrylate and methoxyethyl acrylate (1:1) was prepared as a base resin. The t-butoxycarbonylmethylterpinyl acrylate employed in this case was synthesized as follows.

Terpineol, t-butoxycarbonylmethyl chloride, dimethylaminopyridine and imidazole were mixed together and dissolved in dimethylformamide to obtain a mixed solution, which was then refluxed under heating at a liquid temperature of 70° C. for 9 hours. Subsequently, the reaction of the mixed solution was quenched by adding therein an aqueous saturated solution of ammonium chloride, and then ethyl ether was added thereto. The mixed solution was then allowed to be separated into 2 phases, and after the aqueous phase was extracted with ethyl ether, the organic extractions were combined and washed with an aqueous saturated solution of ammonium chloride. Then, the organic phase thus washed was dried over a saturated salt water and anhydrous sodium sulfate. Finally, the resultant oily product was distilled under reduced pressure to obtain t-butoxycarbonylmethylterpineol.

Then, the same procedures as those of the aforementioned Synthesis Example 61 were repeated except that t-butoxycarbonylmethyl terpineol was substituted for 2-t-butoxycarbonylmethoxycyclohexyl-2-propanol, thereby obtaining t-butoxycarbonylmethylterpinyl acrylate.

Then, triphenylsulfonium triflate as a photo-acid generating agent, and methyladamantyladamantane carbonate as an additive were added to this base resin, and the resultant mixture was dissolved in cyclohexanone to prepare a cyclohexanone solution. The mixing ratio of the photo-acid generating agent was 1 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 1 except that the exposure dosage was changed to 4 mJ $cm^{-2}$. As result, it was found possible to form a line and space pattern of 0.13 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 12

First of all, a copolymer consisting of t-butoxycarbonylterpinyl acrylate and methoxyethyl acrylate (1:1) was prepared as a base resin. Then, NDI-105 (Midori Kagaku Co., Ltd.) as a photo-acid generating agent, and methyladamantyladamantane dicarbonate as an additive were added to this base resin, and the resultant mixture was dissolved in cyclohexanone to prepare a cyclohexanone solution. The mixing ratio of the photo-acid generating agent was 5 mole % based on this base resin, while the mixing ratio of the additive was 30 wt. % based on this base resin.

The resultant solution of photosensitive composition was employed to evaluate the patterning property of the photosensitive composition in the same manner as described in the aforementioned Example 11. As result, it was found possible to form a line and space pattern of 0.13 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 13

First of all, a copolymer consisting of chloroacetylterpinyl acrylate and tetrahydropyranyl acrylate (1:1) was prepared as a base resin. The chloroacetylterpinyl acrylate employed in this case was synthesized following the same procedures as those of the aforementioned Synthesis Example 61 except that chloroacetyl terpineol was substituted for 2-t-butoxycarbonylmethoxycyclohexyl-2-propanol.

Then, triphenylsulfonium triflate as a photo-acid generating agent, and methyladamantyladamantane dicarbonate as an additive were added to this base resin, and the resultant mixture was dissolved in cyclohexanone to prepare a cyclohexanone solution. The mixing ratio of the photo-acid generating agent was 1 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 1 except that the exposure dosage was changed to 2 mJ cm$^{-2}$. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 14

First of all, a copolymer consisting of t-butoxycarbonylterpinyl acrylate and tetrahydrofuranyl acrylate (1:1) was prepared as a base resin. Then, trinaphthylsulfonium triflate as a photo-acid generating agent, and methyladamantyladamantane dicarbonate as an additive were added to this base resin, and the resultant mixture was dissolved in cyclohexanone to prepare a cyclohexanone solution. The mixing ratio of the photo-acid generating agent was 1 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 1. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 15

First of all, a copolymer consisting of chloroacetylterpinyl acrylate and ethoxyethyl acrylate (1:1) was prepared as a base resin. Then, dinaphthyliodonium triflate as a photo-acid generating agent, and methylcyclohexyladamantane dicarbonate as an additive were added to this base resin, and the resultant mixture was dissolved in cyclohexanone to prepare a cyclohexanone solution. The mixing ratio of the photo-acid generating agent was 5 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 11. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 16

First of all, a copolymer consisting of acetylterpinyl acrylate and ethoxyethyl acrylate (1:1) was prepared as a base resin. The acetylterpinyl acrylate employed in this case was synthesized following the same procedures as those of the aforementioned Synthesis Example 61 except that acetyl terpineol was substituted for 2-t-butoxycarbonylmethoxycyclohexyl-2-propanol.

Then, dinaphthyliodonium triflate as a photo-acid generating agent, and methylcyclohexyladamantane dicarbonate as an additive were added to this base resin, and the resultant mixture was dissolved in cyclohexanone to prepare a cyclohexanone solution. The mixing ratio of the photo-acid generating agent was 5 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 1. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 17

First of all, a copolymer consisting of tetrahydropyranylterpinyl acrylate and ethoxyethyl acrylate (1:1) was prepared as a base resin. Then, dinaphthyliodonium triflate as a photo-acid generating agent was added to this base resin, and the resultant mixture was dissolved in cyclohexanone to prepare a cyclohexanone solution. The mixing ratio of the photo-acid generating agent was 5 mole % based on this base resin.

The resultant solution of photosensitive composition was employed to evaluate the patterning property of the photosensitive composition in the same manner as described in the aforementioned Example 1. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 18

First of all, a copolymer consisting of tetrahydropyranylterpinyl methacrylate and ethoxyethyl acrylate (1:1) was prepared as a base resin. The tetrahydropyranylterpinyl methacrylate employed in this case was synthesized following the same procedures as those of the aforementioned Synthesis Example 31 except that tetrahydropyranyl terpineol was substituted for 2-t-butoxycarbonylmethoxycyclohexyl-2-propanol.

Then, dinaphthyliodonium triflate as a photo-acid generating agent was added to this base resin, and the resultant mixture was dissolved in cyclohexanone to prepare a cyclohexanone solution. The mixing ratio of the photo-acid generating agent was 5 mole % based on this base resin.

The resultant solution of photosensitive composition was employed to evaluate the patterning property of the photosensitive composition in the same manner as described in the aforementioned Example 11. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 19

First of all, a copolymer consisting of acetylterpinyl acrylate and ethoxyethyl methacrylate (1:1) w as prepared as a base resin. Then, dinaphthyliodonium triflate as a photo-acid generating agent was added to this base resin, and the resultant mixture was dissolved in cyclohexanone to prepare a cyclohexanone solution. The mixing ratio of the photo-acid generating agent was 5 mole % based on this base resin.

The resultant solution of photos sensitive composition was employed to evaluate the patterning property of the photosensitive composition in the same manner as described in the aforementioned Example 13. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 20

First of all, a copolymer consisting ofacetylterpinyl acrylate and ethoxyethyl acrylate (1:1) was prepared as a base resin. Then, triphenylsulfonium triflate as a photo-acid generating agent was added to this base resin, and the resultant mixture was dissolved in cyclohexanone to prepare a cyclohexanone solution. The mixing ratio of the photo-acid generating agent was 1 mole % based on this base resin.

The resultant solution of photosensitive composition was employed to evaluate the patterning property of the photosensitive composition in the same manner as described in the aforementioned Example 13. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 21

First of all, a copolymer consisting of tetrahydropyranyl acrylate and ethoxyethyl methacrylate (1:1) was prepared as a base resin. Then, triphenylsulfonium triflate as a photo-acid generating agent was added to this base resin, and the resultant mixture was dissolved in cyclohexanone to prepare a cyclohexanone solution. The mixing ratio of the photo-acid generating agent was 1 mole % based on this base resin.

The resultant solution of photosensitive composition was employed to evaluate the patterning property of the photosensitive composition in the same manner as described in the aforementioned Example 13. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 22

First of all, a copolymer consisting of tetrahydropyranylterpinyl acrylate and ethoxyethyl methacrylate (1:1) was prepared as a base resin. Then, triphenylsulfonium triflate as a photo-acid generating agent, and di-t-butyl-2-1'-adamantylcarbonylmethyl malonate as an additive were added to this base resin, and the resultant mixture was dissolved in cyclohexanone to prepare a cyclohexanone solution. The mixing ratio of the photo-acid generating agent was 1 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 1 except that the exposure dosage was changed to 5 mJ $cm^{-2}$. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 23

First of all, a copolymer consisting of acetylterpinyl acrylate and tetrahydropyranyl methacrylate (1:1) was prepared as a base resin. Then, triphenylsulfonium triflate as a photo-acid generating agent, and di-t-butyl-2-1'-adamantylcarbonylmethyl malonate as an additive were added to this base resin, and the resultant mixture was dissolved in cyclohexanone to prepare a cyclohexanone solution. The mixing ratio of the photo-acid generating agent was 1 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 22. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.3, indicating an excellent etching resistance as compared with the value of 1 in etching resistance of the Comparative Example.

Example 24

First of all, a copolymer consisting of acetylterpinyl acrylate and tetrahydropyranyl methacrylate (1:1) was prepared as a base resin. Then, trinaphthylsulfonium triflate as a photo-acid generating agent, and methyladamantyladamantane dicarbonate as an additive were added to this base resin, and the resultant mixture was dissolved in cyclohexanone to prepare a cyclohexanone solution. The mixing ratio of the photo-acid generating agent was 5 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 22. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 25

First of all, a copolymer consisting of acetylterpinyl acrylate and t-butyl acrylate (1:1) was prepared as a base resin. Then, trinaphthylsulfonium triflate as a photo-acid generating agent, and methyladamantyladamantane dicarbonate as an additive were added to this base resin, and the resultant mixture was dissolved in cyclohexanone to prepare a cyclohexanone solution. The mixing ratio of the photo-acid generating agent was 5 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 22. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 26

First of all, a copolymer consisting of acetylterpinyl acrylate and t-butyl acrylate (1:1) was prepared as a base resin. Then, trinaphthylsulfonium triflate as a photo-acid generating agent, and tetrahydropyranyladamantane carbonate as an additive were added to this base resin, and the resultant mixture was dissolved in cyclohexanone to prepare a cyclohexanone solution. The mixing ratio of the photo-acid generating agent was 5 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 22. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 27

First of all, a copolymer consisting of acetylterpinyl acrylate and t-butyl acrylate (1:1) was prepared as a base resin. Then, triphenylsulfonium triflate as a photo-acid generating agent was added to this base resin, and the resultant mixture was dissolved in cyclohexanone to prepare a cyclohexanone solution. The mixing ratio of the photo-acid generating agent was 5 mole % based on this base resin.

The resultant solution of photosensitive composition was employed to evaluate the patterning property of the photosensitive composition in the same manner as described in the aforementioned Example 22. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 28

First of all, a copolymer consisting of acetylterpinyl methacrylate and tetrahydropyranyl methacrylate (1:1) was prepared as a base resin. The acetylterpinyl methacrylate employed in this case was synthesized following the same procedures as those of the aforementioned Synthesis Example 31 except that acetyl terpineol was substituted for 2-t-butoxycarbonylmethoxycyclohexyl-2-propanol.

Then, triphenylsulfonium triflate as a photo-acid generating agent was added to this base resin, and the resultant mixture was dissolved in cyclohexanone to prepare a cyclohexanone solution. The mixing ratio of the photo-acid generating agent was 5 mole % based on this base resin.

The resultant solution of photosensitive composition was employed to evaluate the patterning property of the photosensitive composition in the same manner as described in the aforementioned Example 22. As result, it was found possible to form a line and space pattern of 0.13 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 29

First of all, a copolymer consisting of s-butoxycarbonylterpinyl methacrylate and tetrahydropyranyl methacrylate (1:1) was prepared as a base resin. The s-butoxycarbonylterpinyl methacrylate employed in this case was synthesized as follows.

Namely, the same procedures as those of the aforementioned Synthesis Example 5 were repeated except that s-butoxycarbonyl chloride was substituted for t-butoxycarbonyl chloride, thereby obtaining s-butoxycarbonyl terpineol. Then, the same procedures as those of the aforementioned Synthesis Example 31 were repeated except that s-butoxycarbonyl terpineol was substituted for 2-t-butoxycarbonylmethoxycyclohexyl-2-propanol, thereby obtaining s-butoxycarbonylterpinyl methacrylate.

Then, triphenylsulfonium triflate as a photo-acid generating agent, and methylcyclohexyladamantane carbonate as an additive were added to this base resin, and the resultant mixture was dissolved in cyclohexanone to prepare a cyclohexanone solution. The mixing ratio of the photo-acid generating agent was 5 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 22. As result, it was found possible to form a line and space pattern of 0.13 $\mu$m in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 30

First of all, a copolymer consisting of t-butoxycarbonylterpinyl methacrylate and tetrahydropyranyl methacrylate (1:1) was prepared as a base resin. Then, NDI-105 (Midori Kagaku Co., Ltd.) as a photo-acid generating agent, and methylcyclohexyladamantane carbonate as an additive were added to this base resin, and the resultant mixture was dissolved in cyclohexanone to prepare a cyclohexanone solution. The mixing ratio of the photo-acid generating agent was 10 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 22. As result, it was found possible to form a line and space pattern of 0.13 $\mu$m in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 31

First of all, a copolymer consisting of t-butoxycarbonylterpinyl methacrylate and tetrahydropyranyl methacrylate (1:1) was prepared as a base resin. Then, NDI-105 (Midori Kagaku Co., Ltd.) as a photo-acid generating agent was added to this base resin, and the resultant mixture was dissolved in cyclohexanone to prepare a cyclohexanone solution. The mixing ratio of the photo-acid generating agent was 10 mole % based on this base resin.

The resultant solution of photosensitive composition was employed to evaluate the patterning property of the photosensitive composition in the same manner as described in the aforementioned Example 22. As result, it was found possible to form a line and space pattern of 0.13 $\mu$m in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.2, indicating an excellent etching resistance as compared with the value of 1 in etching resistance of the Comparative Example.

Example 32

First of all, a copolymer consisting of t-butoxycarbonylterpinyl methacrylate and ethoxyethyl methacrylate (1:1) was prepared as a base resin. Then, NAT-105 (Midori Kagaku Co., Ltd.) as a photo-acid generating agent, and methylcycloadamantyladamantane dicarbonate as an additive were added to this base resin, and the resultant mixture was dissolved in cyclohexanone to prepare a cyclohexanone solution. The mixing ratio of the photo-acid generating agent was 1 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 22. As result, it was found possible to form a line and space pattern of 0.13 $\mu$m in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 33

First of all, a copolymer consisting of chloroacetylterpinyl acrylate and tetrahydropyranyl acrylate (1:1) was prepared as a base resin. Then, NAT-105 (Midori Kagaku Co., Ltd.) as a photo-acid generating agent, and methyladamantyladamantane dicarbonate as an additive were added to this base resin, and the resultant mixture was dissolved in cyclohexanone to prepare a cyclohexanone solution. The mixing ratio of the photo-acid generating agent was 1 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 13. As result, it was found possible to form a line and space pattern of 0.1 $\mu$m in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 34

First of all, a copolymer consisting of t-butoxycarbonylterpinyl acrylate and tetrahydrofuranyl acrylate (1:1) was prepared as a base resin. Then, NAT-105 (Midori Kagaku Co., Ltd.) as a photo-acid generating agent, and methyladamantyladamantane dicarbonate as an additive were added to this base resin, and the resultant mixture was dissolved in cyclohexanone to prepare a cyclohexanone solution. The mixing ratio of the photo-acid generating agent was 1 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 35

First of all, a copolymer consisting of chloroacetylterpinyl acrylate and ethoxyethyl acrylate (1:1) was prepared as a base resin. Then, NAT-105 (Midori Kagaku Co., Ltd.) as a photo-acid generating agent, and methylcyclohexyladamantane dicarbonate as an additive were added to this base resin, and the resultant mixture was dissolved in cyclohexanone to prepare a cyclohexanone solution. The mixing ratio of the photo-acid generating agent was 1 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 36

First of all, a copolymer consisting of acetylterpinyl acrylate and ethoxyethyl acrylate (1:1) was prepared as a base resin. Then, NAT-105 (Midori Kagaku Co., Ltd.) as a photo-acid generating agent, and methylcyclohexyladamantane dicarbonate as an additive were added to this base resin, and the resultant mixture was dissolved in cyclohexanone to prepare a cyclohexanone solution. The mixing ratio of the photo-acid generating agent was 1 mole % based on this base resin, while the mixing ratio of the additive was 40 wt. % based on this base resin.

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 37

First of all, a copolymer consisting of tetrahydropyranylterpinyl acrylate and ethoxyethyl acrylate (1:1) was prepared as a base resin. Then, NAT-105 (Midori Kagaku Co., Ltd.) as a photo-acid generating agent was added to this base resin, and the resultant mixture was dissolved in cyclohexanone to prepare a cyclohexanone solution. The mixing ratio of the photo-acid generating agent was 1 mole % based on this base resin.

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.3, indicating an excellent etching resistance as compared with the value of 1 in etching resistance of the Comparative Example.

Example 38

First of all, a copolymer consisting of tetrahydropyranylterpinyl methacrylate and ethoxyethyl acrylate (1:1) was prepared as a base resin. Then, NAT-105 (Midori Kagaku Co., Ltd.) as a photo-acid generating agent was added to this base resin, and the resultant mixture was dissolved in cyclohexanone to prepare a cyclohexanone solution. The mixing ratio of the photo-acid generating agent was 1 mole % based on this base resin.

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.3, indicating an excellent etching resistance as compared with the value of 1 in etching resistance of the Comparative Example.

Example 39

First of all, a copolymer consisting of acetylterpinyl acrylate and ethoxyethyl methacrylate (1:1) was prepared as a base resin. Then, NAT-105 (Midori Kagaku Co., Ltd.) as a photo-acid generating agent was added to this base resin, and the resultant mixture was dissolved in cyclohexanone to prepare a cyclohexanone solution. The mixing ratio of the photo-acid generating agent was 1 mole % based on this base resin.

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.3, indicating an excellent etching resistance as compared with the value of 1 in etching resistance of the Comparative Example.

Example 40

First of all, a copolymer consisting of acetylterpinyl acrylate and ethoxyethyl acrylate (1:1) was prepared as a base resin. Then, NAT-105 (Midori Kagaku Co., Ltd.) as a photo-acid generating agent was added to this base resin, and the resultant mixture was dissolved in cyclohexanone to prepare a cyclohexanone solution. The mixing ratio of the photo-acid generating agent was 1 mole % based on this base resin.

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.3, indicating an excellent etching resistance as compared with the value of 1 in etching resistance of the Comparative Example.

Example 41

First of all, a copolymer consisting of 2'-t-butyldimethylsiloxycyclohexyl-2'-propyl methacrylate, vinyl naphthalene and methacrylic acid (1:1:1) was prepared as a base resin. Then, triphenylsulfonium triflate as a photo-acid generating agent was added to this base resin, and the resultant mixture was dissolved in cyclohexanone to prepare a cyclohexanone solution. The mixing ratio of the photo-acid generating agent was 1 mole % based on this base resin.

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching-resistance of the Comparative Example.

Example 42

A solution of photosensitive composition was prepared in the same manner as described in the aforementioned Example 41 except that the base resin was changed to a copolymer consisting of 2'-t-buthoxycarbonylmethoxy-tricyclo[$3.3.1.1^{3'',7''}$]decanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 43

A solution of photosensitive composition was prepared in the same manner as described in the aforementioned Example 41 except that the base resin was changed to a copolymer consisting of methyltetrahydropyranyloxycarbonylmethoxy-tricyclo [$5.2.1.0^{2,6}$]decanyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 44

A solution of photosensitive composition was prepared in the same manner as described in the aforementioned Example 41 except that the base resin was changed to a copolymer consisting of 2'-di-t-butylmethylsiloxymethyl-tetracyclo[$6.2.1.1^{3'',6''}0.0^{2'',7''}$]dodecanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 45

A solution of photosensitive composition was prepared in the same manner as described in the aforementioned Example 41 except that the base resin was changed to a copolymer consisting of methoxycarbonylmethoxymethyl-tricyclo[$3.3.1.1^{3,7}$]decanyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 46

A solution of photosensitive composition was prepared in the same manner as described in the aforementioned Example 41 except that the base resin was changed to a copolymer consisting of 2'-triisopropylsiloxycyclohexyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 47

A solution of photosensitive composition was prepared in the same manner as described in the aforementioned Example 41 except that the base resin was changed to a copolymer consisting of 2'-thexyldimethylsiloxy tricyclo [3.3.1.1$^{3'',7''}$]decanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 48

A solution of photosensitive composition was prepared in the same manner as described in the aforementioned Example 41 except that the base resin was changed to a copolymer consisting of 2'-t-butyldimethylsiloxycyclohexyl-2'-propyl acrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 49

A solution of photosensitive composition was prepared in the same manner as described in the aforementioned Example 41 except that the base resin was changed to a copolymer consisting of 2'-t-butyldimethylsiloxycyclohexyl-2'-propyl cyanoacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 50

A solution of photosensitive composition was prepared in the same manner as described in the aforementioned Example 41 except that the base resin was changed to a copolymer consisting of 2'-t-butyldimethylsiloxycyclohexyl-2'-propyl chloroacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 51

A solution of photosensitive composition was prepared in the same manner as described in the aforementioned Example 41 except that the base resin was changed to a copolymer consisting of 2'-t-butyldimethylsiloxycyclohexyl-2'-propyl methacrylic amide, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 52

A solution of photosensitive composition was prepared in the same manner as described in the aforementioned Example 41 except that the base resin was changed to a copolymer consisting of 2'-t-butyldimethylsiloxycyclohexyl-2'-propyl acrylic amide, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 53

A solution of photosensitive composition was prepared in the same manner as described in the aforementioned Example 41 except that the base resin was changed to a copolymer consisting of methoxycarbonylmethoxymethyltricyclo[3.3.1.1$^{3,7}$]decanyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.4, indicating an excellent etching resistance as compared with the value of 1 in etching resistance of the Comparative Example.

Example 54

A solution of photosensitive composition was prepared in the same manner as described in the aforementioned Example 41 except that the base resin was changed to a copolymer consisting of 2'-triisopropylsiloxycyclohexyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 55

A solution of photosensitive composition was prepared in the same manner as described in the aforementioned Example 41 except that the base resin was changed to a copolymer consisting of 2'-thexyldimethylsiloxy tricyclo [3.3.1.1$^{3'',7''}$]decanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 56

A solution of photosensitive composition was prepared in the same manner as described in the aforementioned Example 41 except that the base resin was changed to a copolymer consisting of 2'-t-butyldimethylsiloxycyclohexyl-2'-propyl acrylate, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 57

A solution of photosensitive composition was prepared in the same manner as described in the aforementioned Example 41 except that the base resin was changed to a copolymer consisting of 2'-t-butyldimethylsiloxycyclohexyl-2'-propyl cyanoacrylate, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 58

A solution of photosensitive composition was prepared in the same manner as described in the aforementioned Example 41 except that the base resin was changed to a copolymer consisting of 2'-t-butyldimethylsiloxycyclohexyl-2'-propyl chloroacrylate, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 59

A solution of photosensitive composition was prepared in the same manner as described in the aforementioned Example 41 except that the base resin was changed to a copolymer consisting of 2'-t-butyldimethylsiloxycyclohexyl-2'-propyl methacrylic sulfonamide, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 60

A solution of photosensitive composition was prepared in the same manner as described in the aforementioned Example 41 except that the base resin was changed to a copolymer consisting of 2'-t-butyldimethylsiloxycyclohexyl-2'-propyl acrylic sulfonamide, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 61

As a base resin, a copolymer consisting of 2'-t-butyldimethylsiloxycyclohexyl-2'-propyl methacrylate, vinyl naphthalene and methacrylic acid (1:1:1) was prepared. Then, diphenyliodonium triflate was added as a photo-acid generating agent to the base resin at a ratio of 1 mole % based on the base resin, the resultant mixture being dissolved in cyclohexanone to obtain a cyclohexanone solution of photosensitive composition.

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 62

A solution of photosensitive composition was prepared in the same manner as described in the aforementioned Example 61 except that the base resin was changed to a copolymer consisting of 2'-t-buthoxycarbonylmethoxy-tricyclo[$3.3.1.1^{3'',7''}$]decanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 63

A solution of photosensitive composition was prepared in the same manner as described in the aforementioned Example 61 except that the base resin was changed to a copolymer consisting of methyltetrahydropyranyloxycarbonylmethoxy-tricyclo[$5.2.1.0^{2,6}$]decanyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 64

A solution of photosensitive composition was prepared in the same manner as described in the aforementioned Example 61 except that the base resin was changed to a copolymer consisting of 2'-di-t-butylmethylsiloxymethyl-tetracyclo[$6.2.1.1^{3'',6''}0.0^{2'',7''}$]dodecanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 65

A solution of photosensitive composition was prepared in the same manner as described in the aforementioned Example 61 except that the base resin was changed to a copolymer consisting of methoxycarbonylmethoxymethyl-tricyclo[$3.3.1.^{3,7}$]decanyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making

Example 66

A solution of photosensitive composition was prepared in the same manner as described in the aforementioned Example 61 except that the base resin was changed to a copolymer consisting of 2'-triisopropylsiloxycyclohexyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 67

A solution of photosensitive composition was prepared in the same manner as described in the aforementioned Example 61 except that the base resin was changed to a copolymer consisting of 2'-thexyldimethylsiloxy tricyclo [$3.3.1.1^{3'',7''}$]decanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 68

A solution of photosensitive composition was prepared in the same manner as described in the aforementioned Example 61 except that the base resin was changed to a copolymer consisting of 2'-t-butyldimethylsiloxycyclohexyl-2'-propyl acrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 69

A solution of photosensitive composition was prepared in the same manner as described in the aforementioned Example 61 except that the base resin was changed to a copolymer consisting of 2'-t-butyldimethylsiloxycyclohexyl-2'-propyl cyanoacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 70

A solution of photosensitive composition was prepared in the same manner as described in the aforementioned Example 61 except that the base resin was changed to a copolymer consisting of 2'-t-butyldimethylsiloxycyclohexyl-2'-propyl chloroacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 71

A solution of photosensitive composition was prepared in the same manner as described in the aforementioned Example 61 except that the base resin was changed to a copolymer consisting of 2'-t-butyldimethylsiloxycyclohexyl-2'-propyl methacrylic amide, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 72

A solution of photosensitive composition was prepared in the same manner as described in the aforementioned Example 61 except that the base resin was changed to a copolymer consisting of 2'-t-butyldimethylsiloxycyclohexyl-2'-propyl acrylic amide, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width. Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 73

A solution of photosensitive composition was prepared in the same manner as described in the aforementioned Example 61 except that the base resin was changed to a copolymer consisting of methoxycarbonylmethoxymethyltricyclo[$3.3.1.1^{3,7}$]decanyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 74

A solution of photosensitive composition was prepared in the same manner as described in the aforementioned Example 61 except that the base resin was changed to a copolymer consisting of 2'-triisopropylsiloxycyclohexyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 75

A solution of photosensitive composition was prepared in the same manner as described in the aforementioned Example 61 except that the base resin was changed to a copolymer consisting of 2'-thexyldimethylsiloxy tricyclo ($3.3.1.1^{3,7}$]decanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 76

A solution of photosensitive composition was prepared in the same manner as described in the aforementioned Example 61 except that the base resin was changed to a copolymer consisting of 2'-t-butyldimethylsiloxycyclohexyl-2'-propyl acrylate, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 77

A solution of photosensitive composition was prepared in the same manner as described in the aforementioned Example 61 except that the base resin was changed to a copolymer consisting of 2'-t-butyldimethylsiloxycyclohexyl-2'-propyl cyanoacrylate, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 78

A solution of photosensitive composition was prepared in the same manner as described in the aforementioned Example 61 except that the base resin was changed to a copolymer consisting of 2'-t-butyldimethylsiloxycyclohexyl-2'-propyl chloroacrylate, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 79

A solution of photosensitive composition was prepared in the same manner as described in the aforementioned Example 61 except that the base resin was changed to a copolymer consisting of 2'-t-butyldimethylsiloxycyclohexyl-2'-propyl methacrylic amide, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 80

A solution of photosensitive composition was prepared in the same manner as described in the aforementioned Example 61 except that the base resin was changed to a copolymer consisting of 2'-t-butyldimethylsiloxycyclohexyl-2'-propyl acrylic amide, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 81

As a base resin, a copolymer consisting of 2'-t-butyldimethylsiloxycyclohexyl-2'-propyl methacrylate, vinyl naphthalene and methacrylic acid (1:1:1) was prepared. Then, NAT-105 (Midori Kagaku Co., Ltd.) was added as a photo-acid generating agent to the base resin at a ratio of 5 mole % based on the base resin, the resultant mixture being dissolved in cyclohexanone to obtain a cyclohexanone solution of photosensitive composition.

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 82

A solution of photosensitive composition was prepared in the same manner as described in the aforementioned Example 81 except that the base resin was changed to a copolymer consisting of 2'-t-buthoxycarbonylmethoxy-tricyclo[3.3.1.1$^{3",7"}$]decanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 83

A solution of photosensitive composition was prepared in the same manner as described in the aforementioned Example 81 except that the base resin was changed to a copolymer consisting of methyltetrahydropyranyloxycarbonylmethoxy-tricyclo[5.2.1.0$^{2,6}$]decanyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 84

A solution of photosensitive composition was prepared in the same manner as described in the aforementioned Example 81 except that the base resin was changed to a copolymer consisting of 2'-di-t-butylmethylsiloxymethyl-tetracyclo[6.2.1.1$^{3",6"}$.0$^{2",7"}$]dodecanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 85

A solution of photosensitive composition was prepared in the same manner as described in the aforementioned Example 81 except that the base resin was changed to a copolymer consisting of methoxycarbonylmethoxymethyl-tricyclo[3.3.1.1$^{3,7}$]decanyl methacrylate, vinyl naphthalene and methacrylic acid (1:1:1).

Example 86

A solution of photosensitive composition was prepared in the same manner as described in the aforementioned Example 81 except that the base resin was changed to a copolymer consisting of 2'-triisopropylsiloxycyclohexyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 87

A solution of photosensitive composition was prepared in the same manner as described in the aforementioned Example 81 except that the base resin was changed to a copolymer consisting of 2'-thexyldimethylsiloxy tricyclo[3.3.1.1$^{3,7}$]decanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 88

A solution of photosensitive composition was prepared in the same manner as described in the aforementioned Example 81 except that the base resin was changed to a copolymer consisting of 2'-t-butyldimethylsiloxycyclohexyl-2'-propyl acrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 89

A solution of photosensitive composition was prepared in the same manner as described in the aforementioned Example 81 except that the base resin was changed to a copolymer consisting of 2'-t-butyldimethylsiloxycyclohexyl-2'-propyl cyanoacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 90

A solution of photosensitive composition was prepared in the same manner as described in the aforementioned Example 81 except that the base resin was changed to a copolymer consisting of 2'-t-butyldimethylsiloxycyclohexyl-2'-propyl chloroacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 91

A solution of photosensitive composition was prepared in the same manner as described in the aforementioned Example 81 except that the base resin was changed to a copolymer consisting of 2'-t-butyldimethylsiloxycyclohexyl-2'-propyl methacrylic amide, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 92

A solution of photosensitive composition was prepared in the same manner as described in the aforementioned Example 81 except that the base resin was changed to a copolymer consisting of 2'-t-butyldimethylsiloxycyclohexyl-2'-propyl acrylic amide, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 93

A solution of photosensitive composition was prepared in the same manner as described in the aforementioned Example 81 except that the base resin was changed to a copolymer consisting of methoxycarbonylmethoxymethyl-tricyclo[3.3.1.1$^{3,7}$]decanyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 94

A solution of photosensitive composition was prepared in the same manner as described in the aforementioned Example 81 except that the base resin was changed to a copolymer consisting of 2'-triisopropylsiloxycyclohexyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 95

A solution of photosensitive composition was prepared in the same manner as described in the aforementioned Example 81 except that the base resin was changed to a copolymer consisting of 2'-thexyldimethylsiloxy-tricyclo[3.3.1.1$^{3",7"}$]decanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 96

A solution of photosensitive composition was prepared in the same manner as described in the aforementioned Example 81 except that the base resin was changed to a copolymer consisting of 2'-t-butyldimethylsiloxycyclohexyl-2'-propyl acrylate, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 97

A solution of photosensitive composition was prepared in the same manner as described in the aforementioned Example 81 except that the base resin was changed to a copolymer consisting of 2'-t-butyldimethylsiloxycyclohexyl-2'-propyl cyanoacrylate, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 98

A solution of photosensitive composition was prepared in the same manner as described in the aforementioned Example 81 except that the base resin was changed to a copolymer consisting of 2'-t-butyldimethylsiloxycyclohexyl-2'-propyl chloroacrylate, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 99

A solution of photosensitive composition was prepared in the same manner as described in the aforementioned Example 81 except that the base resin was -changed to a copolymer consisting of 2'-t-butyldimethylsiloxycyclohexyl-2'-propyl methacrylic amide, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching-rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 100

A solution of photosensitive composition was prepared in the same manner as described in the aforementioned Example 81 except that the base resin was changed to a copolymer consisting of 2'-t-butyldimethylsiloxycyclohexyl-2'-propyl acrylic amide, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 101

As a base resin, a copolymer consisting of 2'-t-butyldimethylsiloxycyclohexyl-2'-propyl methacrylate, vinyl naphthalene and methacrylic acid (1:1:1) was prepared. Then, triphenylsulfonium triflate as a photo-acid generating agent, and di-t-butyl-2-1'-tricyclo[$3.3.1.1^{3,7}$]decanylcarbonyl methyl malonate as an additive were added to this base resin, and the resultant mixture was dissolved in cyclohexanone to prepare a cyclohexanone solution. The mixing ratio of the photo-acid generating agent was 1 mole % based on this base resin, while the mixing ratio of the additive was 40 wt. % based on this base resin.

The resultant solution of photosensitive composition was employed to evaluate the patterning property of the photo-sensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 102

A solution of photosensitive composition was prepared in the same manner as described in the aforementioned Example 101 except that the base resin was changed to a copolymer consisting of 2'-t-buthoxycarbonylmethoxy-tricyclo[$3.3.1.1^{3'',7''}$]decanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 103

A solution of photosensitive composition was prepared in the same manner as described in the aforementioned Example 101 except that the base resin was changed to a copolymer consisting of methyltetrahydropyranyloxycarbonylmethoxy-tricyclo[$5.2.1.0^{2,6}$]decanyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 104

A solution of photosensitive composition was prepared in the same manner as described in the aforementioned Example 101 except that the base resin was changed to a copolymer consisting of 2'-t-butylmethylsiloxymethyl-tetracyclo[$6.2.1.1^{3'',6''}.0^{2'',7''}$]dodecanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 105

A solution of photosensitive composition was prepared in the same manner as described in the aforementioned Example 101 except that the base resin was changed to a copolymer consisting of methoxycarbonylmethoxymethyl-tricyclo[$3.3.1.1^{3,7}$]decanyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 106

A solution of photosensitive composition was prepared in the same manner as described in the aforementioned Example 101 except that the base resin was changed to a copolymer consisting of 2'-triisopropylsiloxycyclohexyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 107

A solution of photosensitive composition was prepared in the same manner as described in the aforementioned Example 101 except that the base resin was changed to a copolymer consisting of 2'-thexyldimethylsiloxy tricyclo [$3.3.1.1^{3'',7''}$]decanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as. compared with the value of 1 in etching resistance of the Comparative Example.

Example 108

A solution of photosensitive composition was prepared in the same manner as described in the aforementioned Example 101 except that the base resin was changed to a copolymer consisting of 2'-t-butyldimethylsiloxycyclohexyl-2'-propyl acrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative example.

Example 109

A solution of photosensitive composition was prepared in the same manner as described in the aforementioned Example 101 except that the base resin was changed to a copolymer consisting of 2'-t-butyldimethylsiloxycyclohexyl-2'-propyl cyanoacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 110

A solution of photosensitive composition was prepared in the same manner as described in the aforementioned Example 101 except that the base resin was changed to a copolymer consisting of 2'-t-butyldimethylsiloxycyclohexyl-2'-propyl chloroacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 111

A solution of photosensitive composition was prepared in the same manner as described in the aforementioned Example 101 except that the base resin was changed to a copolymer consisting of 2'-t-butyldimethylsiloxycyclohexyl-2'-propyl methacrylic amide, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 112

A solution of photosensitive composition was prepared in the same manner as described in the aforementioned Example 101 except that the base resin was changed to a copolymer consisting of 2'-t-butyldimethylsiloxycyclohexyl-2'-propyl acrylic amide, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 113

A solution of photosensitive composition was prepared in the same manner as described in the aforementioned Example 101 except that the base resin was changed to a copolymer consisting of methoxycarbonylmethoxymethyl-tricyclo[$3.3.1.1^{3,7}$]decanyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.4, indicating an excellent etching resistance as compared with the value of 1 in etching resistance of the Comparative Example.

Example 114

A solution of photosensitive composition was prepared in the same manner as described in the aforementioned Example 101 except that'the base resin was changed to a copolymer consisting of 2'-triisopropylsiloxycyclohexyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 115

A solution of photosensitive composition was prepared in the same manner as described in the aforementioned Example 101 except that the base resin was changed to a copolymer consisting of 2'-thexyldimethylsiloxy-tricyclo[$3.3.1.1^{3",7"}$]decanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 116

A solution of photosensitive composition was prepared in the same manner as described in the aforementioned Example 101 except that the base resin was changed to a copolymer consisting of 2'-t-butyldimethylsiloxycyclohexyl-2'-propyl acrylate, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride ($CF_4$) gas, the etching resistance of thereof was found as being 1.5, indicating an excellent etching resistance as compared with the value of 1 in etching resistance of the Comparative Example.

Example 117

A solution of photosensitive composition was prepared in the same manner as described in the aforementioned Example 101 except that the base resin was changed to a copolymer consisting of 2'-t-butyldimethylsiloxycyclohexyl-2'-propyl cyanoacrylate, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 µm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 118

A solution of photosensitive composition was prepared in the same manner as described in the aforementioned Example 101 except that the base resin was changed to a-copolymer consisting of 2'-t-butyldimethylsiloxycyclohexyl-2'-propyl chloroacrylate, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line-width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 119

A solution of photosensitive composition was prepared in the same manner as described in the aforementioned Example 101 except that the base resin was changed to a copolymer consisting of 2'-t-butyldimethylsiloxycyclohexyl-2'-propyl methacrylic amide, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 120

A solution of photosensitive composition was prepared in the same manner as described in the aforementioned Example 101 except that the base resin was changed to a copolymer consisting of 2'-t-butyldimethylsiloxycyclohexyl-2'-propyl acrylic amide, vinyl naphthalene and maleic anhydride (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.5, indicating an excellent etching resistance as compared with the value of 1 in etching resistance of the Comparative Example.

Example 121

A solution of photosensitive composition was prepared in the same manner as described in the aforementioned Example 101 except that the base resin was changed to a copolymer consisting of 2'-t-buthoxycarbonylmethoxy-tricyclo[3.3.1.1$^{3'',7''}$]decanyl-2'-propyl methacrylate, vinyl naphthalene and methacrylic acid (1:1:1).

The resultant solution of photosensitive composition was employed to evaluate the patterning property of the photosensitive composition in the same manner as described in the aforementioned Example 13. As result, it was found possible to form a line and space pattern of 0.1 μm in line width.

Furthermore, when the etching rate of this photosensitive composition was compared in the same manner as in Example 1 with that of the Comparative Example by making use of carbon tetrafluoride (CF$_4$) gas, the etching resistance of thereof was found as being 1.4, indicating an excellent etching resistance as compared with the value of 1 in etching resistance of the Comparative Example.

Next, a method of manufacturing electronic parts by making use of a photosensitive composition of this invention will be explained with reference to the attached drawings.

Figure 1B:
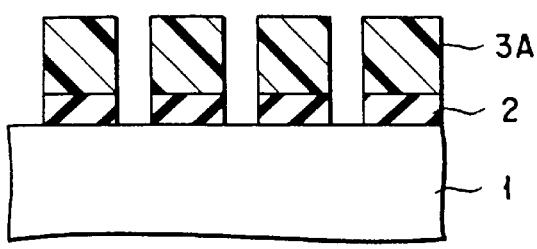
Figure 1C:
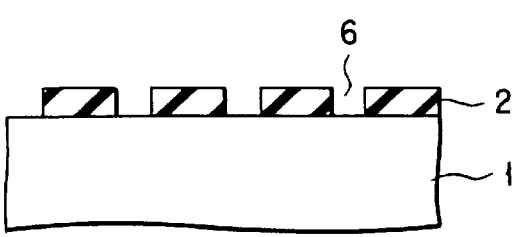

FIGS. 1A to 1C are cross-sectional views illustrating one example of manufacturing steps of a semiconductor chip by making use of a photosensitive composition according to this invention.

First of all, as shown in FIG. 1A, by making use of a CVD method, a silicon oxide film 2 (a film to be etched) having a thickness of about 0.8 μm was deposited on a silicon semiconductor substrate 1. Thereafter, a resist film 3 containing a photosensitive composition of the same kind as employed in Example 1 and having a thickness of about 0.3 μm was superimposed on this silicon oxide film 2. By the way, various kinds of element such as an MOSFET, a diode, etc. (not shown) were formed in advance in the semiconductor substrate 1.

This resist film 3 was patterned in the same manner as described in Example 1 thereby forming a pattern of hole having a diameter of about 0.3 μm. The resist pattern 3A thus formed was heat-treated in an N$_2$ atmosphere at a temperature of 130° C. for 30 minutes. Then, by making use of this resist pattern 3A as an etching mask, the silicon oxide film 2 was selectively etched by means of RIE method using a CF$_4$ gas, thereby transcribing the pattern as shown in FIG. 1B.

Finally, the resist pattern 3A was carbonized in an O$_2$ plasma thereby to remove the resist pattern 3A, thus obtaining a silicon oxide film 2 having fine holes 6 as shown in FIG. 1C. The diameter of the holes 6 formed in the silicon oxide film 2 was about 0.32 μm, and the non-uniformity of the film thickness was controlled to 2% or less.

The photosensitive composition of this invention can be suitably applied to the patterning of wiring in electronic parts.

Figure 2A:
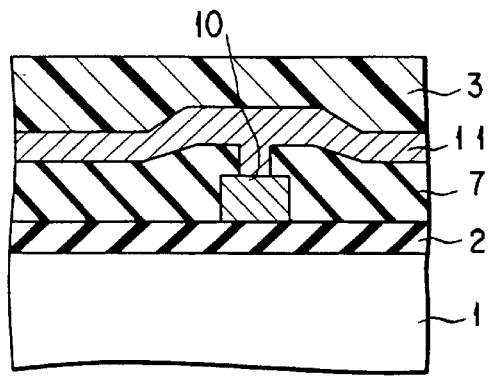
FIGS. 2A to 2C are cross-sectional views illustrating another example of manufacturing steps of electronic parts using a photosensitive composition according to this invention.
Figure 2B:
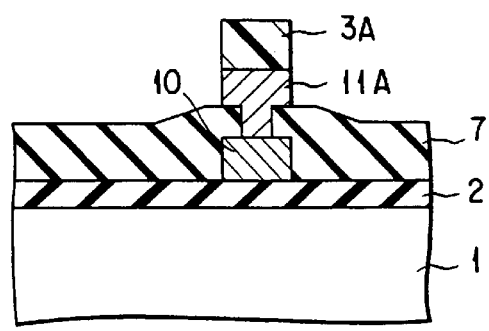
Figure 2C:
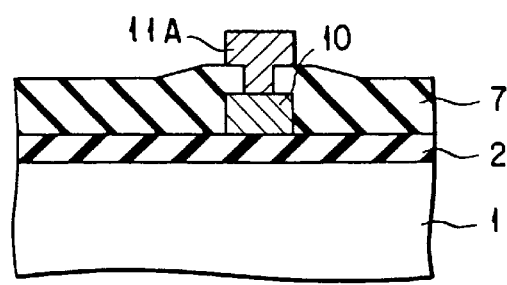

FIGS. 2A to 2C are cross-sectional views illustrating one example in which this invention is applied to the formation of a 2-ply wiring structure.

First of all, as shown in FIG. 2A, by making use of a CVD method, a silicon oxide film 2 having a thickness of about 0.8 μm was deposited on a silicon semiconductor substrate 1. By the way, various kinds of element such as an MOSFET, a diode, etc. (not shown) were formed in advance in the semiconductor substrate 1. Thereafter, a lower wiring 10 consisting of Al—Si—Cu and having a thickness of about 0.7 μm, an interlayer insulating film 7 consisting of $SiO_2$ and having a thickness of about 0.7 μm, and an upper wiring layer 11 consisting of Al—Si—Cu and having a thickness of about 0.7 μm were successively deposited on the silicon oxide film 2. At this moment, a step portion having a height of about 0.7 μm was formed on this upper wiring layer 11. Further, a resist film 3 containing a photosensitive composition of the same kind as employed in Example 1 was deposited to a thickness of about 0.3 μm on the upper wiring layer 11.

The resist film 3 was then patterned in the same manner as described in Example 1 thereby forming a resist pattern 3A as shown in FIG. 2B. Then, by making use of this resist pattern 3A as an etching mask, the upper wiring layer 11 was selectively etched by means of RIE method using a chlorine-based gas such as $CCl_4$ gas, thereby forming an upper wiring 11A.

Finally, the resist pattern 3A was carbonized in an $O_2$ plasma thereby to remove the resist pattern 3A, thus obtaining a 2-ply wiring structure as shown in FIG. 2C.

Even when this invention is applied to the formation of a 2-ply wiring structure as mentioned above, it is possible to improve the shrinkage and strength of the wiring. Furthermore, the upper wiring 11A thus formed was not substantially affected by the step portion (about 0.7 μm in height) that had been generated due to the lower wiring film, etc., and the dimensional error was ±0.05 μm as against the predetermined dimension of 0.6 μm. It will be seen from this result that, as compared with the dimensional error was ±0.1 μm in the case of the prior art, this invention is very effective in forming a wiring with very high precision.

Moreover, when the upper wiring was formed with a configuration of 0.4 μm in intervals between wirings and 0.6 μm in line width, the cut-off or short circuit of wiring was not generated at all.

FIGS. 3A to 3D are cross-sectional views illustrating one example in which this invention is applied to the formation of an Au wiring.

Figure 3A:
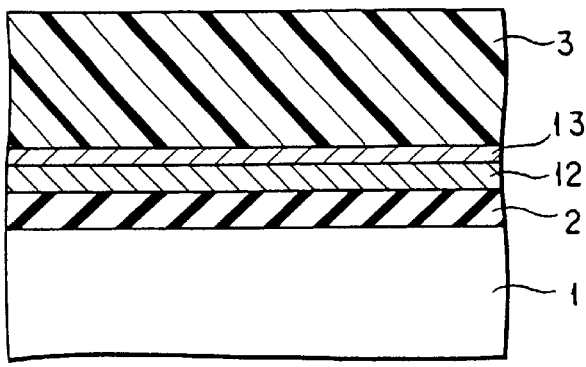
FIGS. 3A to 3D are cross-sectional views illustrating still another example of manufacturing steps of electronic parts using a photosensitive composition according to this invention.

First of all, as shown in FIG. 3A, by making use of a CVD method, a silicon oxide film 2 having a thickness of about 0.8 μm was deposited on a silicon semiconductor substrate 1. By the way, various kinds of element such as an MOSFET, a diode, etc. (not shown) were formed in advance in the semiconductor substrate 1. Thereafter, a tungsten/titanium (Ti—W) film 12 having a thickness of about 0.2 μm, and a gold (Au) film 13 having a thickness of about 0.1 μm were successively deposited by sputtering on the silicon oxide film 2. Further, a resist film 3 containing a photosensitive composition of the same kind as employed in Example 1 was deposited to a thickness of about 0.3 μm on the Au film 13.

Figure 3B:
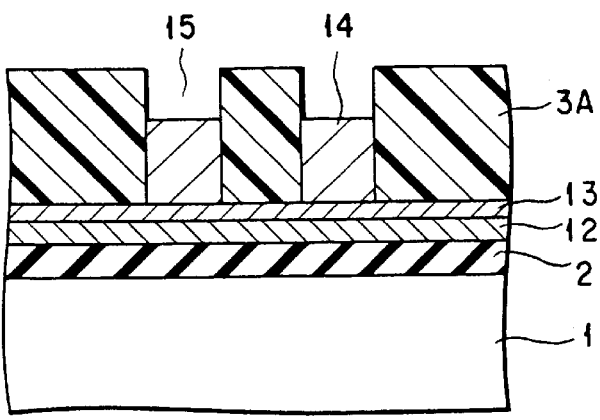

The resist film 3 was then patterned in the same manner as described in Example 1 thereby forming a resist pattern 3A, thus forming grooves 15 as shown in FIG. 3B. Then, by making use of the Ti—W film 12 and Au film 13 exposed at the bottom of each groove 15 as an electrode, an Au-plating film 14 having a thickness of about 1 μm was formed in the grooves by means of electrolytic plating method.

Figure 3C:
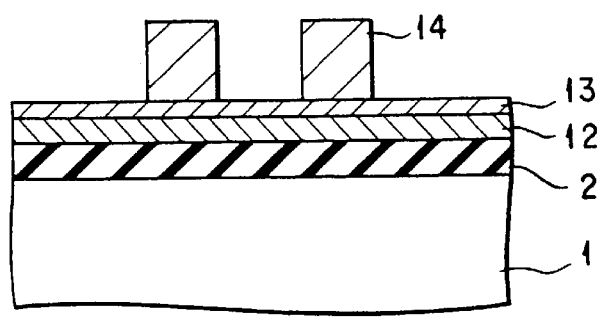

Then, the resist pattern 3A was carbonized in an $O_2$ plasma thereby to remove the resist pattern 3A, thus allowing the Au-plating film 14 to protrude from the Au film 13 as shown in FIG. 3C.

Figure 3D:
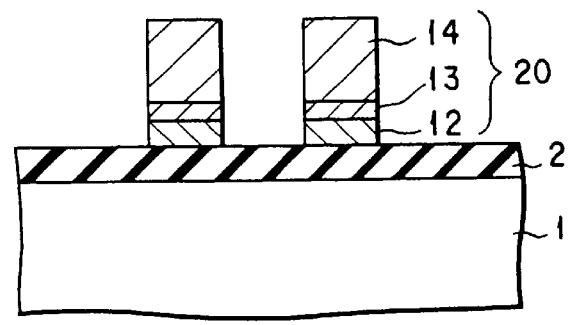

Finally, the exposed portion of the Au film 13 was removed by means of ion milling method, and the exposed portion of the Ti—W film 13 was also removed by making use of a fluorine-based gas, thus obtaining an Au wiring 20 as shown in FIG. 3D.

It is possible by making use of this invention to form the resist film 3 at a temperature of 150° C. or less. Therefore, it was possible to prevent any generation of peeling between the Au film 13 and resist film 3, so that, even if an Au wiring having a line width of 0.7 μm was formed, the cut-off or short circuit of the Au wiring was not generated at all.

As explained above, since a high molecular compound formed through the polymerization of a monomer containing both alicyclic skeleton and specific acid-decomposable group is incorporated as a base resin, it is possible according to this invention to provide a photosensitive composition which is minimal in absorption of a light of short wavelength and excellent in solubility, alkali-developing property and dry-etching resistance. In addition to these features, the photosensitive composition of this invention is featured as being excellent in heat resistance and in adhesion to a substrate. Therefore, it is possible by making use of the photosensitive composition of this invention to form an ultra-fine pattern having a line width of in the order of not more than subquarter micron and being excellent in rectangular configuration in cross-section.

The photosensitive composition of this invention can be most advantageously utilized for the formation of a pattern by making use of a KrF excimer laser beam, an ArF excimer laser beam and a fluorine laser beam. However, the photosensitive composition of this invention is also applicable to the formation of a pattern by making use of an i-line, a deep UV ray, an electron beam, an X-ray, etc. Accordingly, the photosensitive composition of this invention can be quite effectively utilized in the photolithography technique to be employed for the manufacture of a semiconductor device, and hence the photosensitive composition of this invention is extremely valuable in industrial viewpoint.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A monomer represented by the following formula (m-1):

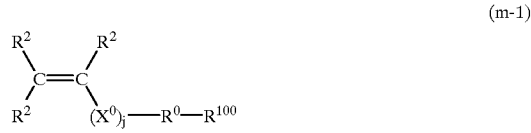

(m-1)

wherein $R^0$ is an alicyclic group; $R^2$s are the same or different and are individually hydrogen atom, halogen atom or monovalent organic group; $X^0$ is >C=O, —C(=O)O—, —C(=O)$NR^3$—, —$SO_2$—, —S(=O)$_2$$NR^3$—, —O—, —OC(=O)—, or —$OCH_2$C(=O)—, wherein $R^3$ is hydrogen atom, halogen atom, or hydrocarbon atom; j is an integer of 0 to 3; and $R^{100}$ is a group selected from the following groups:

(R1-3), and

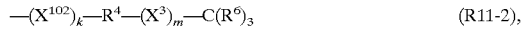

(R11-2), wherein $X^2$ is >C=O, —C(=O)O—, —C(=O)$NR^3$—, —$SO_2$—, —O—, —S(=O)$_2$$NR^3$—, —$OCH_2$C(=O)

O—, —OSO$_2$—, or —S(=O)$_2$O—, wherein R$^3$ is hydrogen atom, halogen atom or hydrocarbon group; R$^5$ is a bivalent alkyl group; n is an integer of 0 to 3; R$^7$s are the same or different and are individually hydrogen atom, halogen atom or monovalent organic group; X$^{102}$ is >C=O, —C(=O)NR$^3$—, —SO$_2$—, —S(=O)$_2$NR$^3$—, —OCH$_2$C(=O)O—, —OSO$_2$—, or —S(=O)$_2$O—; k is an integer of 1 to 3; R$^4$ is a bivalent alkyl group; X$^3$ is >C=O, —C(=O)O—, —C(=O)NR$^3$—, —SO$_2$—, —S(=O)$_2$NR$^3$—, —OC(=O)—, —OCH$_2$C(=O)O—, —OSO$_2$—, or —S(=O)$_2$O—; wherein R$^3$ is hydrogen atom, halogen atom or hydrocarbon group; m is an integer of 0 to 3; R$^6$s are the same or different and are individually hydrogen atom, halogen atom or monovalent organic group.

2. A monomer represented by the following formula (m-2):

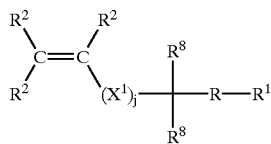

(m-2)

wherein R is a group having an alicyclic skeleton; R$^2$s are the same or different and are individually hydrogen atom, halogen atom or monovalent organic group; X$^1$ is >C=O, —C(=O)O—, —C(=O)NR$^3$—, —SO$_2$—, —S(=O)$_2$NR$^3$—, —O—, —OC(=O)—, —OCH$_2$C(=O)O—, —OSO$_2$—, or —S(=O)$_2$O—, wherein R$^3$ is hydrogen atom, halogen atom or hydrocarbon group; j is an integer of 0 to 3; R$^1$ is a group selected from the following groups:

(R1-3), and

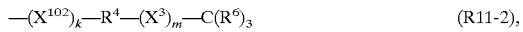

(R11-2), wherein X$^2$ is >C=O, —C(=O)O—, —C(=O)NR$^3$—, —SO$_2$—, —S(=O)$_2$NR$^3$—, —O—, —OCH$_2$C(=O)O—, —OSO$_2$—, or —S(=O)$_2$O—, wherein R$^3$ is hydrogen atom, halogen atom or hydrocarbon group; X$^{102}$ is >C=O, —C(=O)NR$^3$—, —SO$_2$—, —S(=O)$_2$NR$^3$—, —OCH$_2$C(=O)O—, —OSO$_2$—, or —S(=O)$_2$O—; k is an integer of 0 to 3; R$^5$ is a bivalent alkyl group; n is an integer of 0 to 3; R$^7$s are the same or different and are individually hydrogen atom, halogen atom or monovalent organic group; R$^4$ is a bivalent alkyl group; X$^3$ is >C=O, —C(—O)O—, —C(=O)NR$^3$—, —SO$_2$—, —S(=O)$_2$NR$^3$—, —OC(=O)—, —OCH$_2$C(=O)O—, —OSO$_2$—, or —S(=O)$_2$O—, wherein R$^3$ is hydrogen atom, halogen atom or hydrocarbon group; m is an integer of 0 to 3; R$^6$s are the same or different and are individually hydrogen atom, halogen atom or monovalent organic group; and R$^8$s are the same or different and are individually hydrocarbon group, pentacycloalkyl group, tetracycloalkyl group, tricycloalkyl group, bicycloalkyl group, heterocycloalkyl group, or a group containing terpenoid skeleton wherein at least one of R$^8$s are combined with part of R thereby to form a ring.

3. A monomer represented by the following formula (m-3):

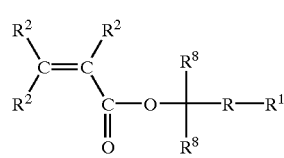

(m-3)

wherein R is a group having an alicyclic skeleton; R$^2$s are the same or different and are individually hydrogen atom, halogen atom or monovalent organic group; R$^1$ is a group selected from the following groups:

(R1-3), and

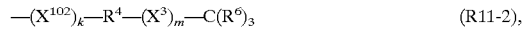

(R11-2), wherein X$^2$ is >C=O, —C(=O)O—, —C(=O)NR$^3$—, —SO$_2$—, —S(=O)$_2$NR$^3$—, —O—, —OCH$_2$C(=O) O—, —OSO$_2$—, or —S(=O)$_2$O—, X$^{102}$ is >C=O, —C(=O)NR$^3$—, —SO$_2$—, —S(=O)$_2$NR$^3$—, —OCH$_2$C(=O)O—, —OSO$_2$—, or —S(=O)$_2$O—; wherein R$^3$ is hydrogen atom, halogen atom or hydrocarbon group; k is an integer of 0 to 3; R$^5$ is a bivalent alkyl group; n is an integer of 0 to 3; R$^7$s are the same or different and are individually hydrogen atom, halogen atom or monovalent organic group; R$^4$ is a bivalent alkyl group; X$^3$ is >C=O, —C(=O)O—, —C(=O) NR$^3$—, —SO$_2$—, —S(=O)$_2$NR$^3$—, —OC(=O)—, —OCH$_2$C(=O)O—, —OSO$_2$—, or —S(=O)$_2$O—, wherein R$^3$ hydrogen atom, halogen atom or hydrocarbon group; m is an integer of 0 to 3; R$^6$s are the same or different and are individually hydrogen atom, halogen atom or monovalent organic group; and R$^8$s are the same or different and are individually hydrocarbon group, pentacycloalkyl group, tetracycloalkyl group, tricycloalkyl group, bicycloalkyl group, heterocycloalkyl group, or a group containing terpenoid skeleton wherein at least one of R$^8$s are combined with part of R thereby to form a ring.

* * * * *

UNITED STATES PATENT AND TRADEMARK OFFICE
CERTIFICATE OF CORRECTION

PATENT NO. : 6,410,748 B1  
DATED : June 25, 2002  
INVENTOR(S) : Shida et al.

It is certified that error appears in the above-identified patent and that said Letters Patent is hereby corrected as shown below:

<u>Title page,</u>  
Item [54], the Title is incorrect. Item [54] should read:

-- [54] ALICYCLIC GROUP-CONTAINING MONOMER --

Signed and Sealed this

Seventeenth Day of December, 2002

JAMES E. ROGAN  
*Director of the United States Patent and Trademark Office*